(12) United States Patent
Sakai et al.

(10) Patent No.: US 9,887,237 B2
(45) Date of Patent: Feb. 6, 2018

(54) MAGNETIC STORAGE DEVICE

(71) Applicant: TOSHIBA MEMORY CORPORATION, Minato-ku, Tokyo (JP)

(72) Inventors: Shintaro Sakai, Seoul (KR); Keisuke Nakatsuka, Seoul (KR); Hiroyuki Kanaya, Seoul (KR); Yoshinori Kumura, Seoul (KR); Katsuyuki Fujita, Nishitokyo Tokyo (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/065,843

(22) Filed: Mar. 9, 2016

(65) Prior Publication Data

US 2017/0141157 A1    May 18, 2017

Related U.S. Application Data

(60) Provisional application No. 62/257,094, filed on Nov. 18, 2015.

(51) Int. Cl.
| | |
|---|---|
| *H01L 27/22* | (2006.01) |
| *H01L 43/08* | (2006.01) |
| *H03B 15/00* | (2006.01) |
| *G01R 33/09* | (2006.01) |
| *G11B 5/39* | (2006.01) |
| *H01L 43/02* | (2006.01) |

(Continued)

(52) U.S. Cl.
CPC ........... *H01L 27/226* (2013.01); *G01R 15/20* (2013.01); *G01R 15/205* (2013.01); *G01R 33/09* (2013.01); *G01R 33/098* (2013.01); *G11B 5/39* (2013.01); *G11B 5/3909* (2013.01); *G11B 5/3993* (2013.01); *G11C 11/161* (2013.01); *H01L 27/22* (2013.01); *H01L 27/228* (2013.01); *H01L 41/06* (2013.01); *H01L 43/02* (2013.01); *H01L 43/08* (2013.01)

(58) Field of Classification Search
CPC ....... H01L 43/08; H01L 27/22; H01L 27/226; H01L 27/222; H01L 21/20; H01L 41/06; H03B 15/006; G01R 15/20; G01R 15/205; G01R 33/09; G01R 33/098; G11B 5/3909; G11B 5/3993; G11B 5/39
See application file for complete search history.

(56) References Cited

U.S. PATENT DOCUMENTS

| | | | |
|---|---|---|---|
| 2011/0044093 A1 | 2/2011 | Koh et al. | |
| 2011/0267868 A1 | 11/2011 | Fukuzumi et al. | |
| 2013/0058162 A1* | 3/2013 | Yamanaka | H01L 43/08 365/173 |

FOREIGN PATENT DOCUMENTS

JP    2012074542 A    4/2012

* cited by examiner

*Primary Examiner* — Thanhha Pham
(74) *Attorney, Agent, or Firm* — Holtz, Holtz & Volek PC

(57) ABSTRACT

According to an embodiment, a magnetic storage device includes a semiconductor region including a trench; a gate electrode disposed in the trench; an insulation film covering the gate electrode and provided in a manner to fill the trench; and a magnetoresistive effect element including at least a first ferromagnetic layer, a second ferromagnetic layer, and a non-magnetic layer provided between the first ferromagnetic layer and the second ferromagnetic layer, the non-magnetic layer in a side surface of the magnetoresistive effect element including the non-magnetic layer being provided on a top surface of the insulation film.

4 Claims, 47 Drawing Sheets

(51) Int. Cl.
*G11C 11/16* (2006.01)
*H01L 41/06* (2006.01)
*G01R 15/20* (2006.01)

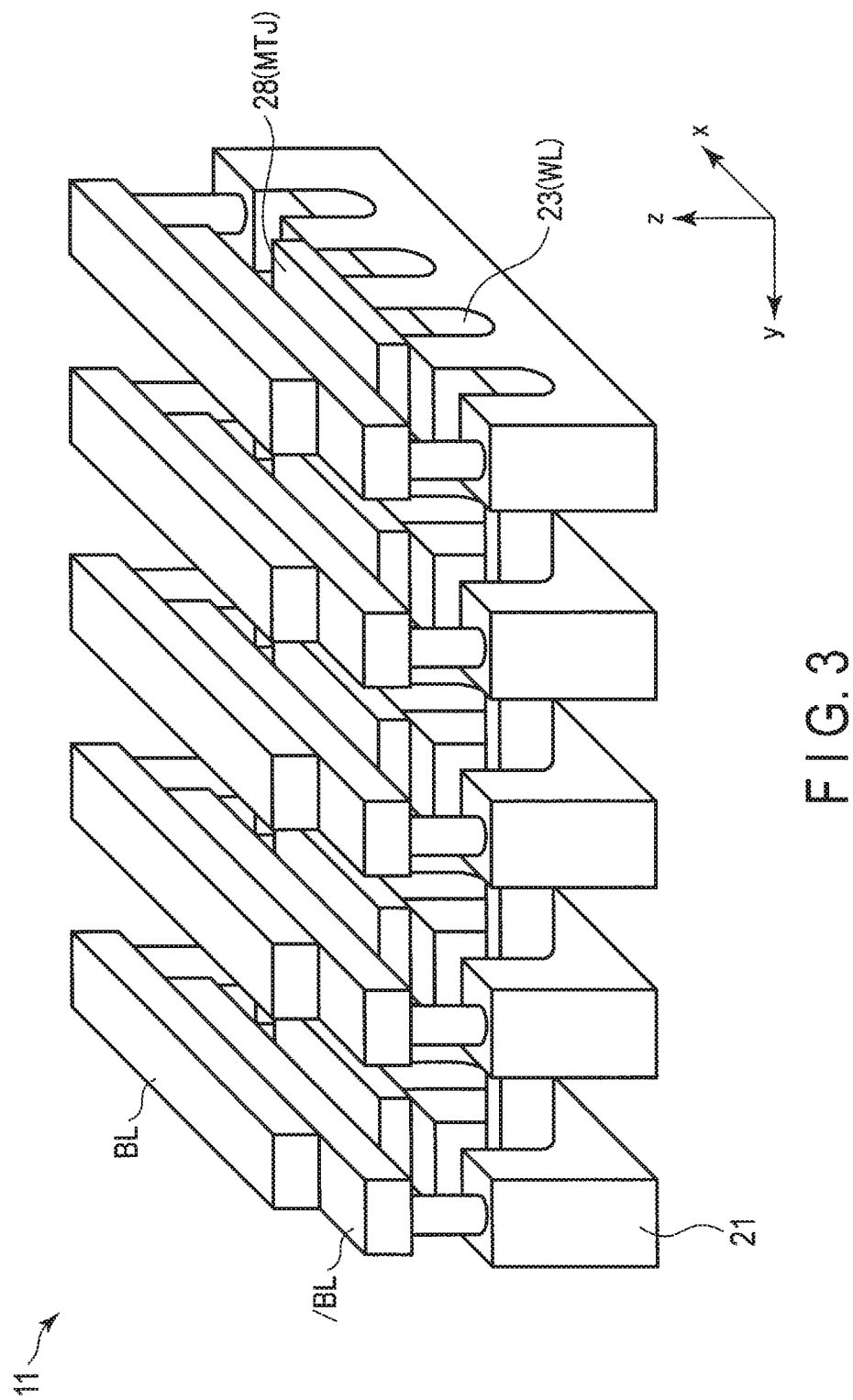
F I G. 3

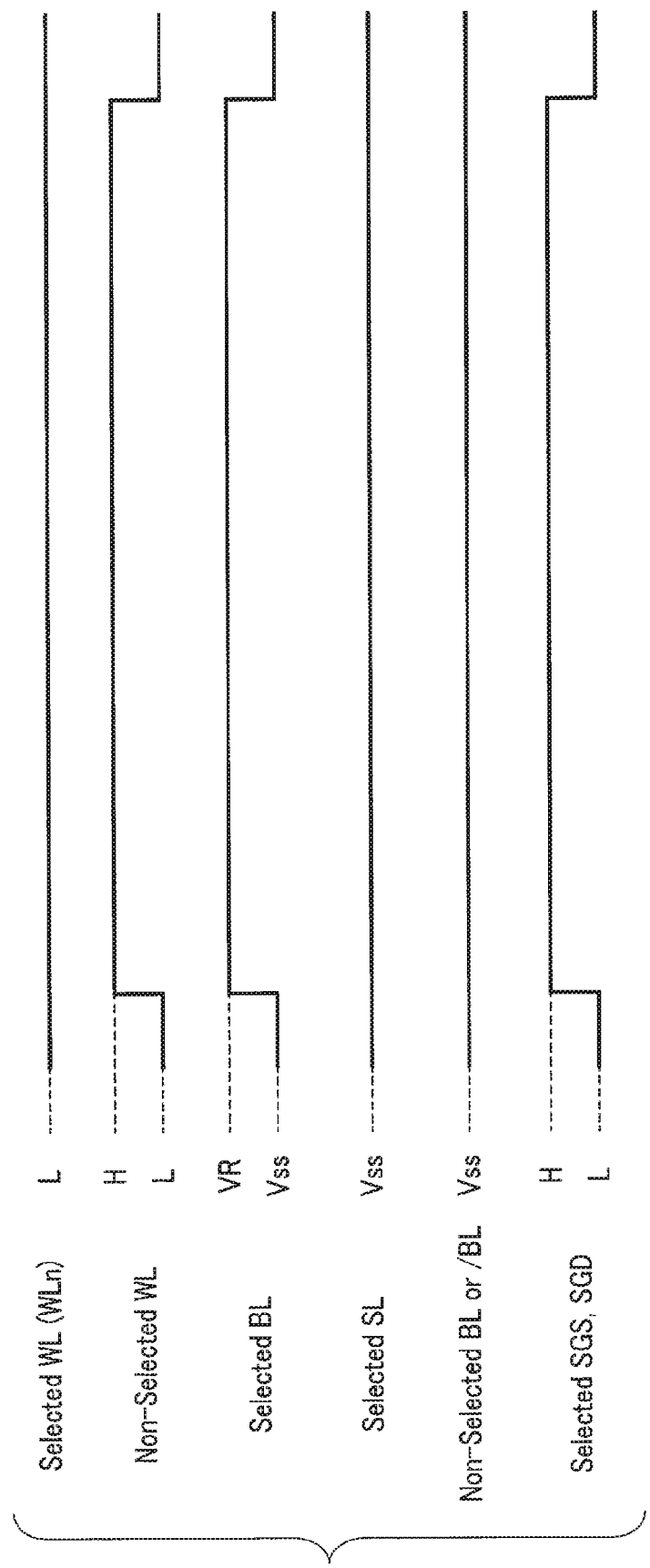
F I G. 14

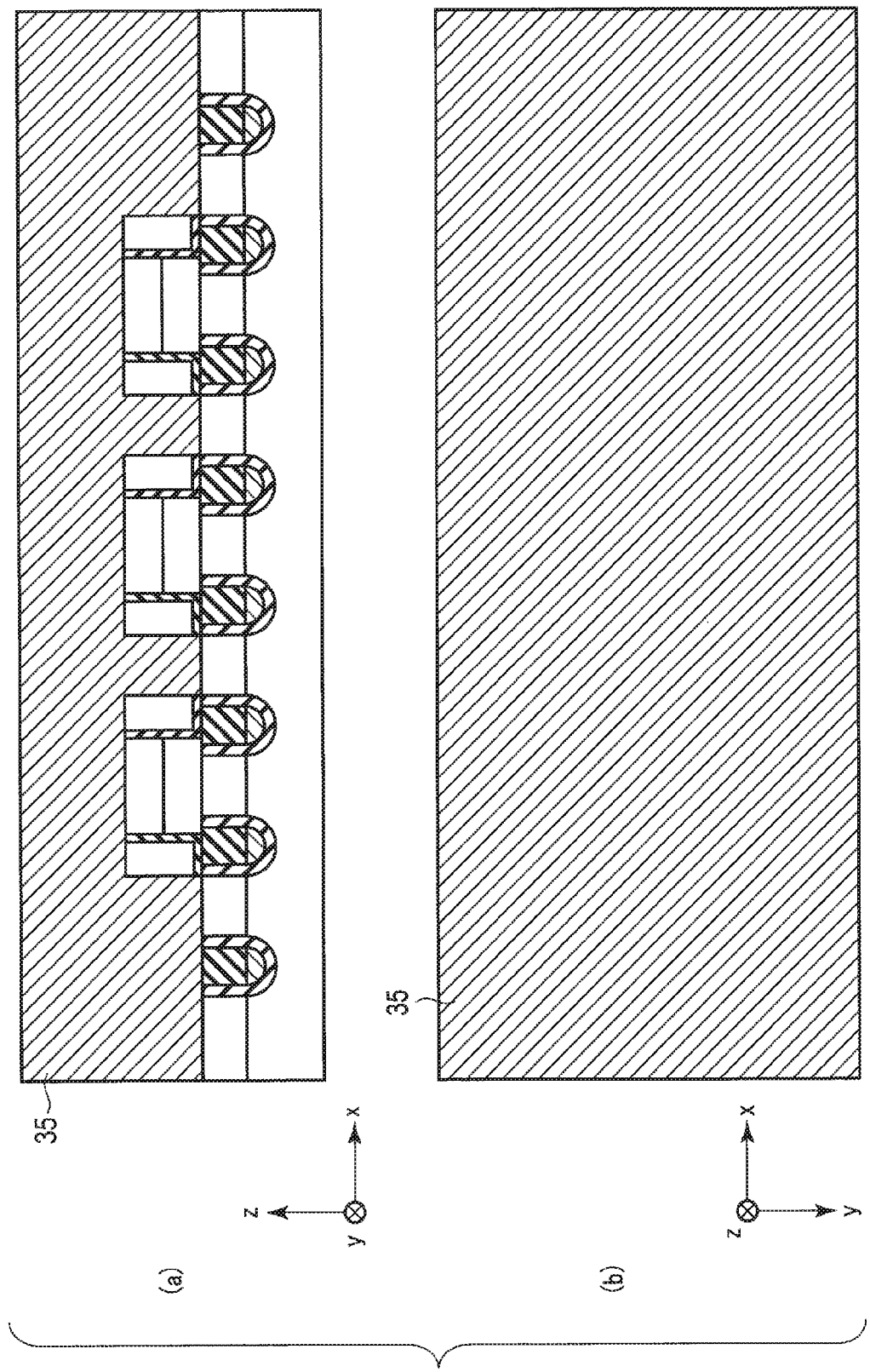
F I G. 22

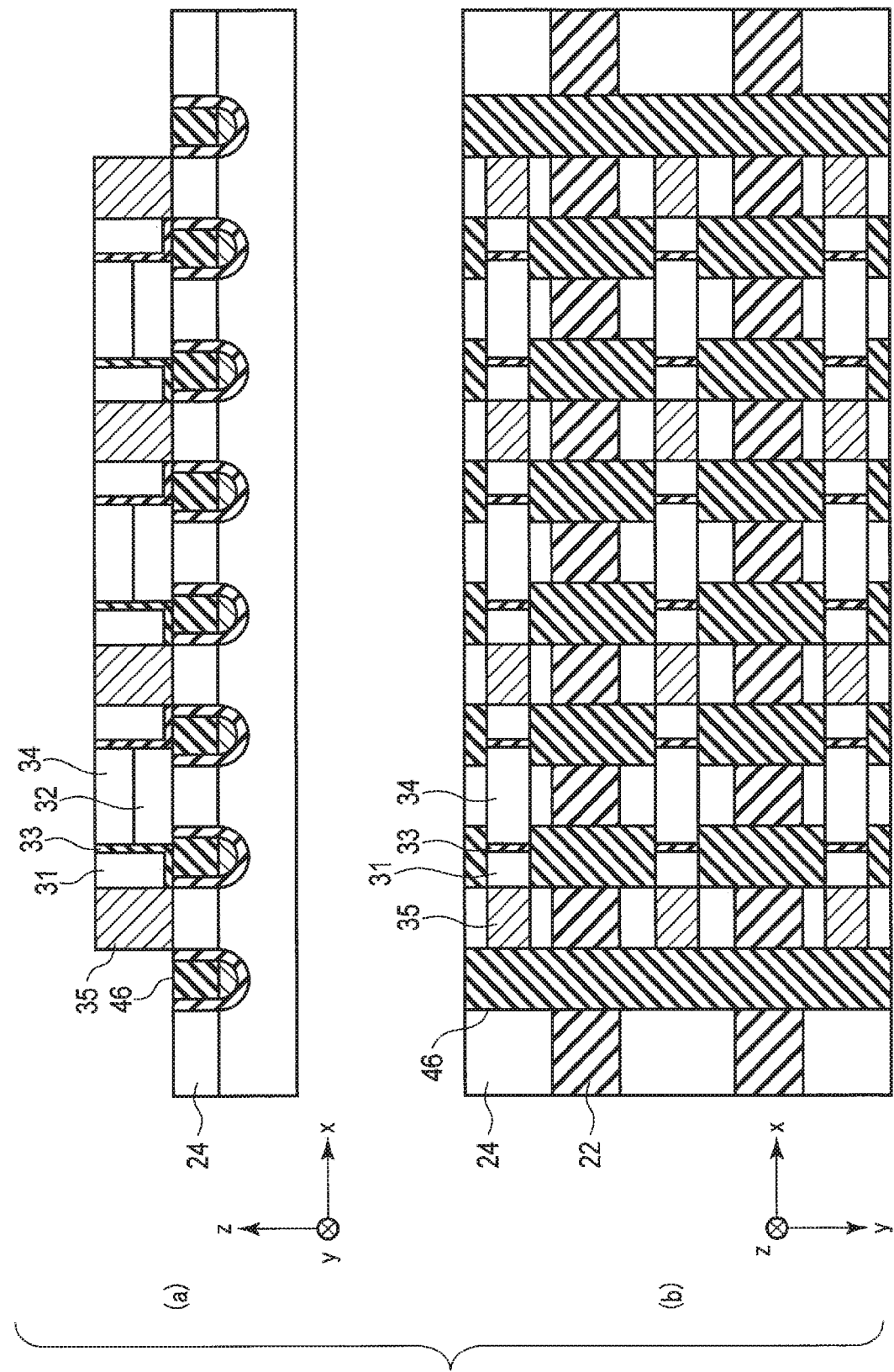
F I G. 24

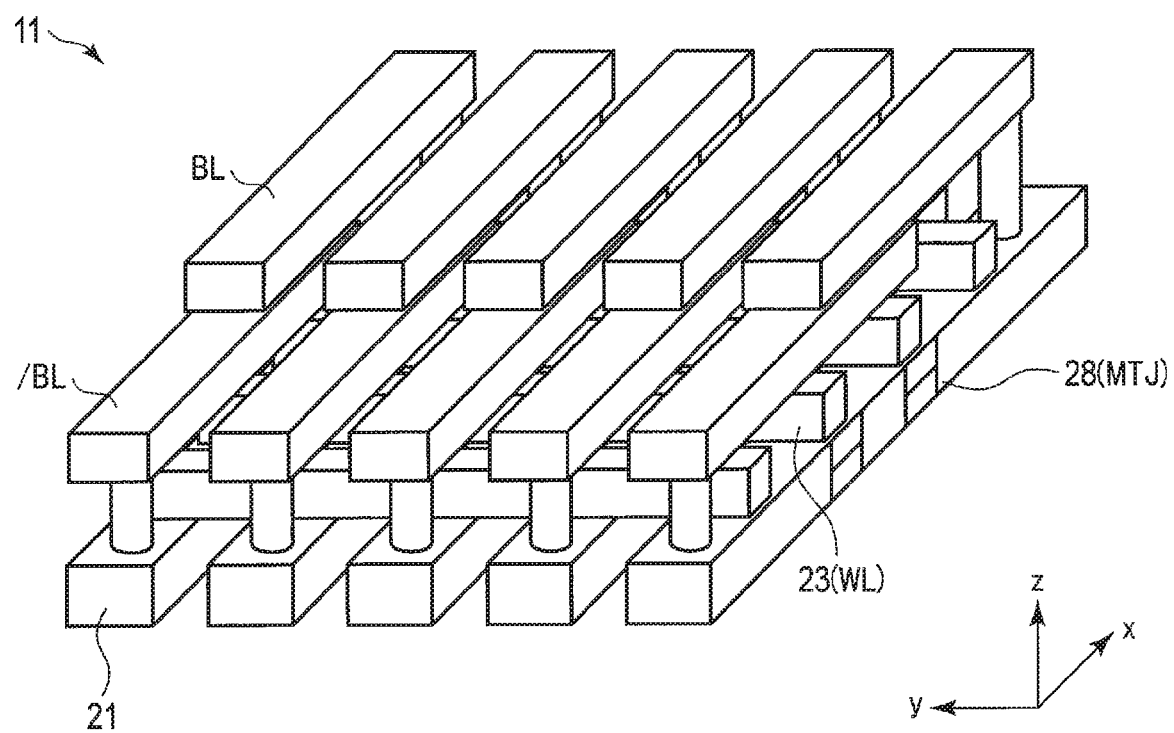
F I G. 27

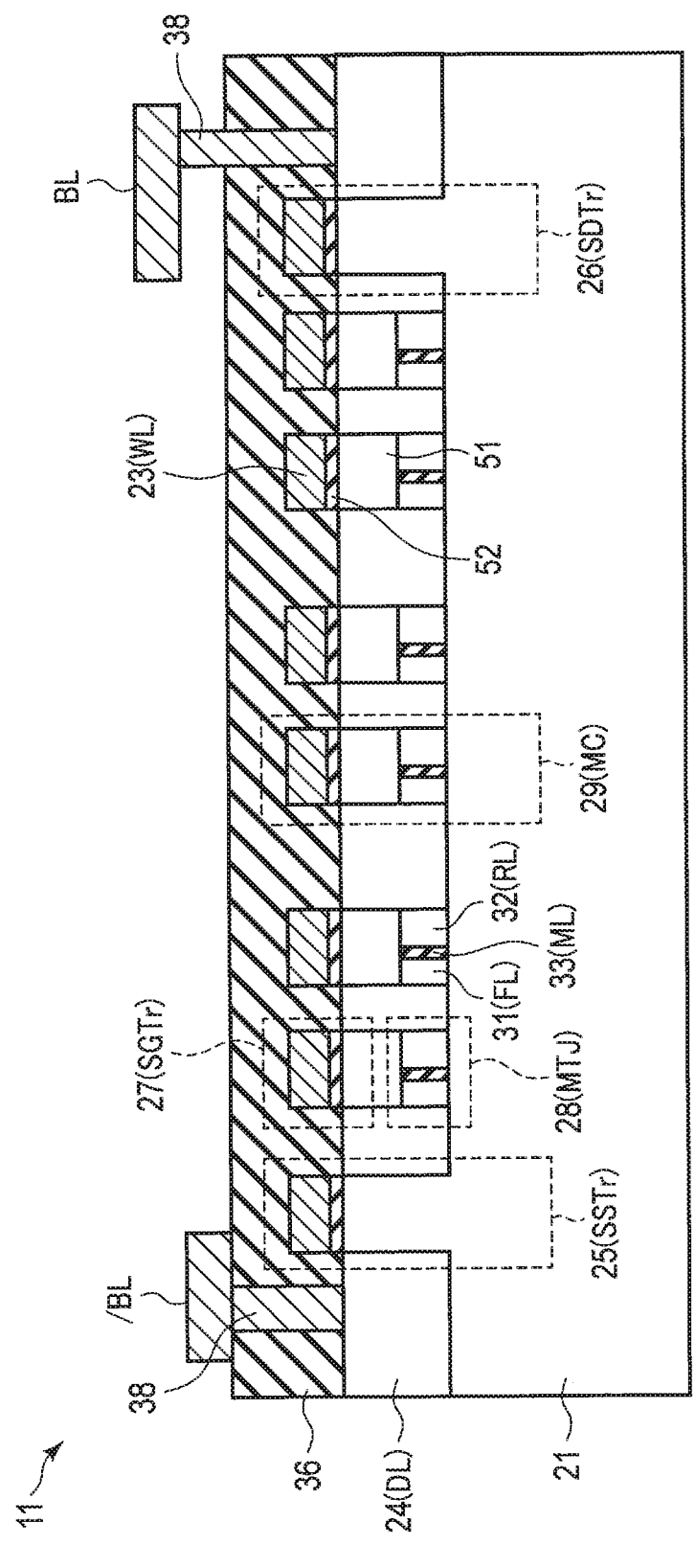
F I G. 28

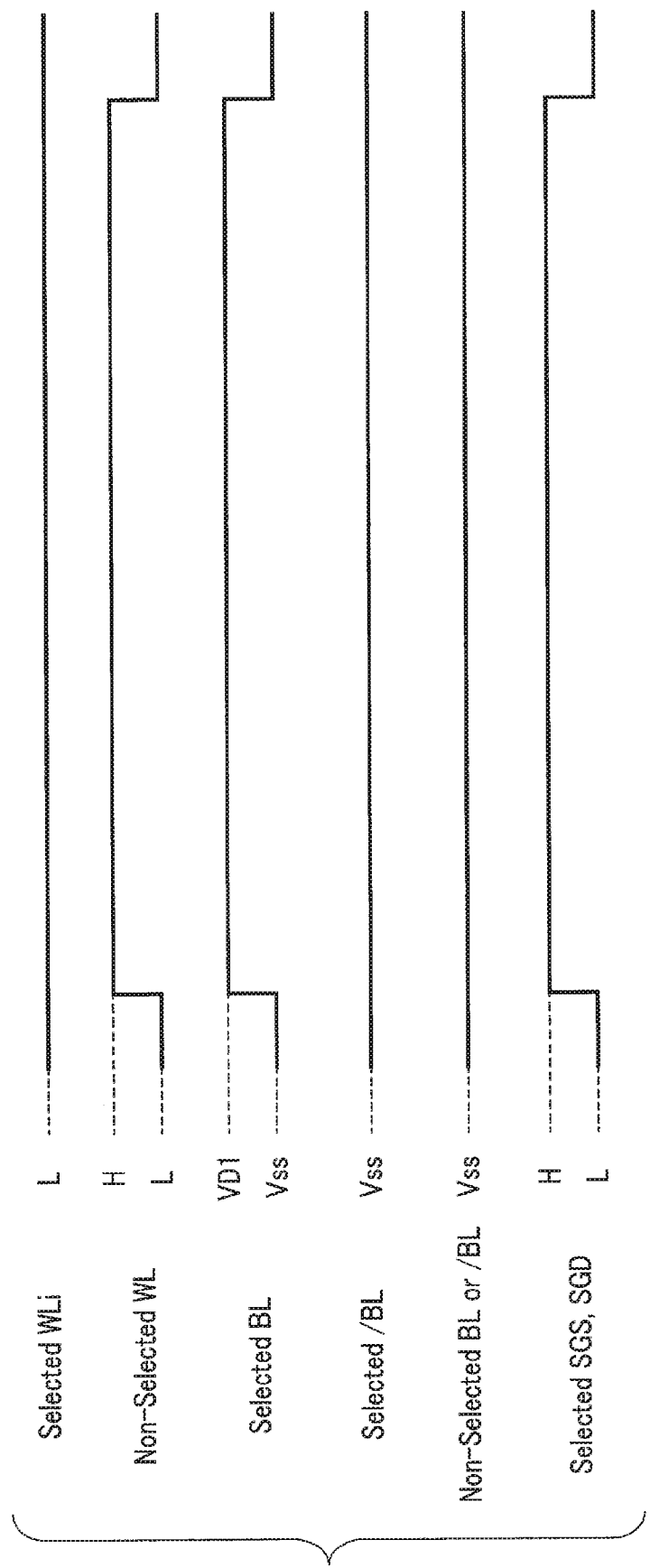
F I G. 29

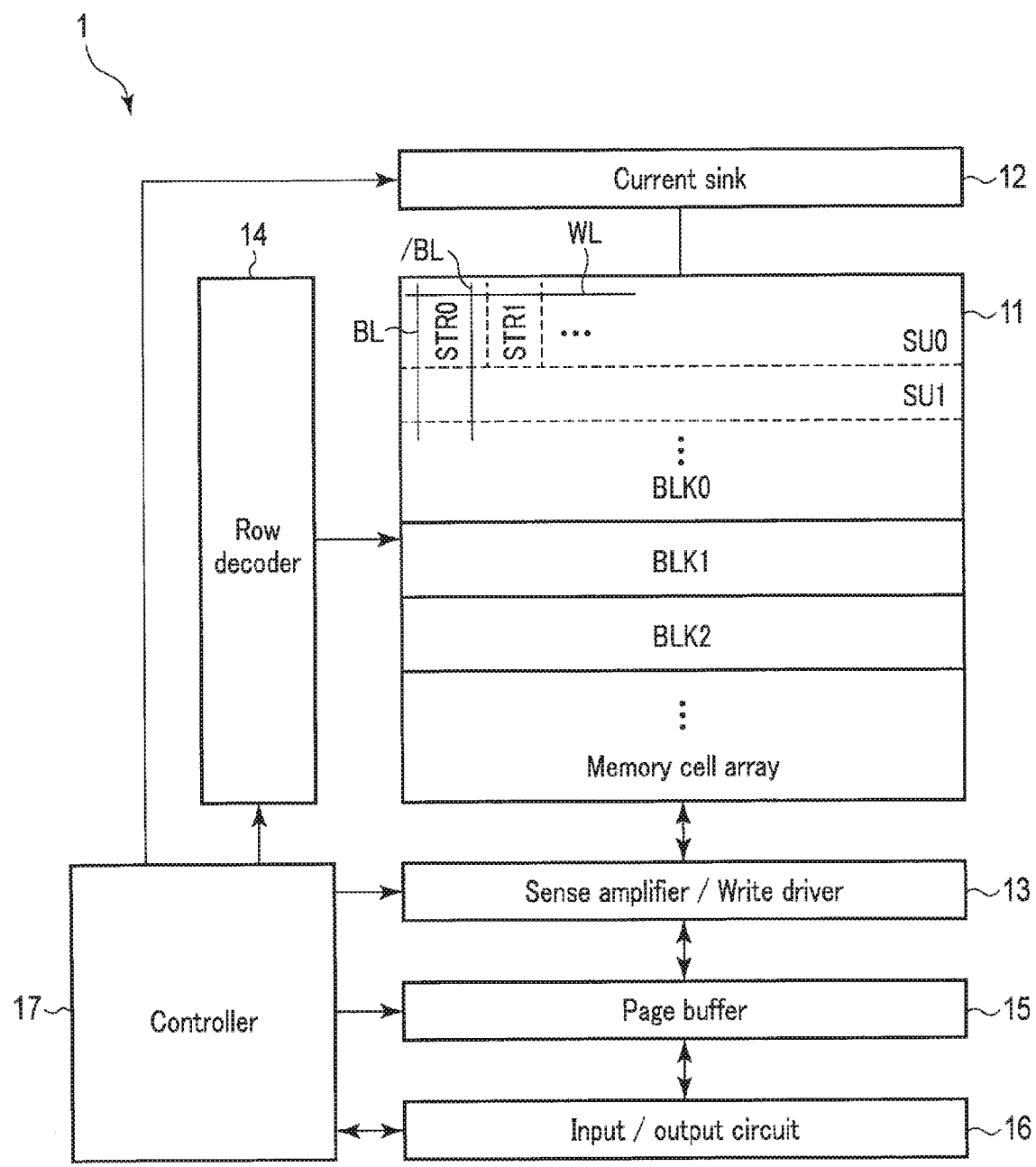
F I G. 37

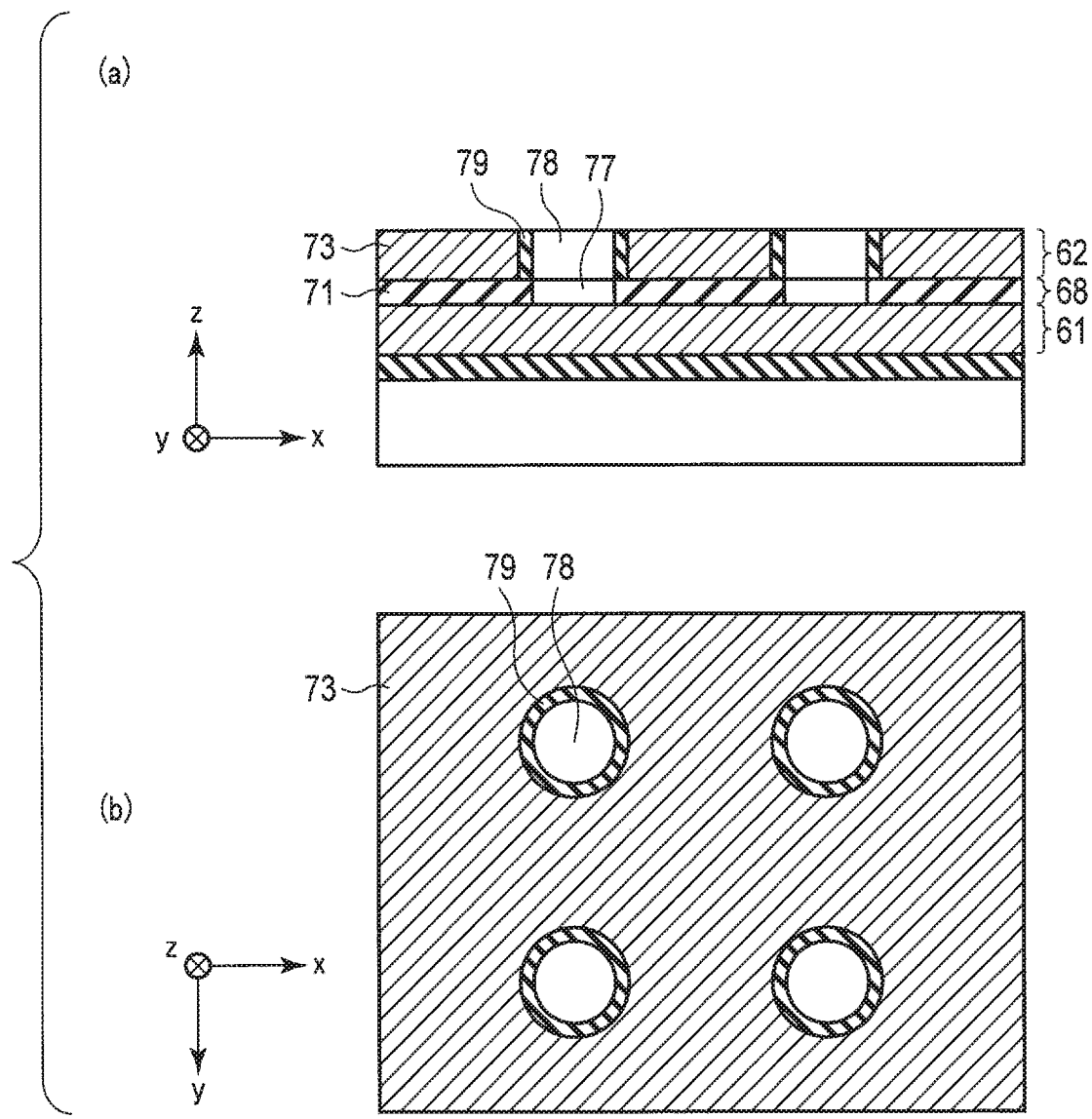
F I G. 45

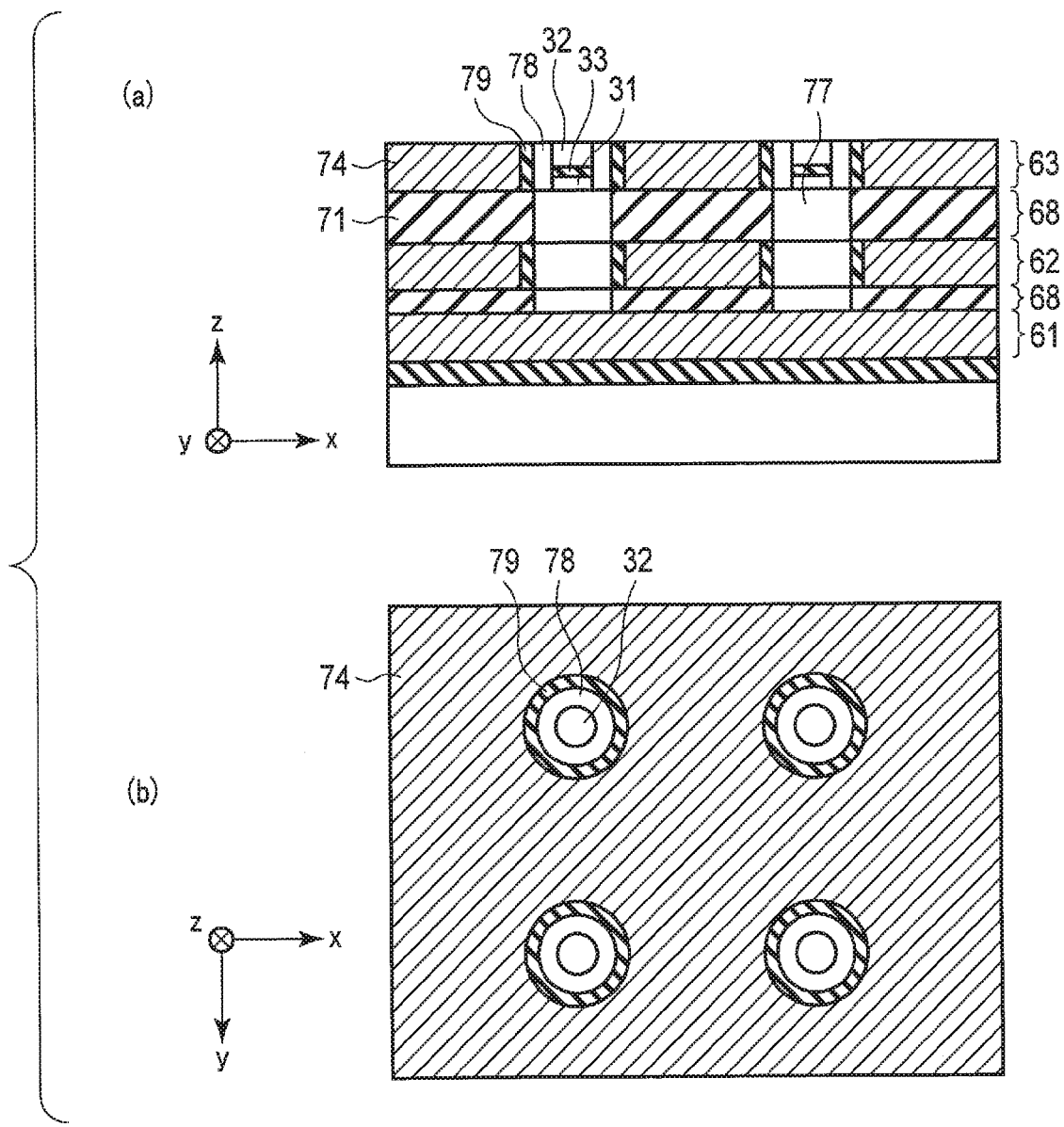
F I G. 46

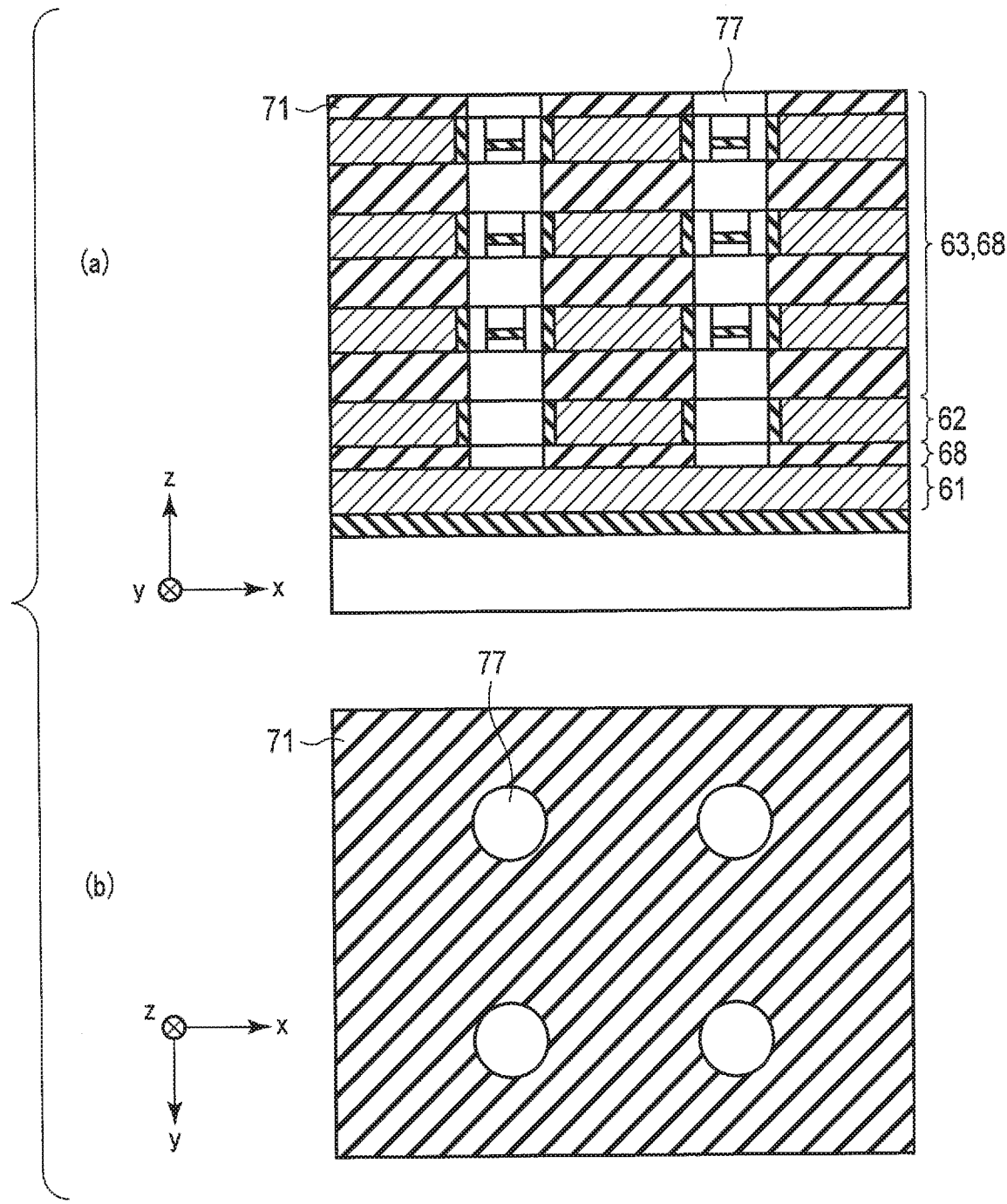
F I G. 47

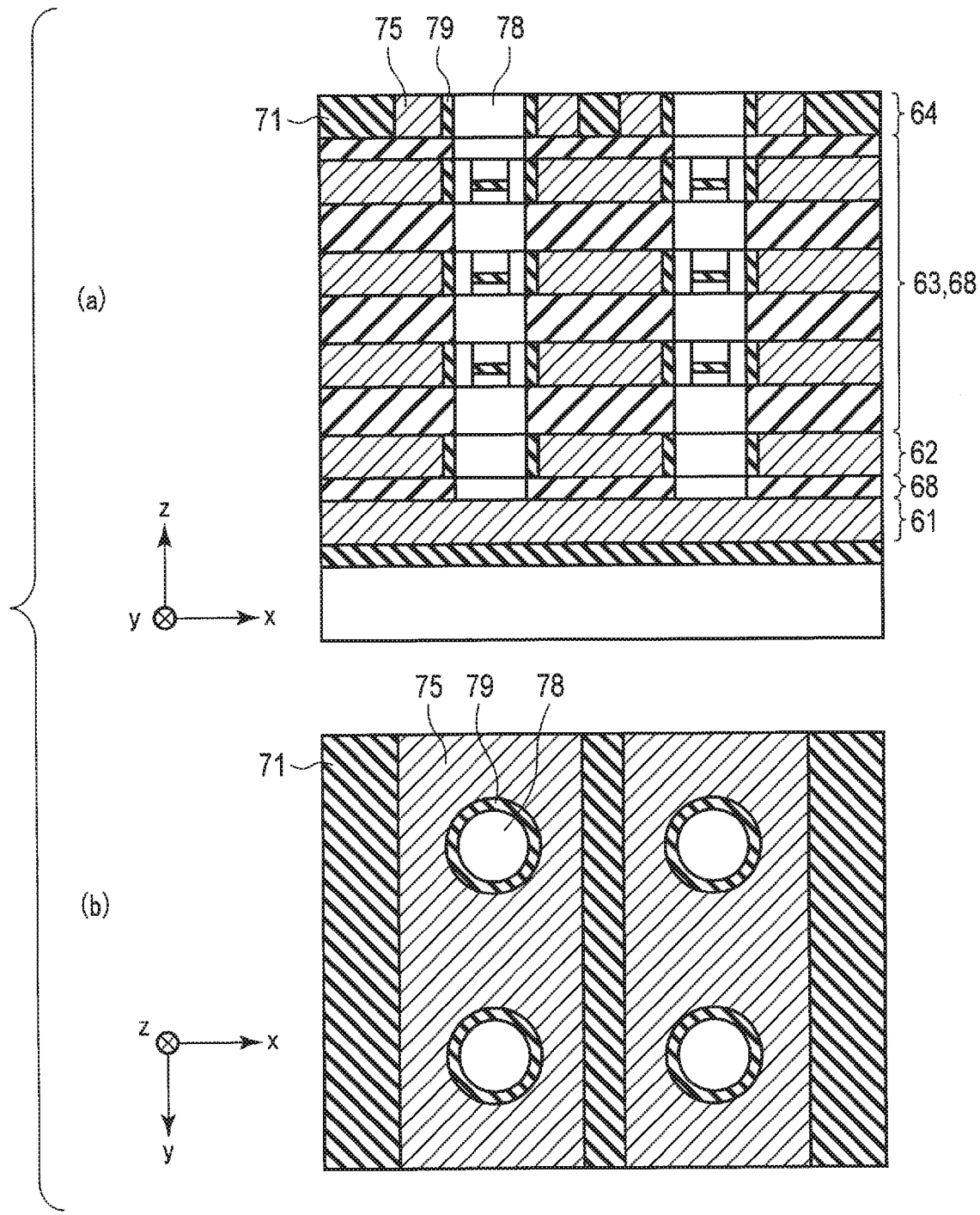
F I G. 48

MAGNETIC STORAGE DEVICE

CROSS-REFERENCE TO RELATED APPLICATIONS

This application claims the benefit of U.S. Provisional Application No. 62/257,094, filed Nov. 18, 2015, the entire contents of which are incorporated herein by reference.

FIELD

Embodiments described herein relate generally to a magnetic storage device.

BACKGROUND

As a magnetic storage device included in a memory system, there is known a magnetic storage device (MRAM: Magnetoresistive Random Access Memory) which uses a magnetoresistive effect element.

The magnetic storage device includes, for example, a magnetoresistive effect element as a memory element. The magnetic storage device can store data, for example, by causing a magnetization reversal current to flow through the magnetoresistive effect element. The magnetoresistive effect element includes a memory layer and a reference layer each having magnetization. The magnetization reversal current sets the magnetization direction of the memory layer of the magnetoresistive effect element to be either parallel or antiparallel to the magnetization direction of the reference layer. The magnetization reversal current is controlled by turning on or off a transistor which is connected in series to the magnetoresistive effect element.

BRIEF DESCRIPTION OF THE DRAWINGS

FIG. 3 is a perspective view illustrating the configuration of the memory cell array of the magnetic storage device according to the first embodiment.

FIG. 14 is a waveform diagram at a read time of the magnetic storage device according to the first embodiment.

FIG. 22 is a cross-sectional view illustrating a part of the manufacturing method of the memory cell array of the magnetic storage device according to the first embodiment.

FIG. 24 is a cross-sectional view illustrating a part of the manufacturing method of the memory cell array of the magnetic storage device according to the first embodiment.

FIG. 27 is a perspective view illustrating a configuration of a memory cell array of a magnetic storage device according to a second embodiment.

FIG. 28 is a cross-sectional view illustrating the configuration of the memory cell array of the magnetic storage device according to the second embodiment.

FIG. 29 is a waveform diagram at a write time of the magnetic storage device according to the second embodiment.

FIG. 37 is a block diagram illustrating a configuration of a magnetic storage device according to a third embodiment.

FIG. 45 is a cross-sectional view illustrating a part of the manufacturing method of the memory cell array of the magnetic storage device according to the third embodiment.

FIG. 46 is a cross-sectional view illustrating a part of the manufacturing method of the memory cell array of the magnetic storage device according to the third embodiment.

FIG. 47 is a cross-sectional view illustrating a part of the manufacturing method of the memory cell array of the magnetic storage device according to the third embodiment.

FIG. 48 is a cross-sectional view illustrating a part of the manufacturing method of the memory cell array of the magnetic storage device according to the third embodiment.

DETAILED DESCRIPTION

In general, according to one embodiment, a magnetic storage device includes a semiconductor region including a trench; a gate electrode disposed in the trench; an insulation film covering the gate electrode and disposed in the trench; and a magnetoresistive effect element including at least a first ferromagnetic layer, a second ferromagnetic layer, and a non-magnetic layer disposed between the first ferromagnetic layer and the second ferromagnetic layer, the non-magnetic layer in a side surface of the magnetoresistive effect element including the non-magnetic layer being disposed on a top surface of the insulation film.

Hereinafter, embodiments will be described with reference to the accompanying drawings. In the description below, structural elements having substantially the same functions and structures are denoted by like reference signs, and an overlapping description is given only where necessary. In addition, embodiments to be described below illustrate, by way of example, devices or methods for embodying technical concepts of the embodiments, and the technical concepts of the embodiments do not specifically restrict the material, shape, structure, arrangement, etc. of structural components to those described below. Various changes may be made in the technical concepts of the embodiments within the scope of the claims.

1. First Embodiment

A magnetic storage device according to a first embodiment and a manufacturing method thereof are described.

1.1. Re: Configuration 1.1.1. Re: Configuration of Magnetic Storage Device

To begin with, the configuration of the magnetic storage device according to the first embodiment is described. The magnetic storage device according to the first embodiment is a spin transfer torque-type magnetic storage device (STT-MRAM: Spin Transfer Torque-Magnetoresistive Random Access Memory) by a vertical magnetization method, which uses, for example, a magnetoresistive effect element (MTJ (Magnetic Tunnel Junction) element) as a memory element.

Figure 1:
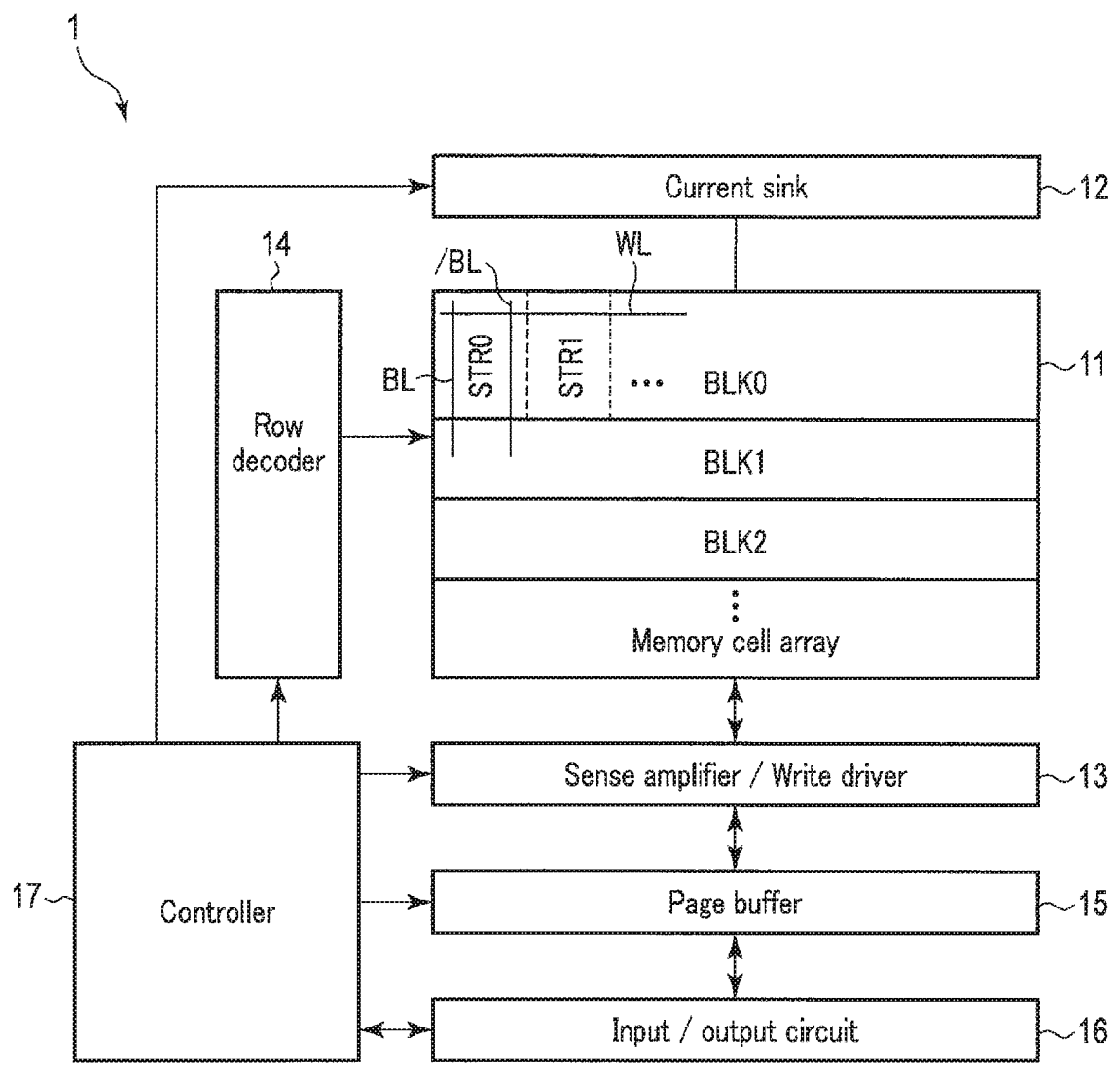
FIG. 1 is a block diagram illustrating a configuration of a magnetic storage device according to a first embodiment.

FIG. 1 is a block diagram illustrating the configuration of the magnetic storage device according to the first embodiment. As illustrated in the Figure, the magnetic storage device 1 includes a memory cell array 11, a current sink 12, a sense amplifier/write driver (SA/WD) 13, a row decoder 14, a page buffer 15, an input/output circuit 16, and a controller 17.

The memory cell array 11 includes a plurality of blocks BLK (BLK0, BLK1, BLK2, . . . ). Each block BLK includes a plurality of cell strings STR (STR0, STR1, . . . ). Each cell string STR includes a plurality of memory cells MC (not shown). In addition, the memory cell array 11 includes elements such as a word line WL, a bit line BL, and a source line/BL.

The current sink 12 is connected to the bit line BL and source line/BL. In operations such as data write and read, the current sink 12 sets the bit line BL or source line/BL at a ground potential.

The SA/WD 13 is connected to the memory cell array 11 via the bit line BL and source line/BL. The SA/WD 13 supplies current to a cell string STR including a memory cell MC of an operation target via the bit line BL and source line/BL, thereby executing write and read of data to and from the memory cell MC. To be more specific, the write driver of the SA/WD 13 executes data write to the memory cell MC, and the sense amplifier of the SA/WD 13 executes data read from the memory cell MC.

The row decoder 14 is connected to the memory cell array 11 via a plurality of word lines WL. The row decoder 14 decodes a row address which designates a row direction of the memory cell array 11. Then, the row decoder 14 selects a word line WL in accordance with a decoded result, and applies a voltage that is necessary for operations such as data write and read.

The page buffer 15 temporarily stores, in units of data called "page", the data that is to be written to the memory cell array 11, or the data that was read out of the memory cell array 11.

The input/output circuit 16 transmits various signals, which were received from the outside, to the controller 17 and page buffer 15, and transmits various information from the controller 17 and page buffer 15 to the outside.

The controller 17 is connected to the current sink 12, SA/WD 13, row decoder 14, page buffer 15, and input/ output circuit 16. The controller 17 controls the current sink 12, SA/WD 13, row decoder 14 and page buffer 15 in accordance with various signals which the input/output circuit 16 received from the outside.

1.1.2. Re: Configuration of Memory Cell Array

Figure 2:
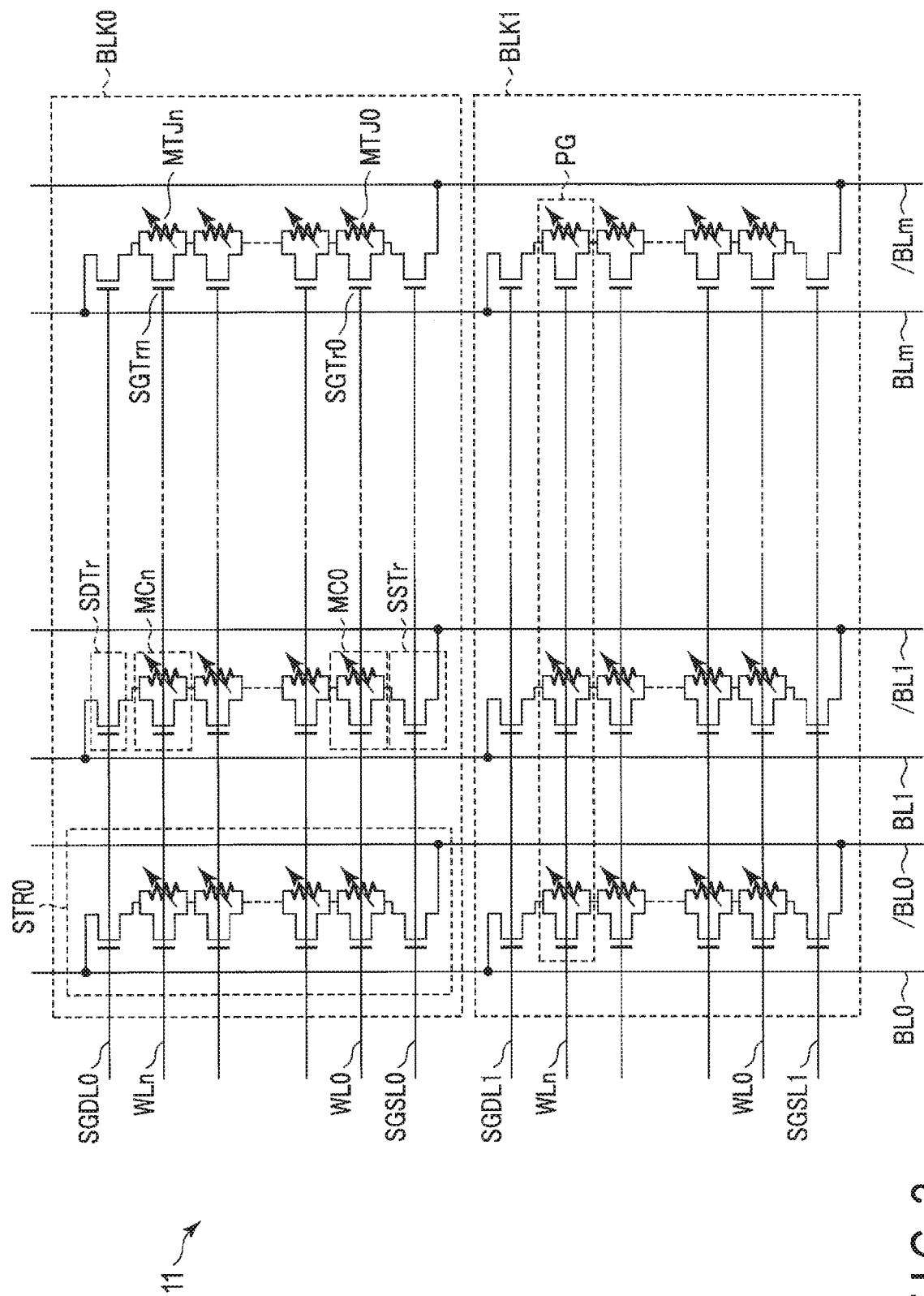
FIG. 2 is a circuit diagram illustrating a configuration of a memory cell array of the magnetic storage device according to the first embodiment.

Next, the configuration of the memory cell array according to the first embodiment is described. FIG. 2 is a circuit diagram of a part (two blocks BLK) of the memory cell array of the magnetic storage device according to the first embodiment. As described above, the memory cell array 11 includes plural blocks BLK, and each block BLK includes an (m+1) number of cell strings STR. Each cell string STR includes an (n+1) number of memory cells MC, and each memory cell MC includes a select transistor SGTr and a magnetoresistive effect element MTJ, which constitute a pair. The magnetoresistive effect element MTJ functions as a memory element which can store data, by taking different resistance states. In addition, the memory cell array 11 includes a plurality of word lines WL, a plurality of bit lines BL, and a plurality source lines/BL. In each block BLK, one cell string STR is connected between a pair of a bit line BL and a source line/BL. Here, each of m and n is an integer of 0 or more.

The cell string STR includes a source-side select gate transistor SSTr, an (n+1) number of memory cells MC0 to MCn, and a drain-side select gate transistor SDTr, which are connected in series. In each cell string STR, one end of the source-side select gate transistor SSTr is connected to one end of a select transistor SGTr0 and one end of a magnetoresistive effect element MTJ0 in the memory cell MC0. One end of the drain-side select gate transistor SDTr is connected to the other end of a select transistor SGTrn and the other end of a magnetoresistive effect element MTJn in the memory cell MCn. Specifically, the select transistor SGTr and the magnetoresistive effect element MTJ in the memory cell MC are connected in parallel such that one end of the select transistor SGTr and one end of the magnetoresistive effect element MTJ are equal in potential and the other end of the select transistor SGTr and the other end of the magnetoresistive effect element MTJ are equal in potential.

The other end of the source-side select gate transistor SSTr is connected to the source line/BL. The other end of the drain-side select gate transistor SDTr is connected to the bit line BL.

In each block BLK, the gates of the source-side select gate transistors SSTr of the respective cell strings STR in the block BLK are commonly connected to a source-side select gate line SGSL. Source-side select gate lines SGSL0 and SGSL1 are provided for the blocks BLK0 and BLK1, respectively.

In each block BLK, the gates of the drain-side select gate transistors SDTr of the respective cell strings STR in the block BLK are commonly connected to a drain-side select gate line SGDL. Drain-side select gate lines SGDL0 and SGDL1 are provided for the blocks BLK0 and BLK1, respectively.

An (m+1) number of memory cells MC, which are arranged in a direction of extension of the word line WL are called a page PG. For example, one block BLK includes an (n+1) pages PG. In each page PG, the gates of the select transistors SGTr of the respective memory cells MCi (i is an integer of 0 or more, and n or less) in the page PG are commonly connected to a word line WLi. The data, which is written to the memory cells MC, is read and written in units of a page.

Figure 4:
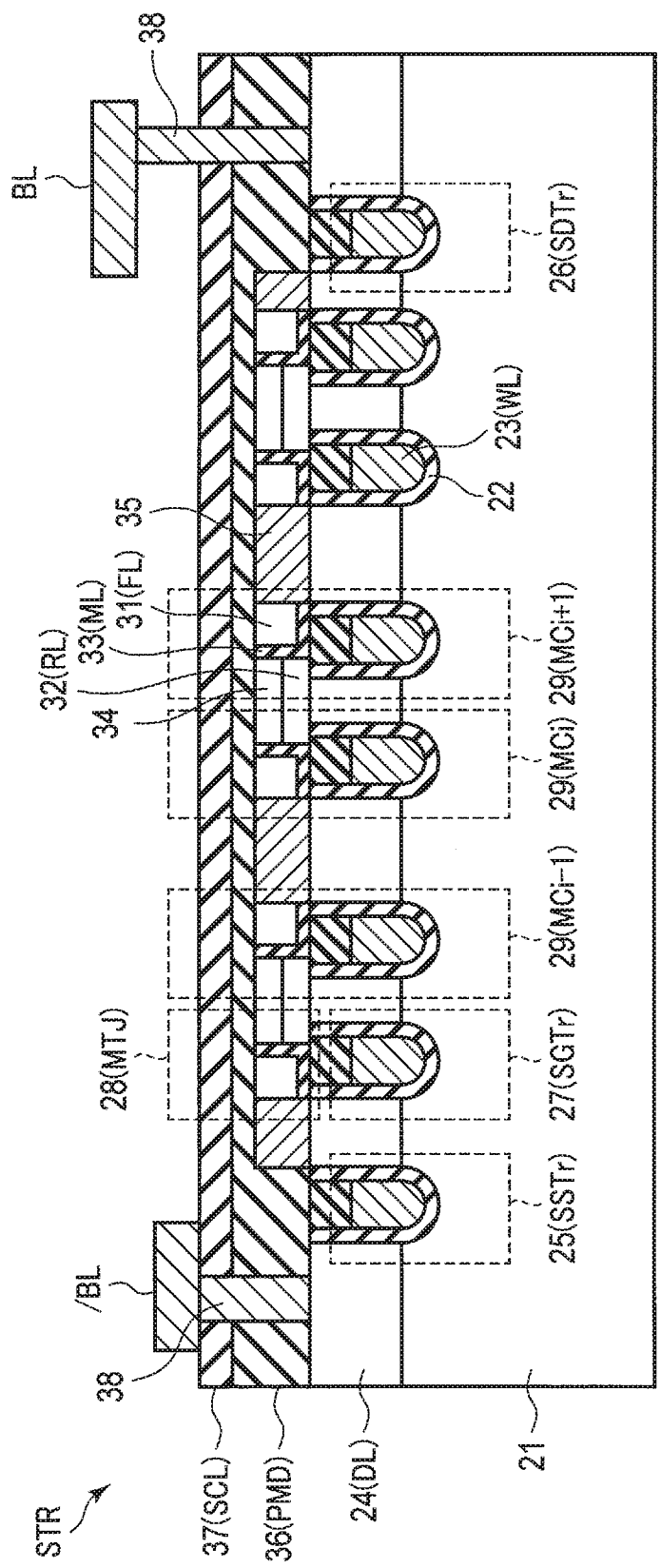
FIG. 4 is a cross-sectional view illustrating the configuration of the memory cell array of the magnetic storage device according to the first embodiment.

Next, a three-dimensional multi-layer structure of the memory cell array 11 is described with reference to FIG. 3 and FIG. 4. FIG. 3 is a perspective view of the memory cell array 11, and FIG. 4 is a cross-sectional view of the memory cell array 11 in an xz plane. The memory cell array 11 shown in FIG. 4 illustrates the configuration of one cell string STR. Incidentally, FIG. 3 depicts only two memory cells MC of the memory cells MC in FIG. 4, and omits depiction of the other memory cells MC. In addition, for the purpose of easier viewing, FIG. 3 and FIG. 4 omit the depiction of partial structures such as insulation films.

The memory cell array 11, as illustrated, is provided on a semiconductor substrate 21 which extends in an xy plane direction. The semiconductor substrate 21 is, for example, single-crystal silicon, an STI (Shallow Trench Isolation) is formed by a device isolation insulation film (not shown), and a device formation region is provided along the x direction.

The semiconductor substrate 21 includes a plurality of trench portions which are cut along the y direction. Word lines 23 (WL) are disposed in the trench portions via insulation films 22. The insulation film 22 is provided on a top surface of the word line 23, and is disposed, for example, in a manner to fill the trench portion. The word line 23 functions as a gate electrode of the select transistor SGTr. On the top surface of the semiconductor substrate 21, a diffused region 24 (DL: Diffused Layer) is formed on both sides of the word line 23 along the x direction. The diffused region 24 functions as a source region or a drain region. In this manner, in the semiconductor substrate 21, transistors 25, 26 and 27 of a buried gate electrode type, in which a region along the bottom surface of each trench portion serves as a channel region (CH), are connected in series in the x direction. The respective transistors 25, 26 and 27 function as the source-side select gate transistor 25 (SSTr), drain-side select gate transistor 26 (SDTr) and select transistor 27 (SGTr) in the memory cell MC in the cell string STR.

A plurality of magnetoresistive effect elements 28 (MTJ) are disposed on the top surface of the device formation region of the semiconductor substrate 21. The magnetoresistive effect elements 28 function as memory elements in the memory cells MC. The magnetoresistive effect element 28 includes at least a storage layer 31 (FL), a reference layer 32 (RL) and a tunnel barrier layer 33 (ML). The magnetoresistive effect element 28 is disposed along the x direction on the semiconductor substrate 21 such that a boundary plane between the storage layer 31 and reference layer 32 is substantially perpendicular to the top surface of the semiconductor substrate 21. The storage layer 31 and reference layer 32 are coupled via the tunnel barrier layer 33 at the boundary region. Specifically, the magnetoresistive effect element 28, in which the storage layer 31, tunnel barrier layer 33 and reference layer 32 are coupled in the named order, is disposed in the x direction on the semiconductor substrate 21.

To be more specific, the tunnel barrier layer 33 includes a region (boundary region) which is deposited in the z direction, and a region (a region other than the boundary region) which is thinly deposited on the semiconductor substrate 21, and the tunnel barrier layer 33 is disposed so as to have a substantially L-shaped xz cross section. Of the tunnel barrier layer 33, the boundary region function as the tunnel barrier layer 33. The storage layer 31 is disposed on that region of the tunnel barrier layer 33, which excludes the boundary region, and is in contact with one end of the boundary region. The reference layer 32 is in contact with the other end of the boundary region. In the meantime, in the plane including the boundary region of the magnetoresistive effect element 28, the boundary region is disposed on the top surface of the insulation film 22. In addition, the height in the z direction of the reference layer 32 is less than the height of each of the storage layer 31 and tunnel barrier layer 33. A mask 34 is disposed on the top surface of the reference layer 32 so as to become equal in height to the storage layer 31 and tunnel barrier layer 33.

In addition, the reference layer 32 is shared by a memory cell MCi, which is a first memory cell of neighboring cells, and a memory cell MCi+1, which is a second memory cell of the neighboring cells. To be more specific, one end in the x direction of the reference layer 32, which is shared by the memory cell MCi and memory cell MCi+1, is coupled to the storage layer 31 of the memory cell MCi via the tunnel barrier layer 33. In addition, the other end in the x direction of the reference layer 32, which is shared by the memory cell MCi and memory cell MCi+1, is coupled to the storage layer 31 of the memory cell MCi+1 via the tunnel barrier layer 33. In other words, a magnetoresistive effect element MTJi, which is included in the memory cell MCi, and a magnetoresistive effect element MTJi+1, which is included in the memory cell MCi+1, are disposed in opposite directions.

Besides, a contact 35 is formed between the storage layer 31 of the memory cell MCi and the storage layer 31 included in a memory cell MCi−1. Tungsten (W), for instance, is used as the contact 35. The contact 35 functions as a path of current flowing between the diffused region 24 on the semiconductor substrate 21 and the storage layer 31.

An interlayer insulation film 36 (PMD: Pre-Metal Dielectric) is disposed on the top surfaces of the magnetoresistive effect element 28 and contact 35. A shift cancelling layer 37 (SCL) of an insulative material is further disposed on the top surface of the interlayer insulation film 36. The shift cancelling layer 37 may be shared by all memory cells MC in the memory cell array 11. An insulation film (not shown) is further disposed on the top surface of the shift cancelling layer 37.

A source line contact 38 and a bit line contact 38 are provided in the interlayer insulation film 36, shift cancelling layer 37 and insulation layer (not shown), such that the source line contact 38 and bit line contact 38 penetrate these layers and come in contact with the diffused region 24 of the semiconductor substrate 21. In addition, a source line/BL is disposed on the top surface of the source line contact 38, and a bit line BL is disposed on the top surface of the bit line contact 38. In the meantime, the source line/BL and bit line BL are disposed so as not to interfere with each other when extending in the x direction. FIG. 3 and FIG. 4 omit depiction of a state in which the source line/BL and bit line BL extend in the x-direction, and this omission similarly applies to the description and drawings hereinafter.

In the description below, although is assumed that the shift cancelling layer 37 is formed of an insulative material, the shift canceling layer 37 is not limited to the insulative material, and an electrically conductive material is also applicable. However, when the electrically conductive material is applied to the shift cancelling layer 37, an insulation film is disposed at a boundary between the source line contact 38 and bit line contact 38, on one hand, and the shift cancelling layer 37, on the other hand.

1.1.3. Re: Configuration of Magnetoresistive Effect Element

Figure 5:
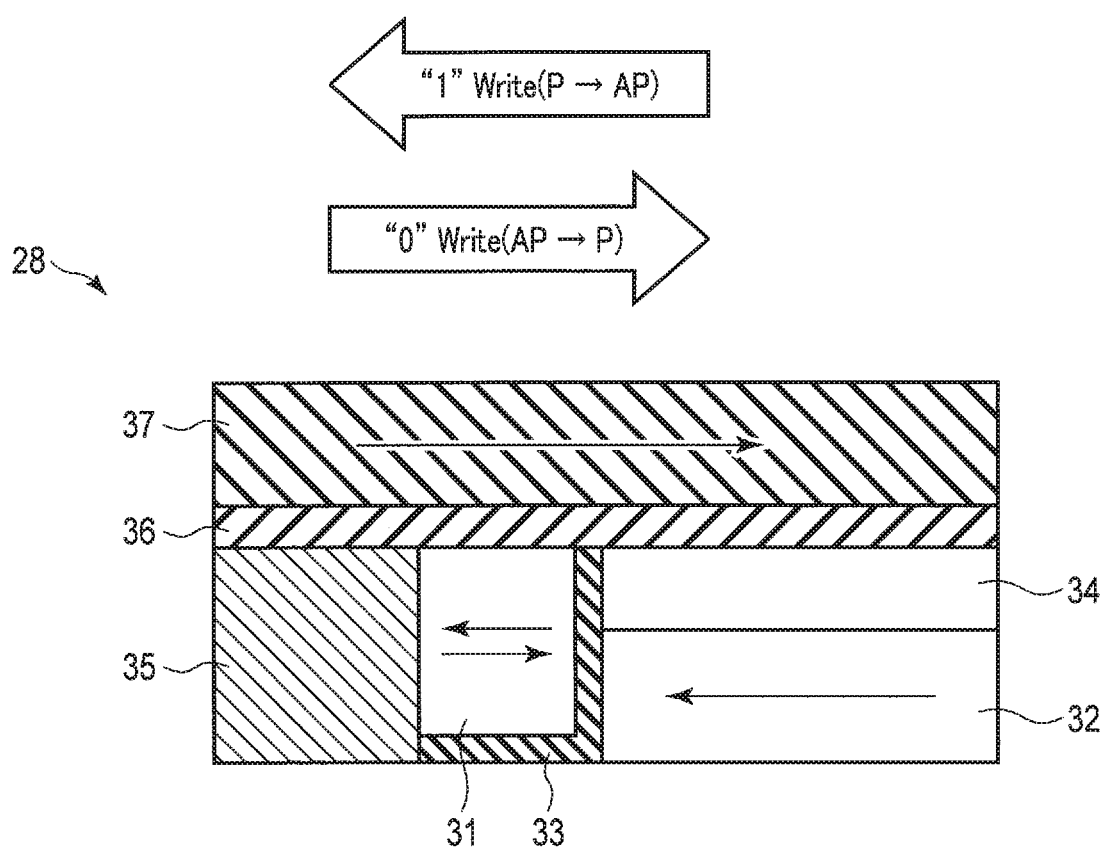
FIG. 5 is a cross-sectional view illustrating a configuration of a magnetoresistive effect element of the magnetic storage device according to the first embodiment.

Next, the configuration of the magnetoresistive effect element according to the first embodiment is described with reference to FIG. 5. FIG. 5 is a schematic view illustrating a configuration example of the magnetoresistive effect element 28 in the memory cell MC which the magnetic storage device according to the first embodiment includes. The magnetoresistive effect element 28 is configured to take different resistance states in accordance with the direction of electric current flowing through the magnetoresistive effect element 28. The magnetoresistive effect element 28 functions as a memory element capable of storing data, by taking different resistance states. A phenomenon in which a different resistance is exhibited in accordance with a state is called a magnetoresistive effect.

As described above, the magnetoresistive effect element 28 includes the storage layer 31, reference layer 32, tunnel barrier layer 33, mask 34, contact 35, interlayer insulation film 36, and shift cancelling layer 37. The storage layer 31, tunnel barrier layer 33 and reference layer 32 constitute a magnetic tunnel junction (MTJ).

The storage layer 31 and reference layer 32 are magnetic layers each having a magnetic anisotropy in a direction perpendicular to the boundary plane, that is, in a direction of arrows in FIG. 5. The tunnel barrier layer 33 is a nonmagnetic layer, and is formed by using, for example, magnesium oxide (MgO). The magnetoresistive effect element 28 is a vertical magnetization type MTJ element in which the magnetization direction of the storage layer 31 and reference layer 32 is perpendicular to the boundary plane.

The storage layer 31 has a magnetization direction which is a direction toward the reference layer 32 or the contact 35. The magnetization direction of the storage layer 31 is easily reversed. On the other hand, the magnetization direction of the reference layer 32 is fixed. That the magnetization direction of the reference layer 32 is "fixed" means that the magnetization direction of the reference layer 32 is not changed by an electric current which has such a magnitude as to be able to reverse the magnetization direction of the storage layer 31. In FIG. 5, the reference layer 32 is magnetized so as to have a magnetization direction toward the storage layer 31.

The shift cancelling layer 37 is a magnetic layer having a magnetic anisotropy in a direction similar to the directions of magnetic anisotropy of the storage layer 31 and reference layer 32. The magnetization direction of the shift cancelling layer 37 is fixed to be antiparallel to the magnetization direction of the reference layer 32. The shift cancelling layer 37 has a function of relaxing the effect which a leak magnetic field generated from the reference layer 32 exerts on the storage layer 31. Thereby, the shift cancelling layer 37 prevents the magnetization direction of the storage layer 31 from being fixed to the magnetization direction of the reference layer 32.

Incidentally, it should suffice if the magnetization directions of the reference layer 32 and shift cancelling layer 37 are antiparallel to each other, and the magnetization directions of the reference layer 32 and shift cancelling layer 37 are not limited to those illustrated in FIG. 5. For example, the magnetization direction of the reference layer 32 may be the other direction (not shown) corresponding to the magnetization direction of the storage layer 31, and the magnetization direction of the shift cancelling layer 37 may be antiparallel to the magnetization direction of the reference layer 32.

In the meantime, in the first embodiment, a spin-transfer writing method is adopted in which a write current is directly caused to flow through the magnetoresistive effect element 28, and the magnetization direction of the storage layer 31 is controlled by this write current. The magnetoresistive effect element 28 can take either a low resistance state or a high resistance state, depending on whether the relationship between the magnetization directions of the storage layer 31 and reference layer 32 is parallel or antiparallel.

If a write current in a direction from the storage layer 31 toward the reference layer 32 is caused to flow through the magnetoresistive effect element 28, the relationship between the magnetization directions of the storage layer 31 and reference layer 32 becomes parallel. In the case of this parallel state, the resistance value of the magnetoresistive effect element 28 becomes lowest, and the magnetoresistive effect element 28 is set in a low resistance state. This low resistance state is defined, for example, as data "0".

If a write current in a direction from the reference layer 32 toward the storage layer 31 is caused to flow through the magnetoresistive effect element 28, the relationship between the magnetization directions of the storage layer 31 and reference layer 32 becomes antiparallel. In the case of this antiparallel state, the resistance value of the magnetoresistive effect element 28 becomes highest, and the magnetoresistive effect element 28 is set in a high resistance state. This high resistance state is defined, for example, as data "1".

1.2. Re: Operation

Next, the operation of the magnetic storage device according to the first embodiment is described.

1.2.1. Re: Write Operation

At first, a write operation of the magnetic storage device according to the first embodiment is described with reference to FIG. 6 to FIG. 13. FIGS. 6, 8, 10 and 12 are waveform diagrams for describing an operation at a write time of the magnetic storage device 1 according to the first embodiment. FIGS. 7, 9, 11 and 13 are schematic views for describing current paths at the write time of the magnetic storage device 2 according to the first embodiment.

Figure 6:
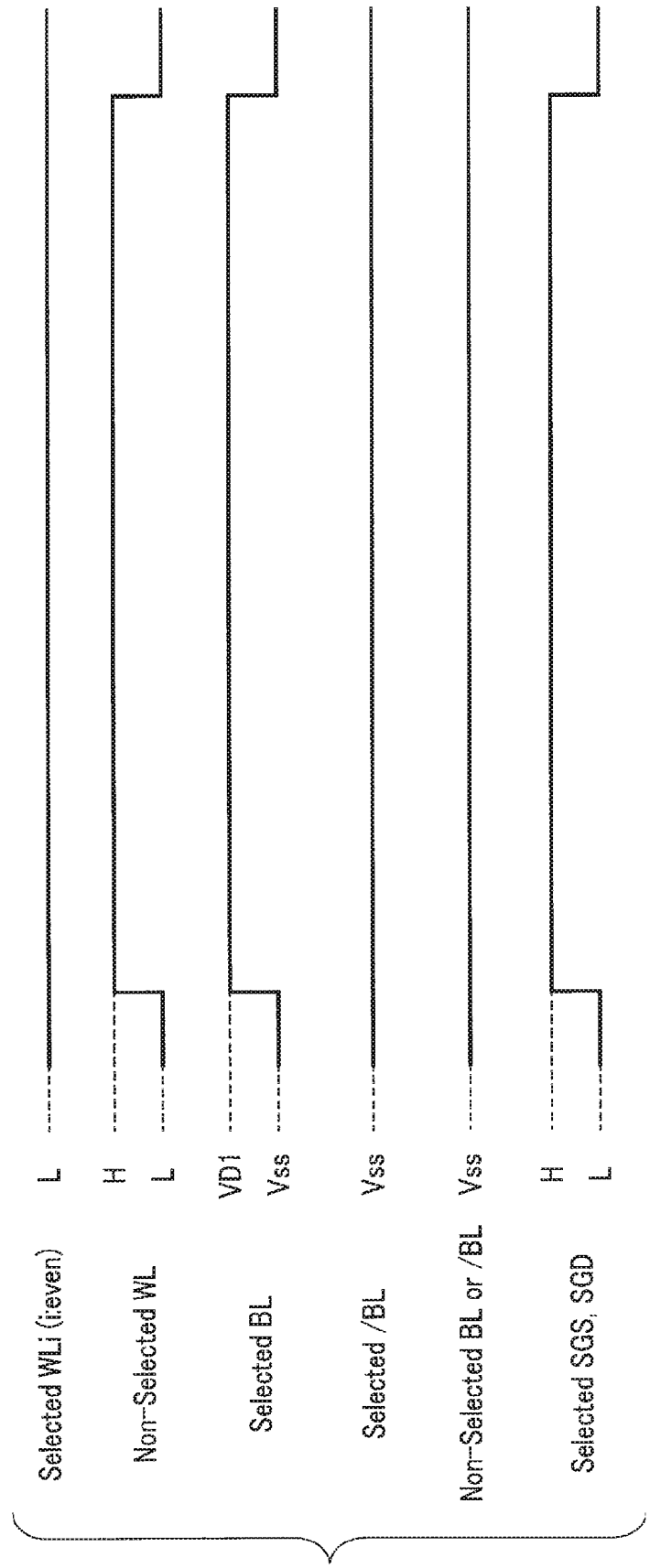
FIG. 6 is a waveform diagram at a write time of the magnetic storage device according to the first embodiment.
Figure 7:
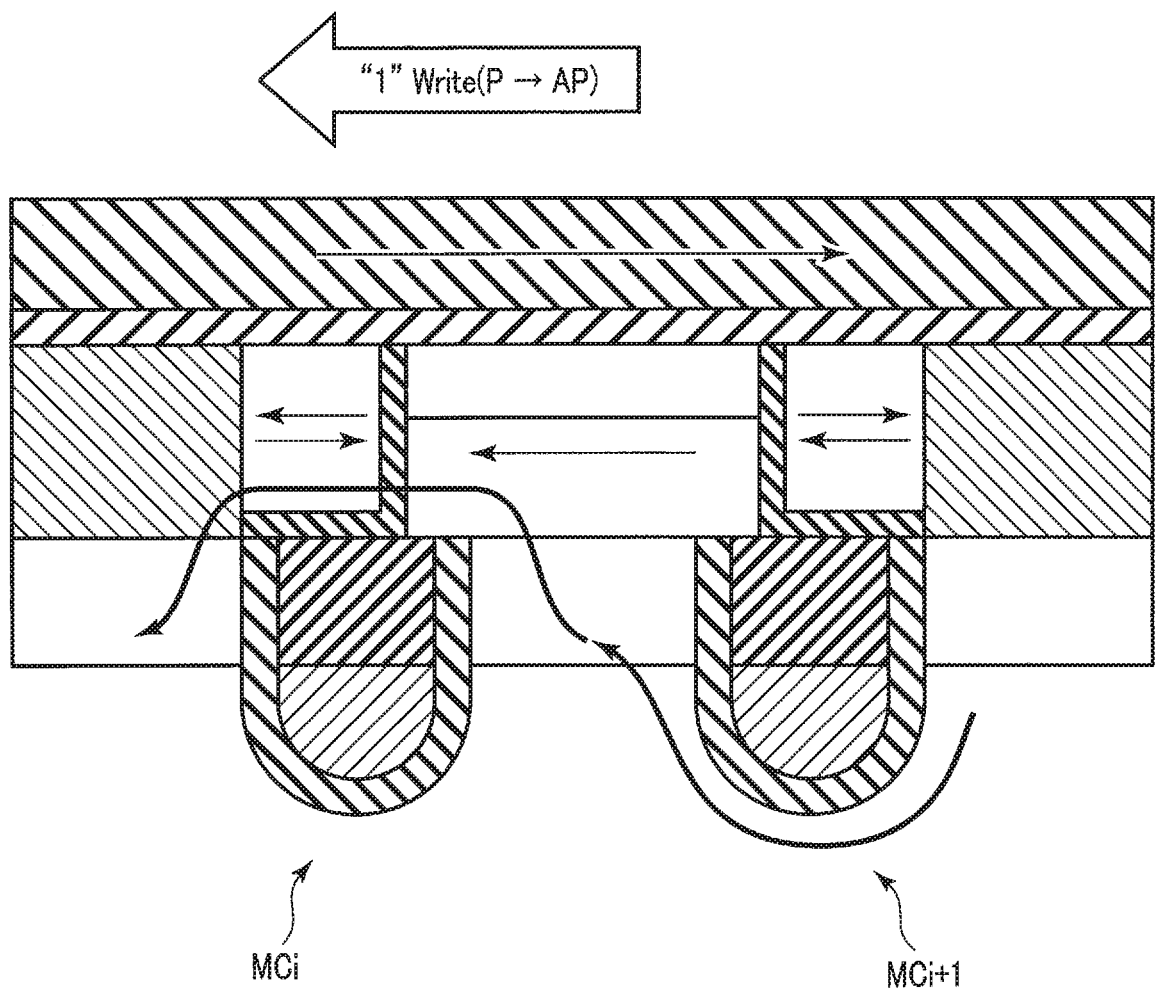
FIG. 7 is a schematic view illustrating a current path at a write time of the magnetic storage device according to the first embodiment.

To begin with, referring to FIG. 6 and FIG. 7, a description is given of a case of writing data "1" to a memory cell MCi of the memory cells MC in the string STR. It is assumed that i is an even number of 0 or more, and n or less. Specifically, it is assumed that the memory cell MCi shares the reference layer RL with a memory cell MCi+1, and that the memory cell MCi is disposed more on the source line/BL side than the memory cell MCi+1.

To start with, if the input/output circuit 16 receives a write command which instructs data write, the input/output circuit 16 transfers a write signal which instructs data write and write-destination addresses to the controller 17. In addition, the input/output circuit 16 transmits data "1", which is to be written, to the page buffer 15. The controller 17 transfers, of the write-destination addresses, a row address to the row decoder 14 and a column address to the SA/WD 13.

The row decoder 14 selects a block BLK of a write target in accordance with a decoded result of the row address, and applies a voltage that is necessary for the operation of data write. Specifically, the row decoder 14 selects a drain-side select gate line SGDL and a source-side select gate line SGSL which correspond to the write-target block BLK, and sets the drain-side select gate line SGDL and source-side select gate line SGSL at high potential H, thereby turning on a drain-side select gate transistor SDTr and a source-side select gate transistor SSTr. Subsequently, the row decoder 14 selects a word line WLi which is connected to a memory cell MCi of a write target in the selected block BLK. Specifically, the row decoder 14 sets the selected word line WLi at low potential L and turns off the connected select transistor SGTri, and the row decoder 14 sets a non-selected word line WL($\neq$i) at high potential H and turns on the connected select transistor SGTr($\neq$i).

The SA/WD 13 selects a string STR of a column of the write target in accordance with a decoded result of the column address, and writes, based on the write signal, the data, which is stored in the page buffer 15, to the selected memory cell MC. Specifically, the SA/WD 13 selects a bit line BL and a source line/BL which are connected to the string STR of the write-target memory cell MCi, and applies voltages which are necessary for the data write operation. The SA/WD 13 sets the selected bit line BL at potential VD1, and sets the selected source line/BL at ground potential Vss. In the meantime, the non-selected bit line BL and source line/BL are set at ground potential Vss.

Thereby, in the selected string STR, an electric current flows from the bit line BL toward the source line/BL. The select transistor SGTr($\neq$i) in the non-selected memory cell MC($\neq$i), among the memory cells MC of the selected string STR, is turned on. Thus, the resistance value of the select transistor SGTr($\neq$i) is smaller than the resistance value of the magnetoresistive effect element 28. Accordingly, in the memory cell MC($\neq$i), current flows in the select transistor SGTr($\neq$i). On the other hand, in the selected memory cell MCi, the select transistor SGTri is turned off. Thus, the resistance value of the select transistor SGTr is greater than the resistance value of the magnetoresistive effect element 28. Accordingly, in the memory cell MCi, a predetermined current flows from the reference layer 32 side toward the storage layer 31 side of the magnetoresistive effect element 28. Thereby, data "1" is written to the magnetoresistive effect element 28 in the selected memory cell MCi. In this manner, the potential VD1 has a value for causing an electric current for writing data "1" to flow to the memory cell MCi.

Figure 8:
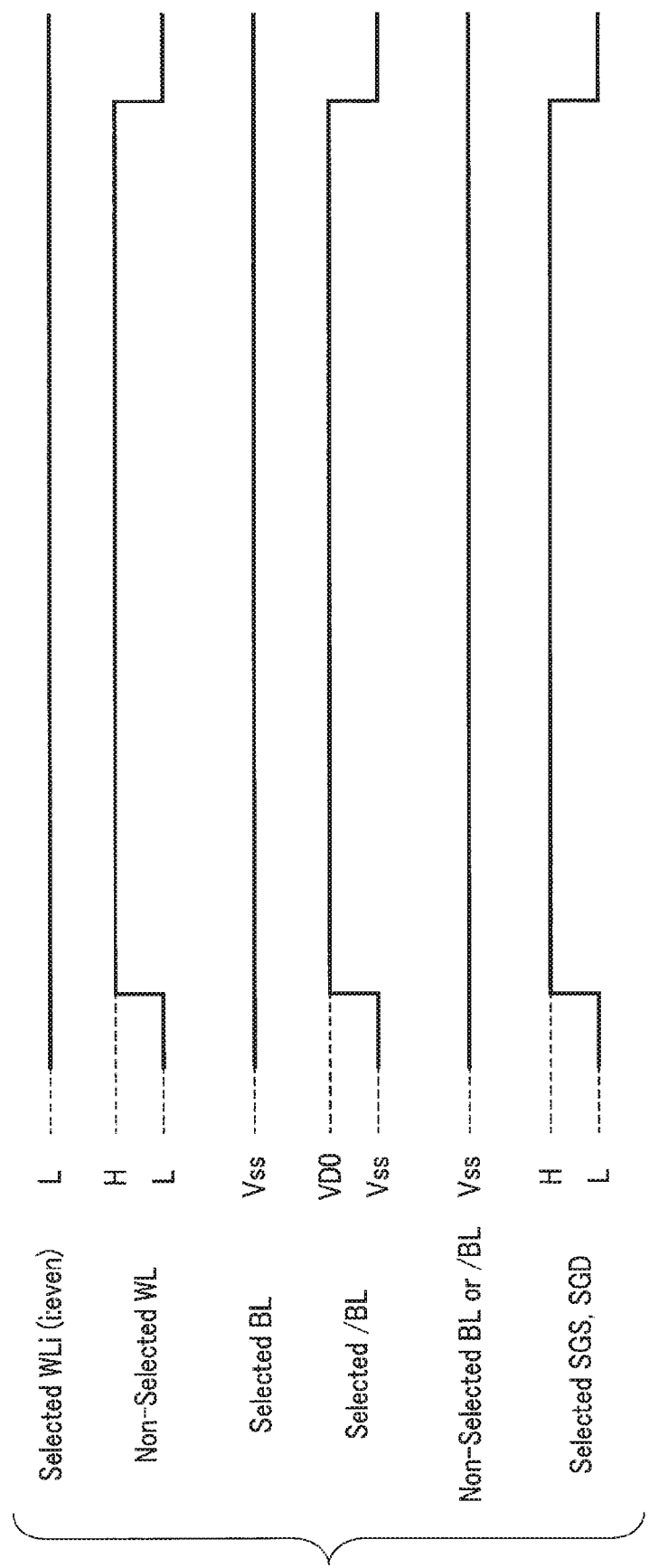
FIG. 8 is a waveform diagram at a write time of the magnetic storage device according to the first embodiment.
Figure 9:
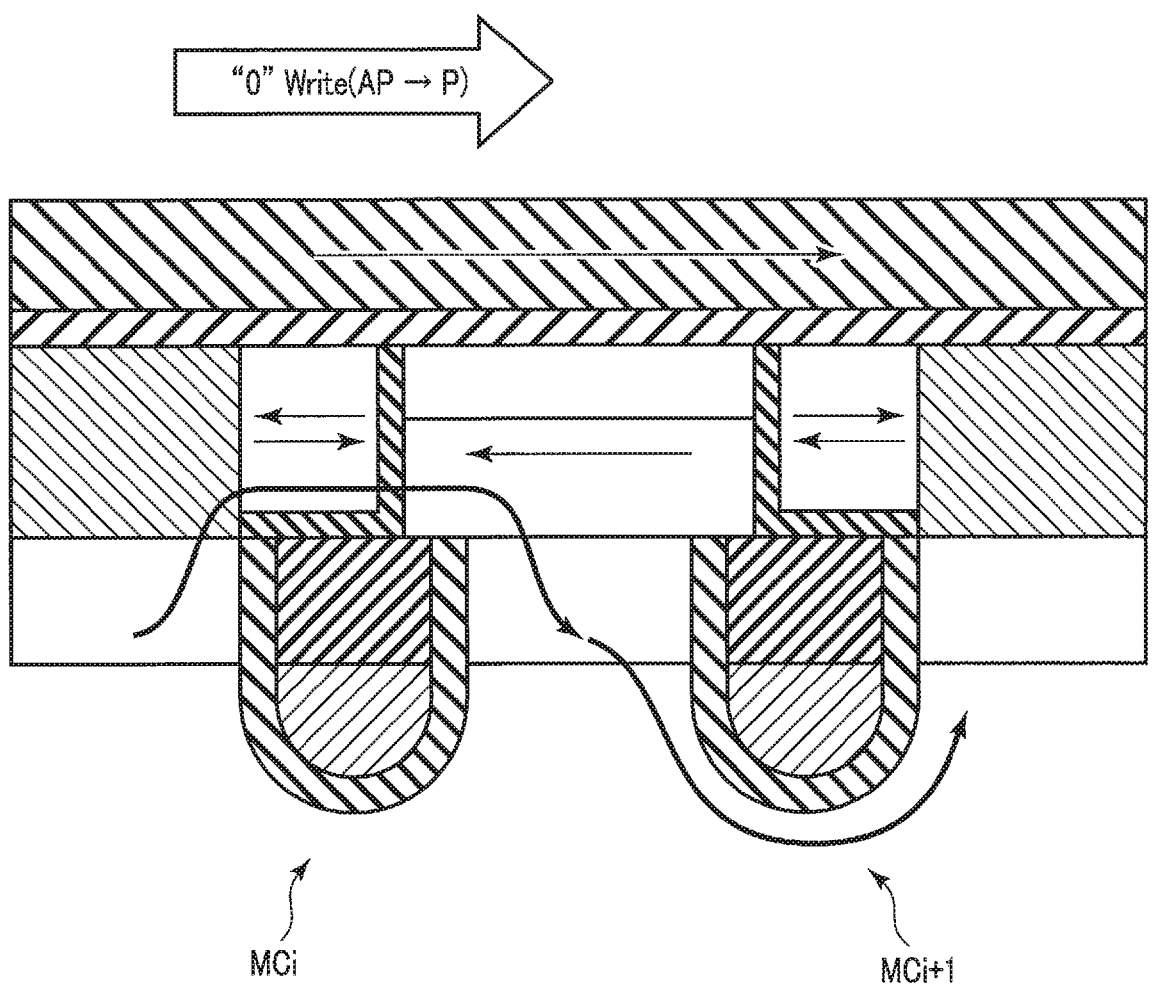
FIG. 9 is a schematic view illustrating a current path at a write time of the magnetic storage device according to the first embodiment.

Next, referring to FIG. 8 and FIG. 9, the case of writing data "0" to the memory cell MCi is described.

Since the operations of the input/output circuit 16, controller 17 and row decoder 14 are the same as in the case of writing data "1" to a memory cell MCi, a description thereof is omitted.

The SA/WD 13 selects a string STR of a column of a write target in accordance with a decoded result of the column address, and writes, based on the write signal, the data, which is stored in the page buffer 15, to the selected memory cell MC. Specifically, the SA/WD 13 selects a bit line BL and a source line/BL which are connected to the string STR of the write-target memory cell MCi, and applies voltages which are necessary for the data write operation. The SA/WD 13 sets the selected bit line BL at ground potential Vss, and sets the selected source line/BL at potential VD0. In the meantime, the non-selected bit line BL and source line/BL are set at ground potential Vss.

Thereby, in the selected string STR, an electric current flows from the source line/BL toward the bit line BL. Specifically, in the memory cell MCi, a predetermined current flows from the storage layer 31 side toward the reference layer 32 side of the magnetoresistive effect element 28. Thereby, data "0" is written to the magnetoresistive effect element 28 in the selected memory cell MCi. In this manner, the potential VD0 has a value for causing an electric current for writing data "0" to flow to the memory cell MCi. The high potential H, as described above, has a value for causing a current for turning on each transistor SGTr, SDTr, SSTr to flow, and the low potential L has a value for causing a current for turning off each transistor SGTr, SDTr, SSTr to flow.

Figure 10:
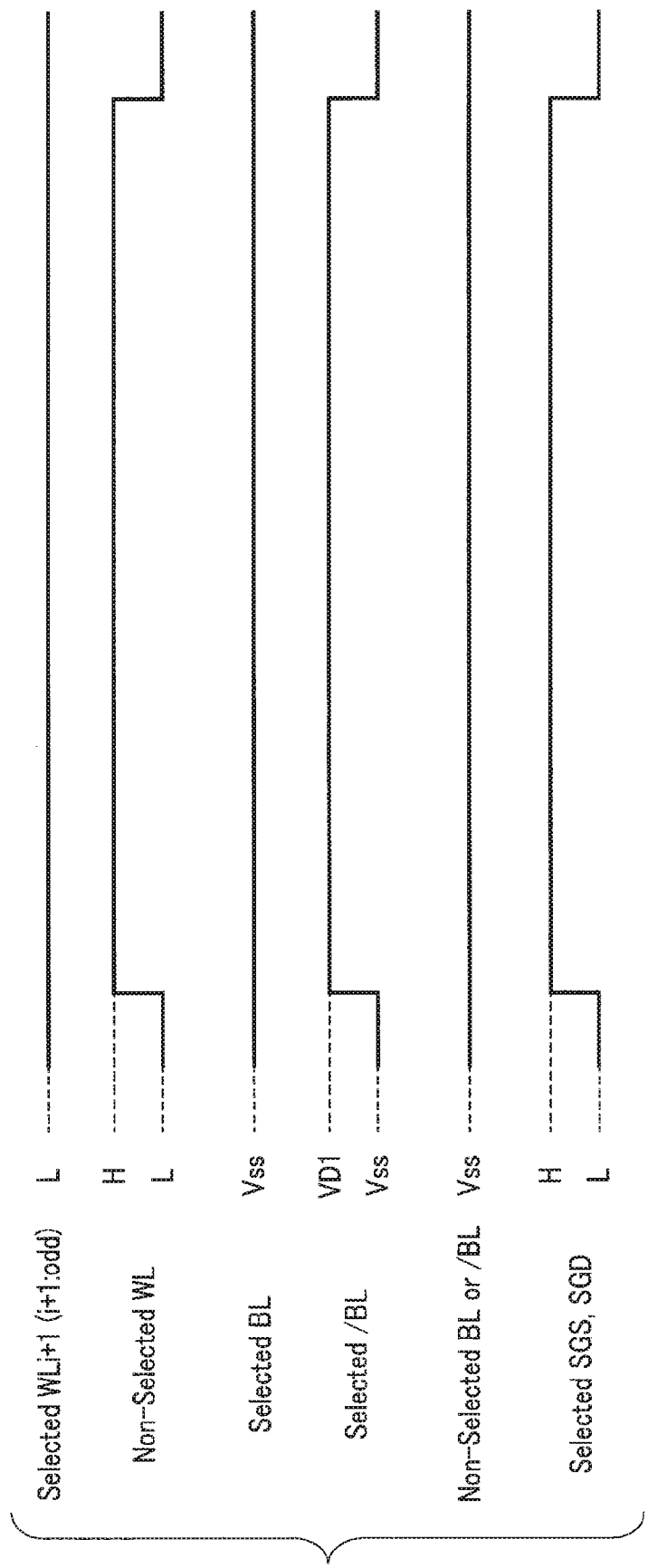
FIG. 10 is a waveform diagram at a write time of the magnetic storage device according to the first embodiment.
Figure 11:
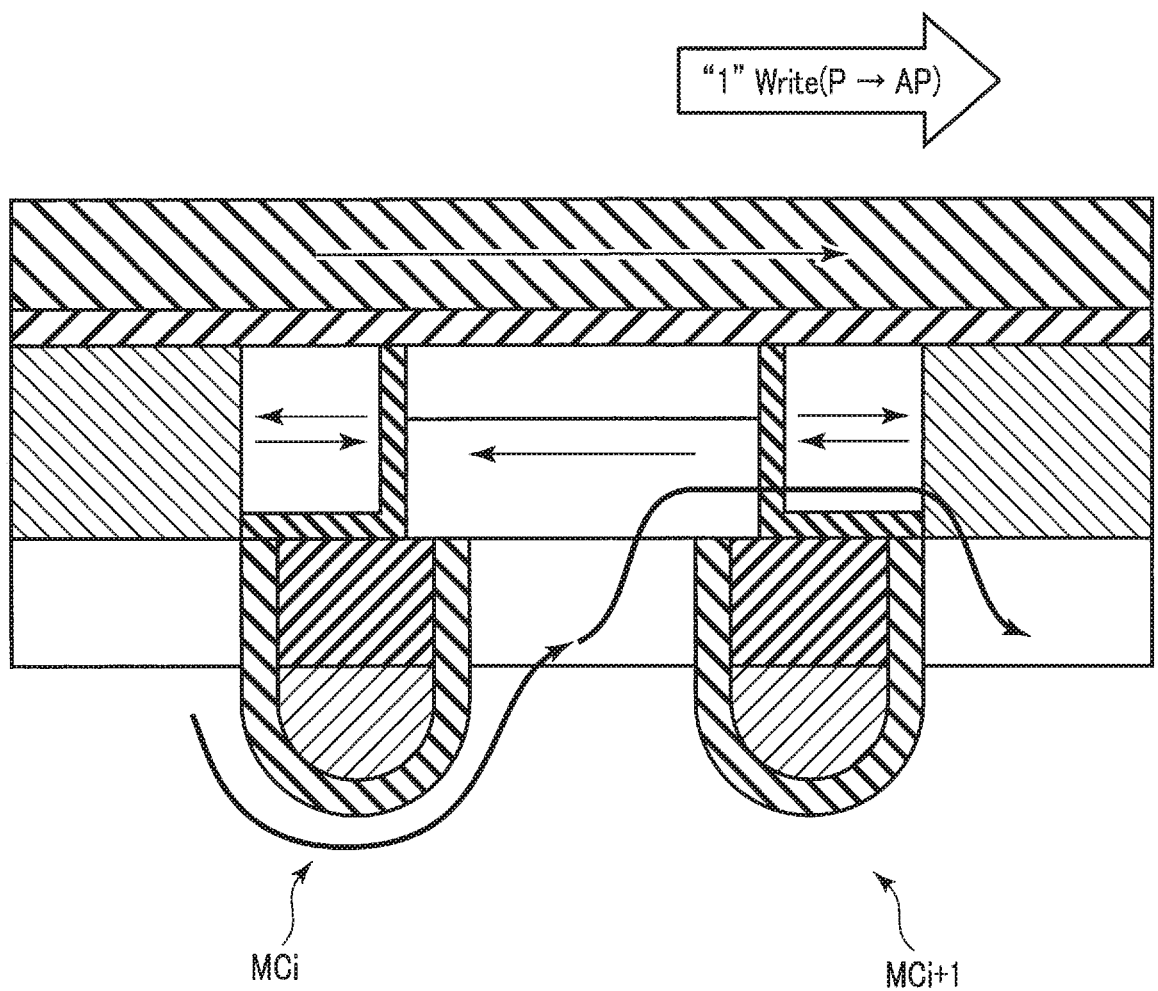
FIG. 11 is a schematic view illustrating a current path at a write time of the magnetic storage device according to the first embodiment.

Next, referring to FIG. 10 and FIG. 11, a description is given of a case of writing data "1" in a memory cell MCi+1 of the memory cells MC in the string STR. The number i+1 is an odd number of 0 or more, and n or less. Specifically, it is assumed that the memory cell MCi+1 shares the reference layer RL with the memory cell MCi, and that the memory cell MCi+1 is disposed more on the bit line BL side than the memory cell MCi.

Since the operations of the input/output circuit 16 and controller 17 are the same as in the case of writing data "1" to the memory cell MCi, a description thereof is omitted.

The row decoder 14 selects a block BLK of a write target in accordance with a decoded result of the row address, and applies a voltage that is necessary for the operation of data write. Specifically, the row decoder 14 selects a drain-side select gate line SGDL and a source-side select gate line SGSL which correspond to the write-target block BLK, and sets the drain-side select gate line SGDL and source-side select gate line SGSL at high potential thereby turning on a drain-side select gate transistor SDTr and a source-side select gate transistor SSTr. Subsequently, the row decoder 14 selects a word line WLi+1 which is connected to a memory cell MCi+1 of a write target in the selected block BLK. Specifically, the row decoder 14 sets the selected word line WLi+1 at low potential L and turns off the connected select transistor SGTri+1, and the row decoder 14 sets a non-selected word line WL(≠i+1) at high potential H and turns on the connected select transistor SGTr(≠i+1).

The SA/WD 13 selects a string of a column of the write target in accordance with a decoded result of the column address, and writes, based on the write signal, the data, which is stored in the page buffer 15, to the selected memory cell MC. Specifically, the SA/WD 13 selects a bit line BL and a source line/BL which are connected to the string STR of the write-target memory cell MCi+1, and applies voltages which are necessary for the data write operation. The SA/WD 13 sets the selected bit line BL at ground potential Vss, and sets the selected source line/BL at potential VD1. In the meantime, the non-selected bit line BL and source line/BL are set at ground potential Vss.

Thereby, in the selected string STR, an electric current flows from the source line/BL toward the bit line BL. Specifically, in the memory cell MCi+1, a predetermined current flows from the reference layer 32 side toward the storage layer 31 side of the magnetoresistive effect element 28. Thereby, data "1" is written to the magnetoresistive effect element 28 in the selected memory cell MCi+1.

Figure 12:
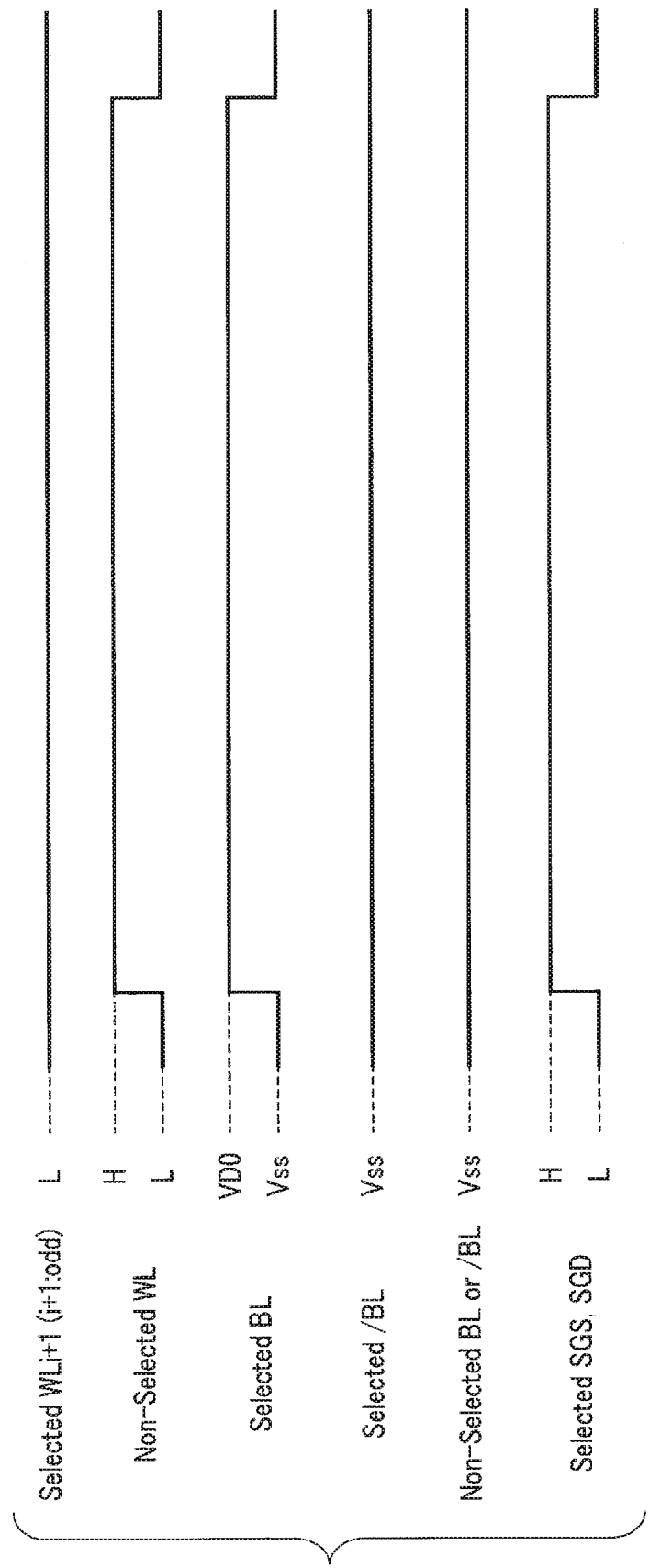
FIG. 12 is a waveform diagram at a write time of the magnetic storage device according to the first embodiment.
Figure 13:
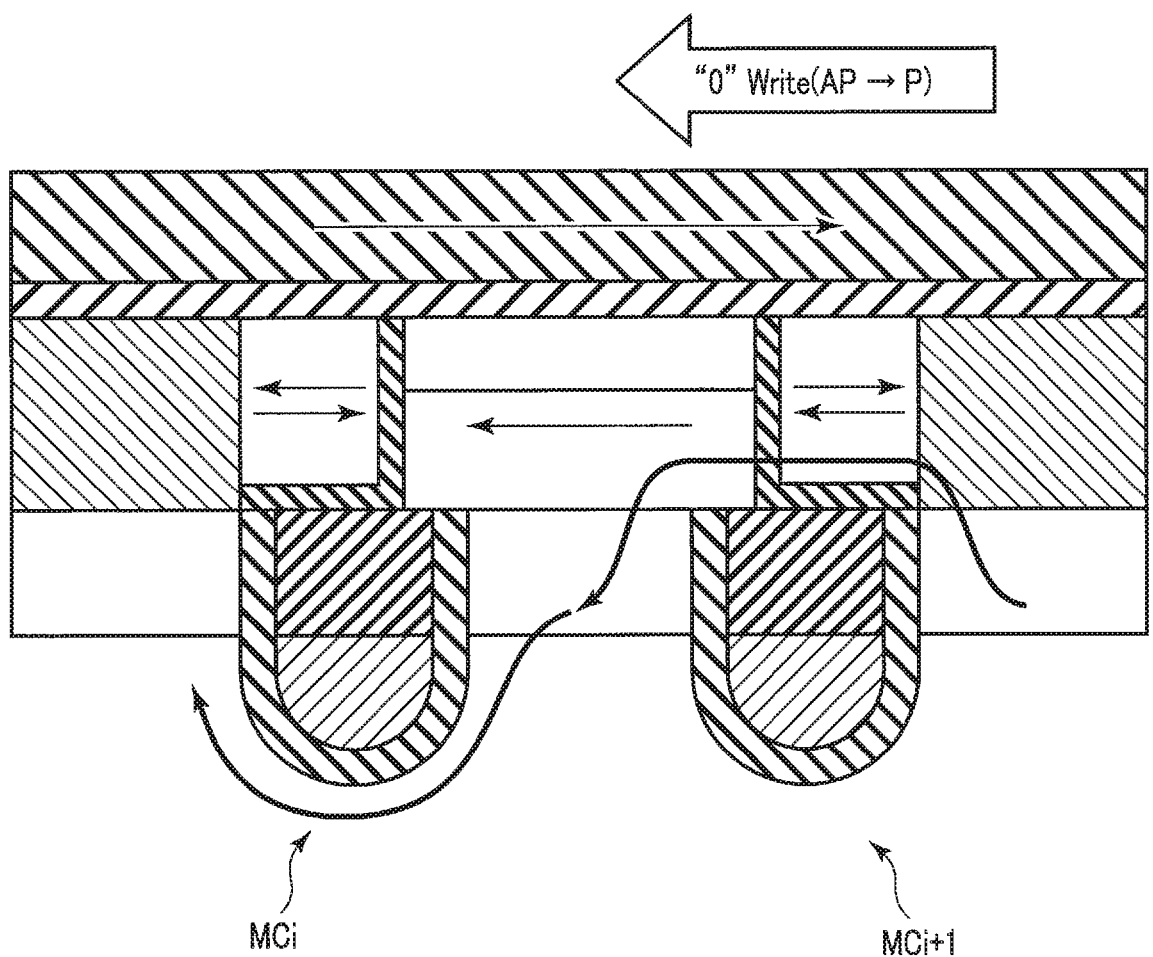
FIG. 13 is a schematic view illustrating a current path at a write time of the magnetic storage device according to the first embodiment.

Next, referring to FIG. 12 and FIG. 13, the case of writing data "0" to the memory cell MCi+1 is described.

Since the operations of the input/output circuit 16, controller 17 and row decoder 14 are the same as in the case of writing data "1" to the memory cell MCi+1, a description thereof is omitted.

The SA/WD 13 selects a string of a column of a write target in accordance with a decoded result of the column address, and writes, based on the write signal, the data, which is stored in the page buffer 15, to the selected memory cell MC. Specifically, the SA/WD 13 selects a bit line BL and a source line/BL which are connected to the string STR of the write-target memory cell MCi+1, and applies voltages which are necessary for the data write operation. The SA/WD 13 sets the selected bit line BL at potential VD0, and sets the selected source line/BL at ground potential Vss. In the meantime, the non-selected bit line BL and source line/BL are set at ground potential Vss.

Thereby, in the selected string STR, an electric current flows from the bit line BL toward the source line/BL. Specifically, in the memory cell MCi+1, a predetermined current flows from the storage layer 31 side toward the reference layer 32 side of the magnetoresistive effect element 28. Thereby, data "0" is written to the magnetoresistive effect element 28 in the selected memory cell MCi+1.

1.2.2. Re: Read Operation

To begin with, a read operation of the magnetic storage device according to the first embodiment is described with reference to FIG. 14. FIG. 14 is a waveform diagram for describing an operation at a read time of the magnetic storage device 1 according to the first embodiment. In the description below, a case is described in which data of an arbitrary memory cell MC in the string STR is read.

If the input/output circuit 16 receives a read command which instructs data read from a controller (not shown), the input/output circuit 16 transfers a read signal which instructs data read and read-source addresses to the controller 17. The controller 17 transfers, of the read-source addresses, a row address to the row decoder 14 and a column address to the SA/WD 13.

Based on the row address and column address, the row decoder 14 and SA/WD 13 select a memory cell MC of a read target. Based on the read signal, the SA/WD 13 transfers data, which is stored in the selected memory cell MC, to the page buffer 15. To be more specific, the SA/WD 13 sets the selected bit line BL at potential VR, sets the source line/BL at ground potential Vss, and causes a read current to flow. Subsequently, the SA/WD 13 compares the value of the read current with a current value of a reference current, and determines whether the data of the read-target memory cell MC is "0" or "1". As a result of the determination, the data stored in the memory cell MC is transferred to the page buffer 15. The input/output circuit 16 sends the read data, which is stored in the page buffer 15, to the controller.

By the above, the read operation is completed.

1.3. Re: Manufacturing Method

Next, the manufacturing method of the magnetic storage device according to the first embodiment is described with reference to FIG. 15 to FIG. 26. FIG. 15(a) to FIG. 26(a) are cross-sectional views in an xz plane of the string STR of the memory cell array 11 in stages of manufacture of the magnetic storage device 1 according to the first embodiment, and FIG. 15(b) to FIG. 26(b) are top views which schematically illustrate the memory cell array 11 in stages of manufacture of the magnetic storage device 1 according to the first embodiment.

Figure 15:
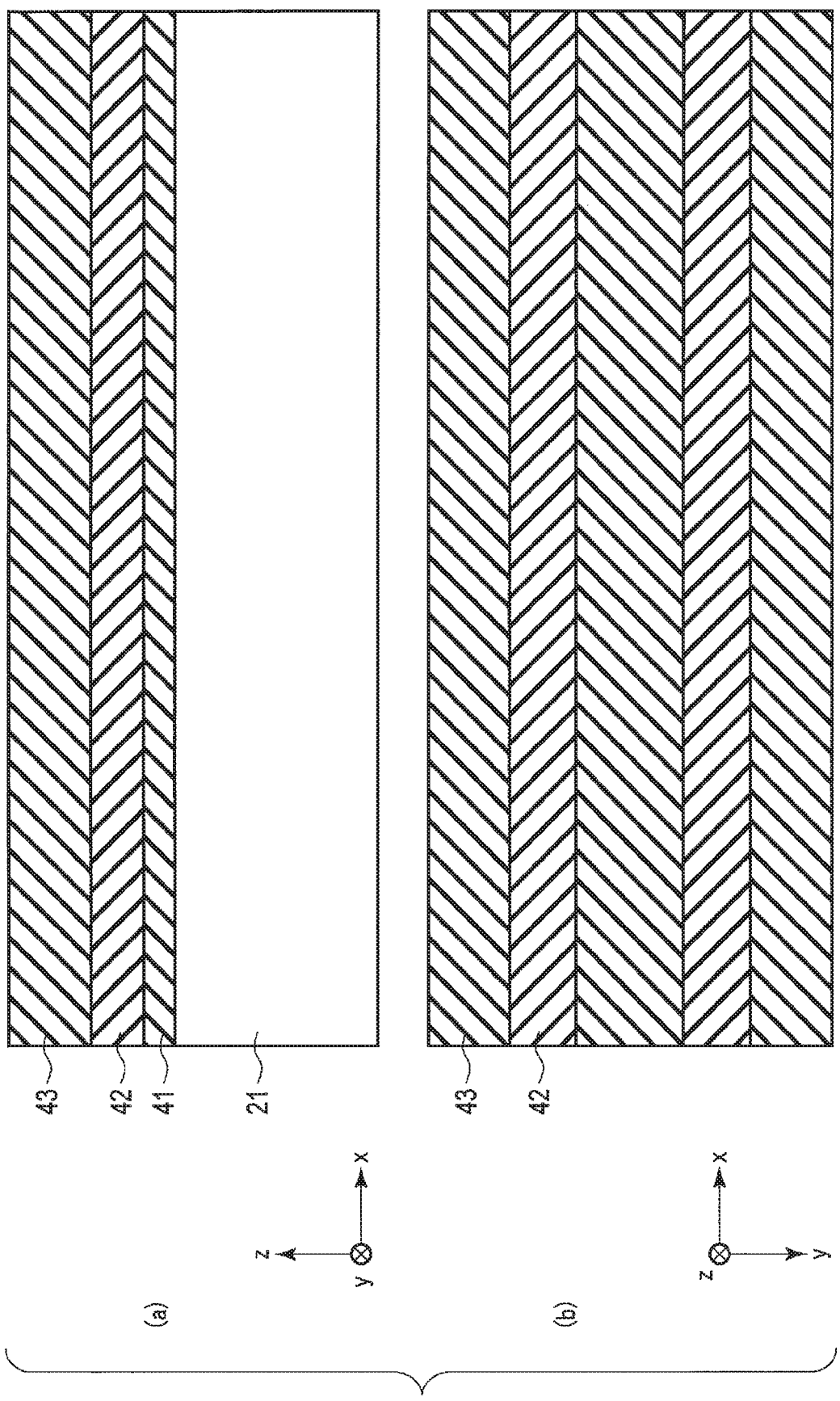
FIG. 15 is a cross-sectional view illustrating a part of a manufacturing method of the memory cell array of the magnetic storage device according to the first embodiment.

To start with, as illustrated in FIG. 15, an oxide film 41 is deposited on the entire surface of a semiconductor substrate 21, and a nitride film 42 is deposited on the top surface of the oxide film 41. The oxide film 41 is, for example, a film of silicon oxide, and the nitride film 42 is, for example, a film of silicon nitride. A film 43 is formed on the nitride film 42 by a lithography step. The film 43 includes holes in regions where a device isolation insulation film is to be formed. The film 43 includes, for example, TEOS (Tetra Ethyl Ortho Silicate).

Figure 16:
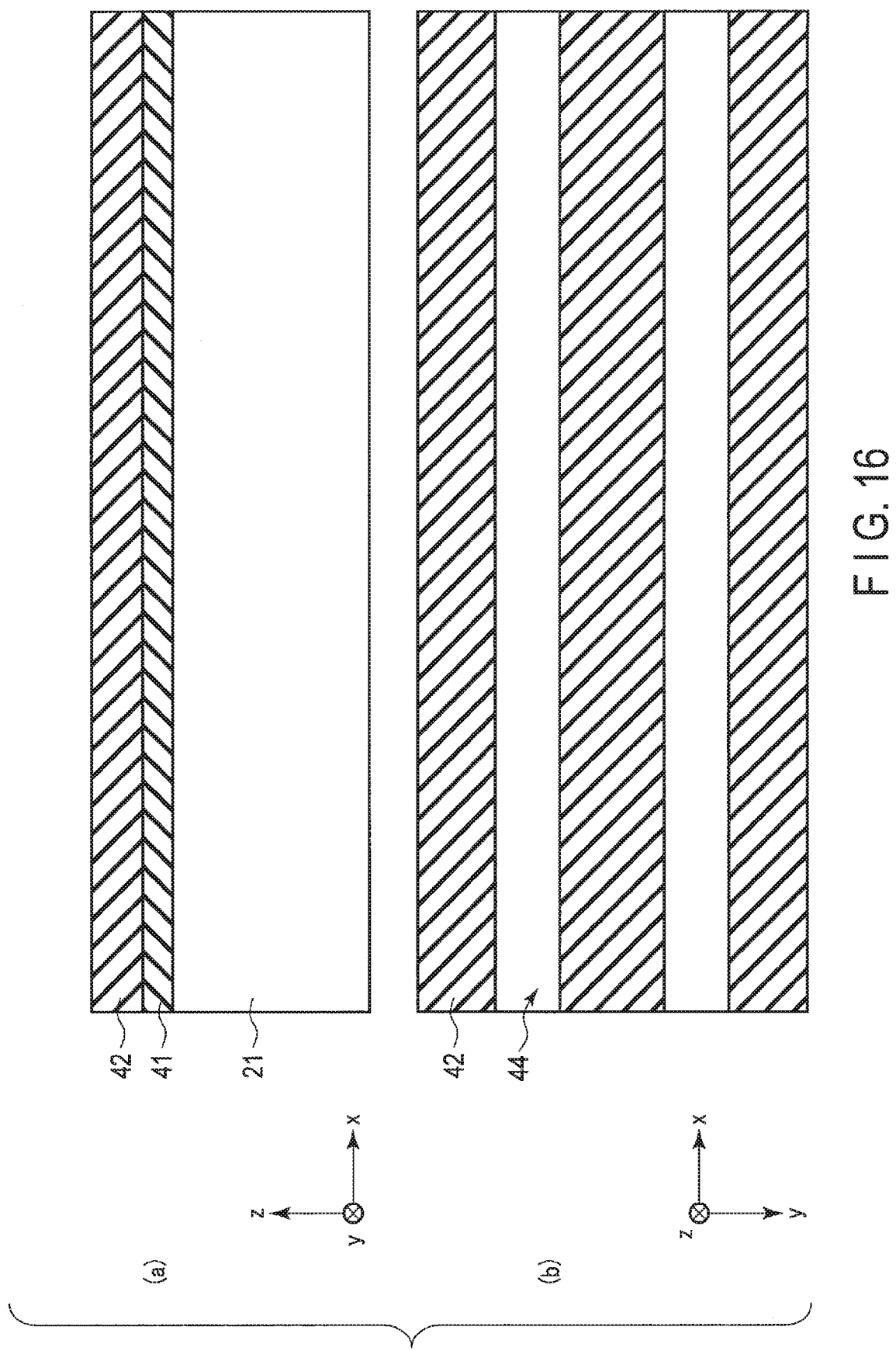
FIG. 16 is a cross-sectional view illustrating a part of a manufacturing method of the memory cell array of the magnetic storage device according to the first embodiment.

As illustrated in FIG. 16, the holes of the film 43 are transferred to the nitride film 42 and oxide film 41 by RIE (Reactive Ion Etching) in which the film 43 is used as a mask. Subsequently, trenches 44 are formed in the semiconductor substrate 21 by RIE which the nitride film 42 and oxide film 41 are used as a mask. The trench 44 has a shape corresponding to the shape of the hole of the film 43 in the xy plane, and extends in the x direction.

Figure 17:
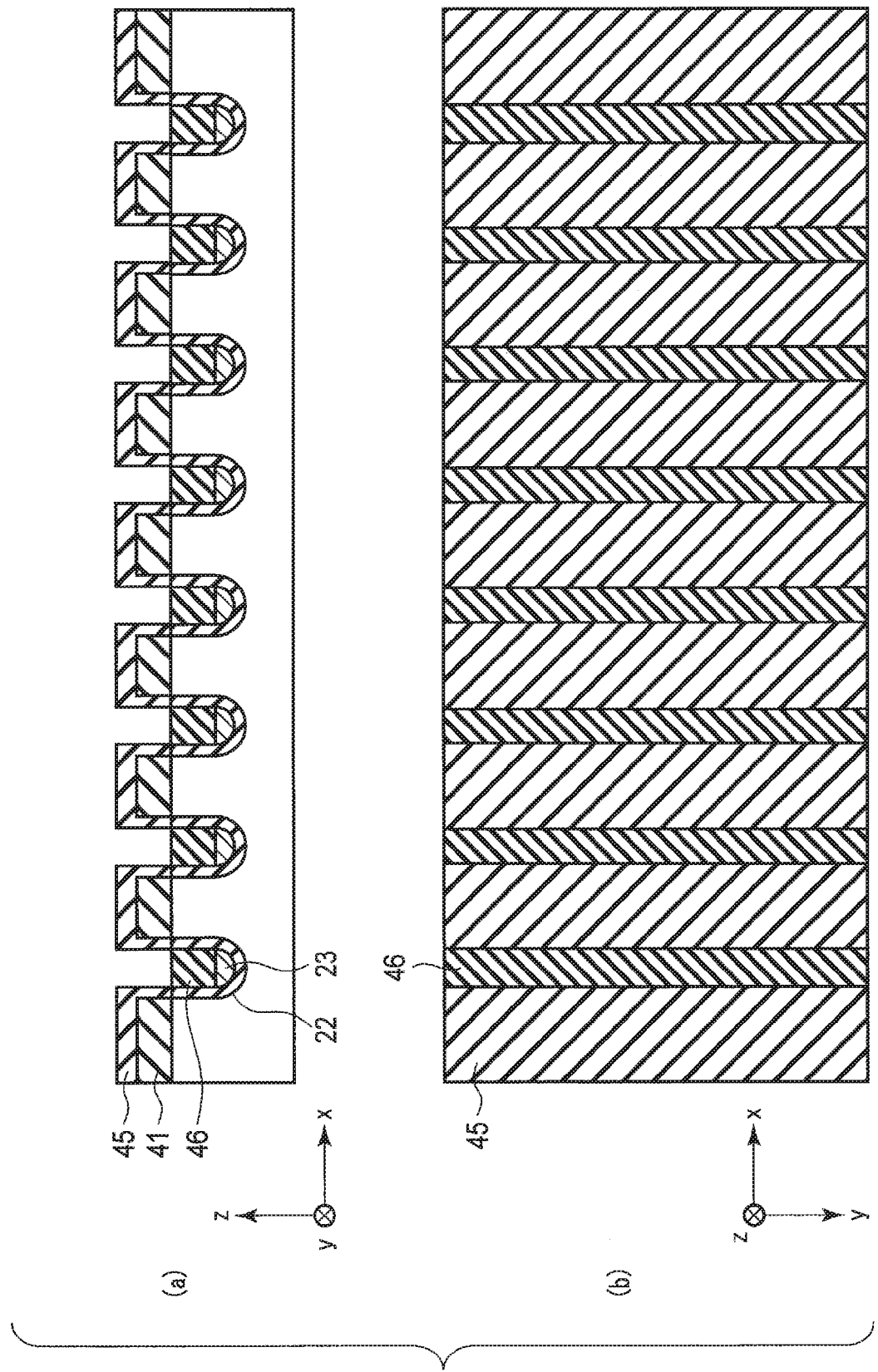
FIG. 17 is a cross-sectional view illustrating a part of the manufacturing method of the memory cell array of the magnetic storage device according to the first embodiment.

As illustrated in FIG. 17, an insulation film is deposited on the surface of the trench 44. The insulation film fills the trench 44 and becomes a device isolation insulation film.

Subsequently, the nitride film 42 is removed, and a mask 45 is formed on the oxide film 41. The mask 45 includes holes in regions where word lines WL are to be formed. A trench is formed in that region of the semiconductor substrate 21 and device isolation insulation film, where the word line WL is to be formed. Then, an insulation film 22 is formed on the surface of the trench, a conductive film 23 (WL) is formed on the insulation film 22, and the word line WL is obtained. The top surface of the conductive film 23 is covered with an insulation film 46. The conductive film 23 functions as a gate electrode of a transistor.

Figure 18:
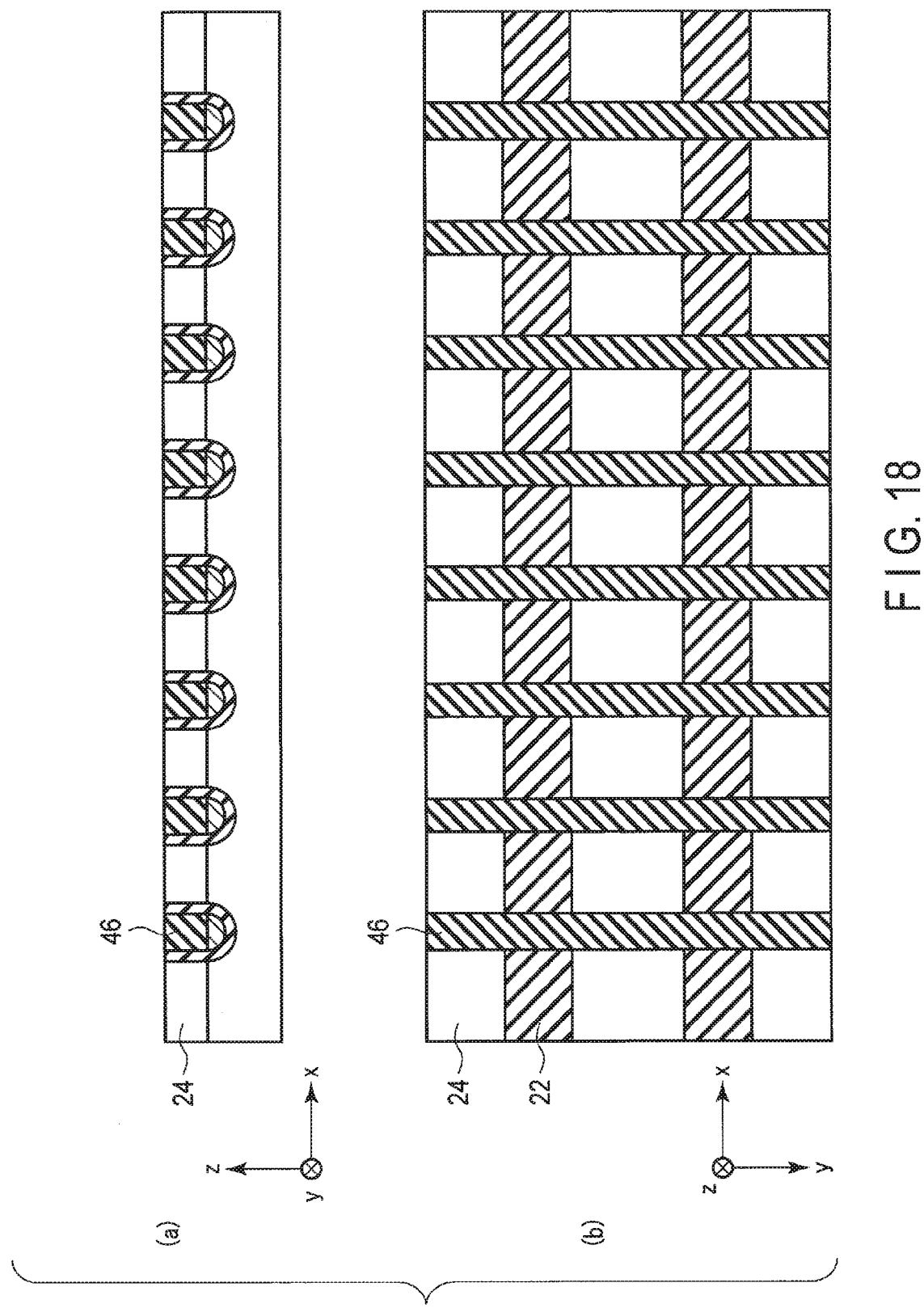
FIG. 18 is a cross-sectional view illustrating a part of the manufacturing method of the memory cell array of the magnetic storage device according to the first embodiment.

As illustrated in FIG. 18, the mask 45 and oxide film 41 are removed, and ion implantation for forming a diffused region 24 is performed on the semiconductor substrate 21. Thereby, transistors SGTr, SSTr and SDTr of a buried gate electrode type are formed on the semiconductor substrate 21.

Figure 19:
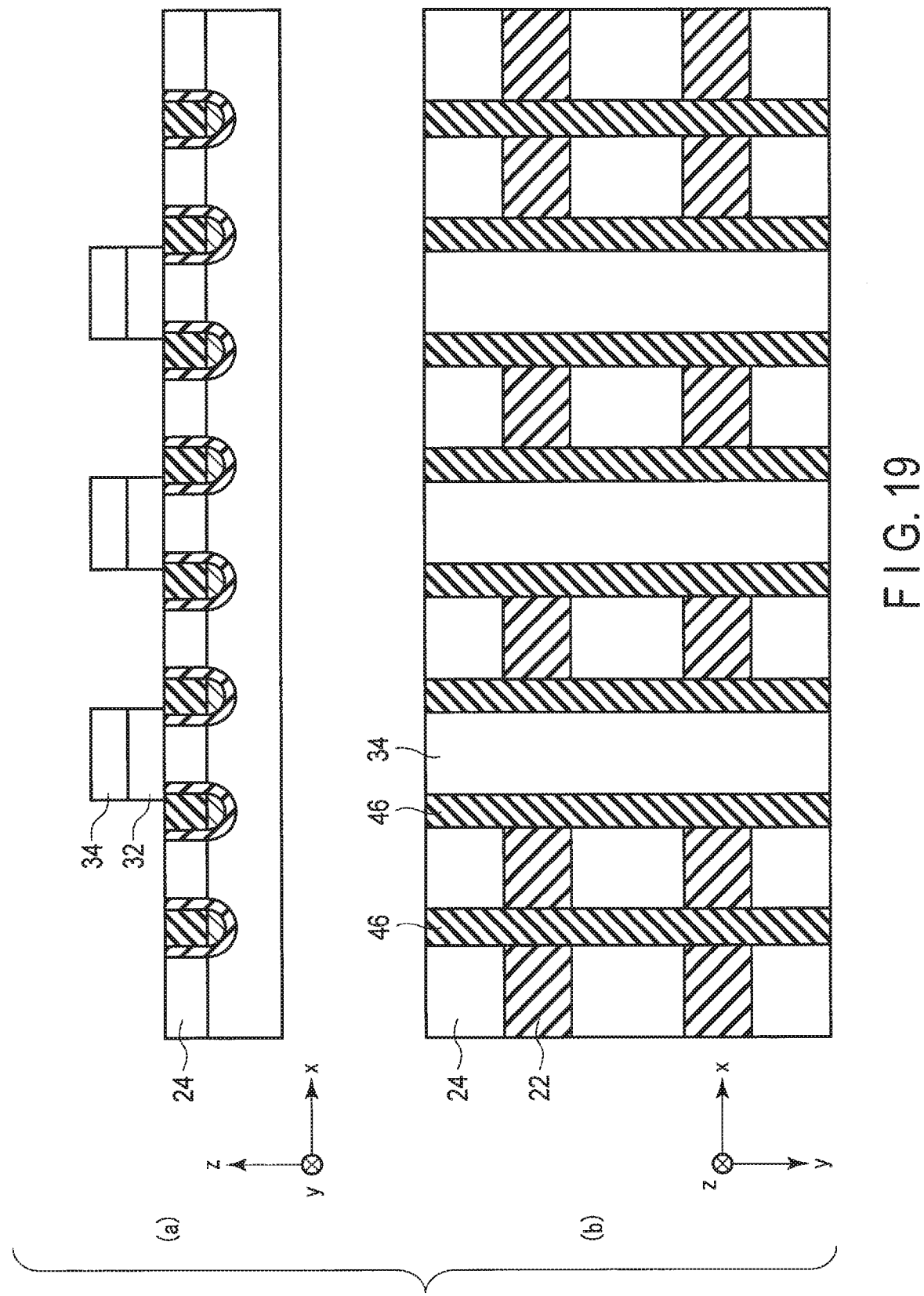
FIG. 19 is a cross-sectional view illustrating a part of the manufacturing method of the memory cell array of the magnetic storage device according to the first embodiment.

As illustrated in FIG. 19, a magnetic film (reference layer) 32 is deposited on the entire surface of the structure which has been obtained through the above fabrication steps. Subsequently, a film 34 is formed on the magnetic film 32 by a lithography step. The film 34 is deposited on regions where reference layers RL are to be formed. Both end faces in the x direction of each of the regions, where the reference layers RL are to be formed, are disposed on the top surfaces of the insulation films 46 which neighbor in the x direction. The magnetic film 32, excluding its parts in the regions where the reference layers RL are to be formed, is removed by RIE using the films 34 as a mask.

Figure 20:
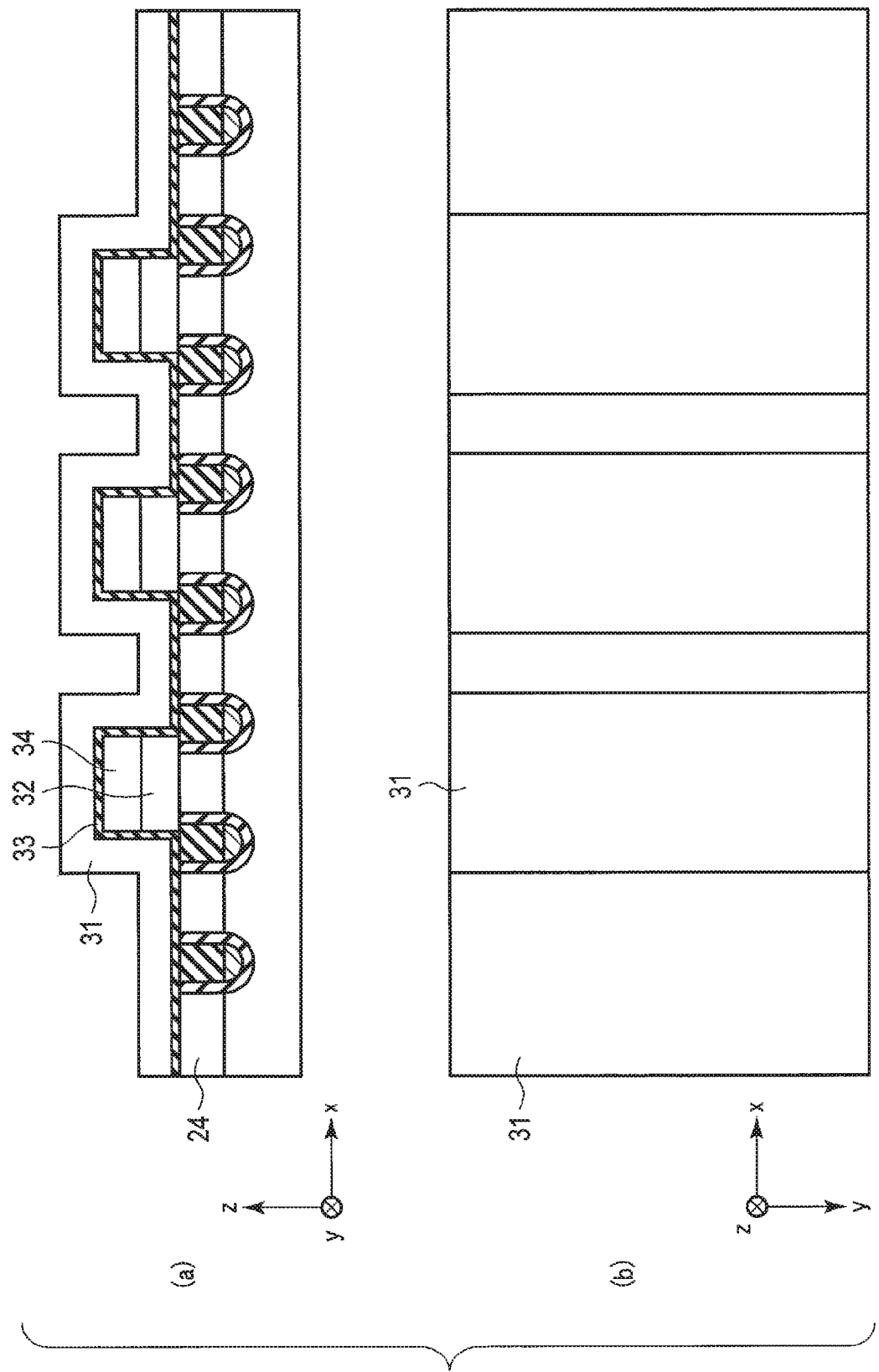
FIG. 20 is a cross-sectional view illustrating a part of the manufacturing method of the memory cell array of the magnetic storage device according to the first embodiment.

As illustrated in FIG. 20, a nonmagnetic film (tunnel barrier layer) 33 and a magnetic film (storage layer) 31 are deposited by, for example, CVD (Chemical Vapor Deposition), on the entire surface of the structure obtained through the above steps.

Figure 21:
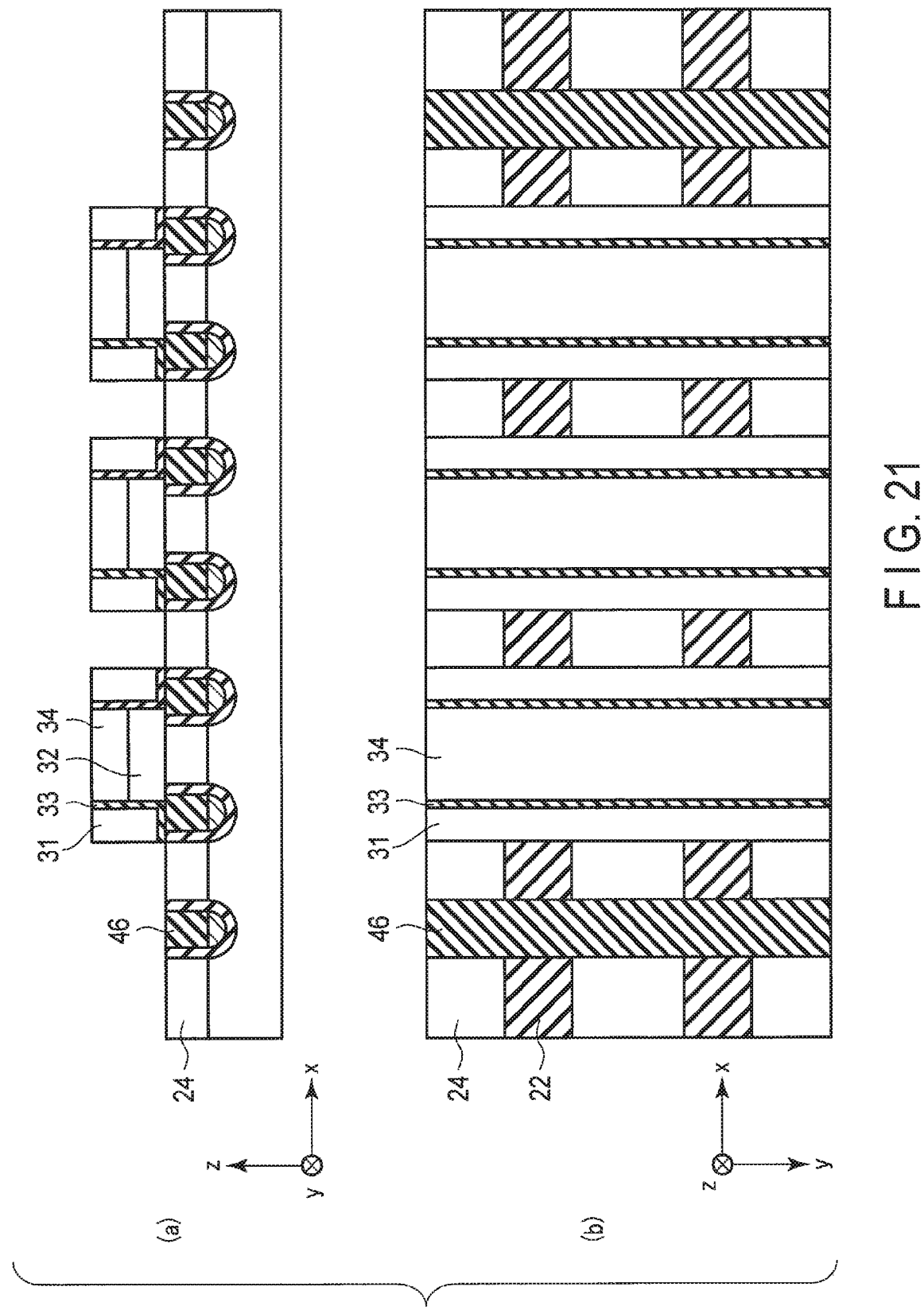
FIG. 21 is a cross-sectional view illustrating a part of the manufacturing method of the memory cell array of the magnetic storage device according to the first embodiment.

As illustrated in FIG. 21, the deposited magnetic film 31 and nonmagnetic film 33 are removed by etching with an anisotropy in a direction perpendicular to the semiconductor substrate 21. Thereby, layers of the nonmagnetic film 33 and magnetic film 31 are formed along the x direction on the side walls of the magnetic film 32 and film 34. Incidentally, the nonmagnetic film 33, which is formed between the magnetic film 31 and magnetic film 32, is disposed on the top surface of the insulation film 46.

Figure 23:
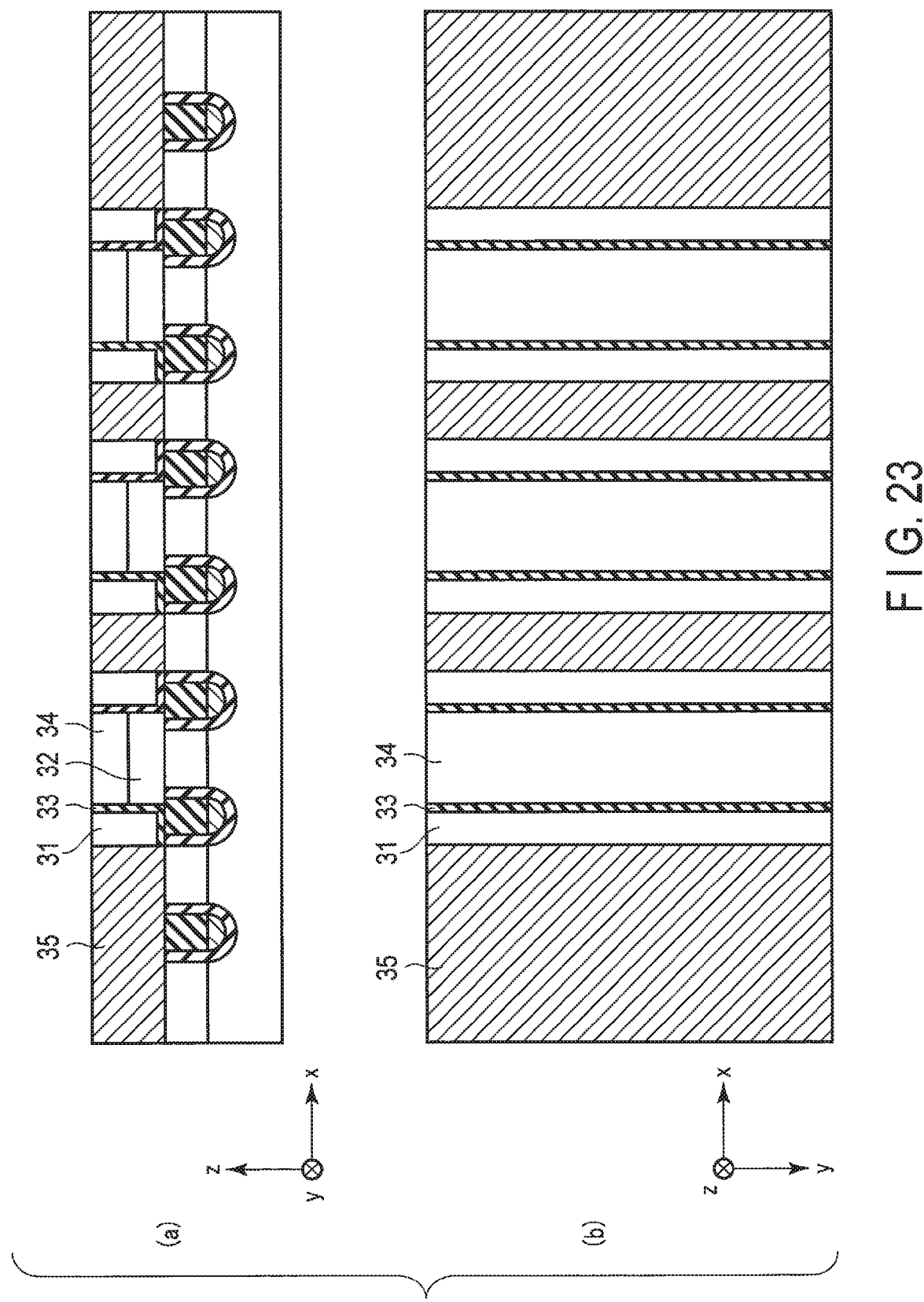
FIG. 23 is a cross-sectional view illustrating a part of the manufacturing method of the memory cell array of the magnetic storage device according to the first embodiment.

As illustrated in FIG. 22, a conductive film 35 is deposited on the entire surface of the structure obtained through the above steps. The conductive film 35 is deposited on the magnetic film 31, magnetic film 32, nonmagnetic film 33 and mask 34 such that these films are buried by the conductive film 35. Subsequently, as illustrated in FIG. 23, the conductive film 35 is polished by, for example, CMP (Chemical Mechanical Polishing), until the magnetic film 31, nonmagnetic film 33 and mask 34 are exposed.

As illustrated in FIG. 24, those parts of the conductive film 35, where contacts of the bit line BL and source line/BL are to be formed, are removed by, for example, etching by an ion beam. At the same time, those regions of the magnetic film 31, magnetic film 32, nonmagnetic film 33, mask 34 and conductive film 35, where the device isolation insulation films were formed, are removed. Thereby, the conductive film 35 functions as a current path between the magnetic film 31 and diffused region 24. In addition, the magnetic film 31, magnetic film 32 and nonmagnetic film 33 function as a plurality of magnetoresistive effect elements 28 which are connected in series in the x direction. In the meantime, each magnetoresistive effect element 28 is connected in parallel to a select transistor SGTr of a buried gate type.

Figure 25:
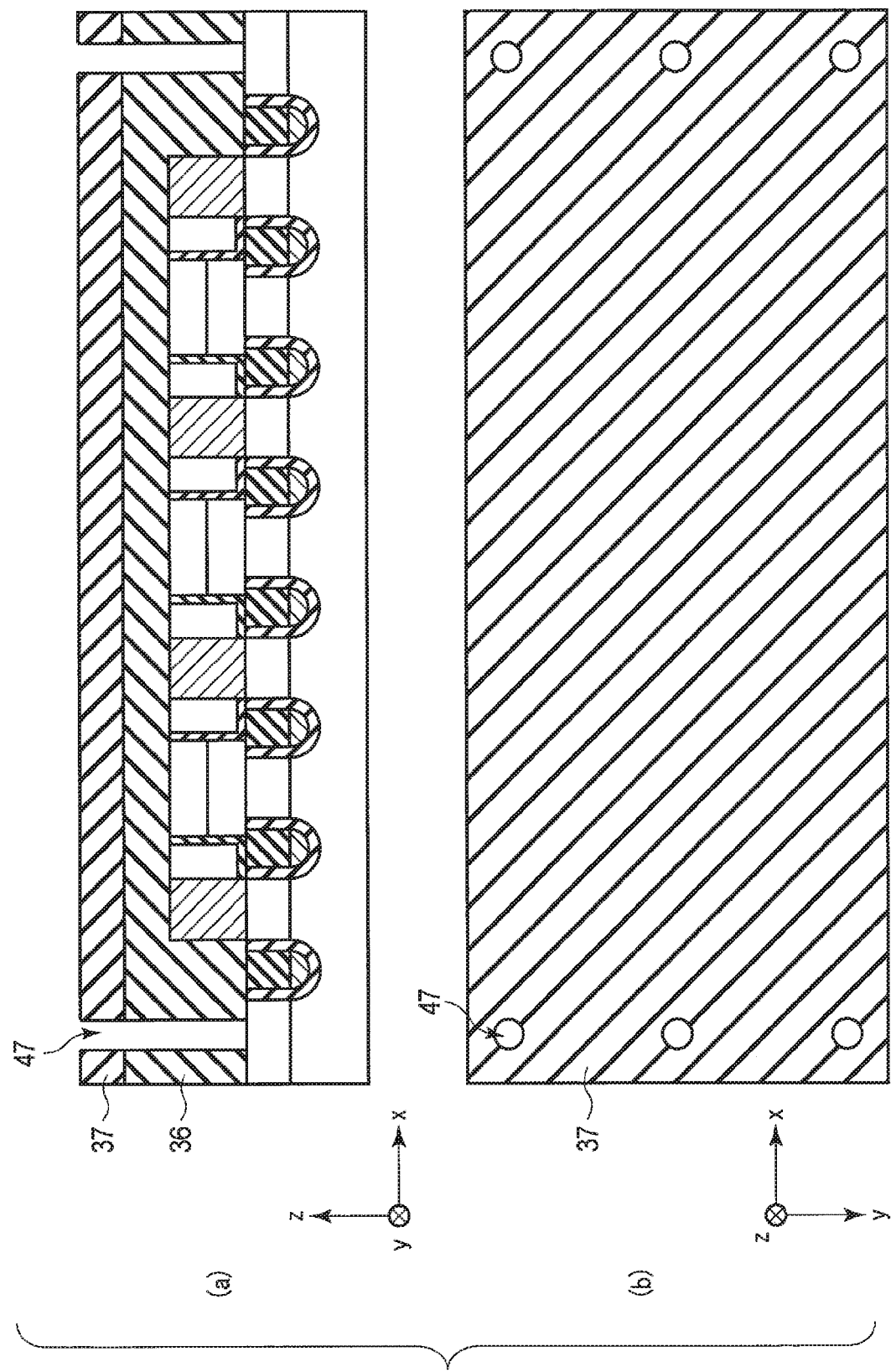
FIG. 25 is a cross-sectional view illustrating a part of the manufacturing method of the memory cell array of the magnetic storage device according to the first embodiment.

As illustrated in FIG. 25, an interlayer insulation film 36 is deposited on the entire surface of the structure obtained through the above steps. The magnetoresistive effect elements 28 are buried by the interlayer insulation film 36. The interlayer insulation film 36 is polished and planarized by, for example, CMP. Subsequently, a magnetic film 37 is deposited on the top surface of the interlayer insulation film 36. The magnetic film 37 also has an insulation property. Those regions of the magnetic film 37 and interlayer insulation film 36, where a source-line contact 38 and a bit-line contact 38 are to be formed, are removed by, for example, etching by RIE, and trenches 47 are formed. The diffused region 24 on the surface of the semiconductor substrate 21 is exposed by the etching at the bottom of the trench 47.

Figure 26:
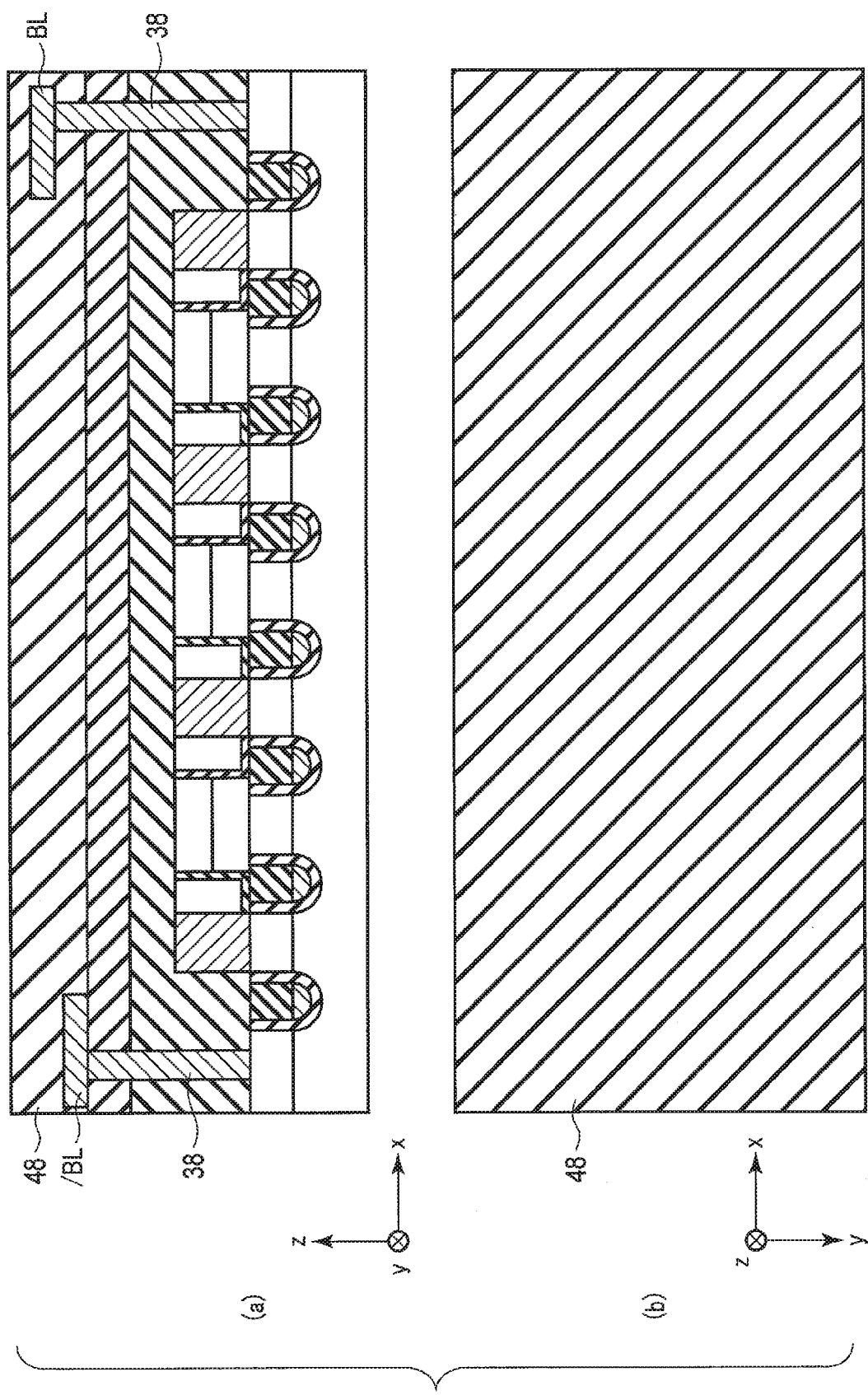
FIG. 26 is a cross-sectional view illustrating a part of the manufacturing method of the memory cell array of the magnetic storage device according to the first embodiment.

As illustrated in FIG. 26, conductive films (source-line contact and bit-line contact) 38 are deposited in the trenches 47. Subsequently, conductive films, which function as the bit line BL and source line/BL, and an insulation film 48 are formed, and the structure of the magnetic storage device 1 is obtained.

1.4. Advantageous Effects of the Present Embodiment

A conventional magnetic storage device has a lower integration level than, for example, a NAND flash memory. For instance, the integration level of the magnetic storage device is substantially equal to the integration level of a DRAM (Dynamic Random Access Memory). By contrast, in the first embodiment, a magnetic storage device having a higher integration level is provided, and thereby the above problem is solved.

According to the first embodiment, the magnetic storage device 1 includes the semiconductor substrate 21 as a semiconductor region including a trench portion; the gate electrode 23 provided in the trench portion; and the insulation film 22, 46 covering the gate electrode 23 and provided in the trench portion; and the magnetoresistive effect element 28 including at least the reference layer 32, storage layer 31 and tunnel barrier layer 33 provided between the reference layer 32 and storage layer 31, the tunnel barrier layer 33 in a side surface including the tunnel barrier layer 33 being provided on the top surface of the insulation film 22, 46. Thereby, data write and data read can be executed without connecting the bit line BL and source line/BL to each of the memory cells MC. If a supplementary description is given, the plural memory cells MC are connected in series, and both ends thereof are connected to the bit line BL and source line/BL via the drain-side select gate transistor SDTr and source-side select gate transistor SSTr. In addition, in each memory cell MC, the select transistor SGTr and magnetoresistive effect element 28 are connected in parallel. Thereby, the cell string STR can be accessed by selecting the drain-side select gate transistor SDTr and source-side select gate transistor SSTr. In addition, an arbitrary memory cell MCi in the cell string STR can be accessed by turning off the select transistor SGTr of the selected memory cell MCi and turning on the select transistor SGTr($\neq$i) of the non-selected memory cell MC($\neq$i). Therefore, a magnetic storage device with a higher integration level can be provided.

Furthermore, according to a first mode of the first embodiment, in addition to the first embodiment, the reference layer 32, storage layer 31 and tunnel barrier layer 33 are arranged in a direction in which the semiconductor region extends. Thus, the magnetoresistive effect element 28 and the select transistor SGTr, which is provided in the semiconductor substrate 21, can be connected in parallel. Therefore, a magnetic storage device with a high integration level can be manufactured by a less number of fabrication steps.

Furthermore, according to a second mode of the first embodiment, in addition to the first mode of the first embodiment, the reference layer 32 and tunnel barrier layer 33 are provided such that a boundary plane between the reference layer 32 and tunnel barrier layer 33 is provided in a direction crossing a surface of the semiconductor region, and the tunnel barrier layer 33 and storage layer 31 are provided such that a boundary plane between the tunnel barrier layer 33 and storage layer 31 is provided in a direction crossing the surface of the semiconductor region. Thereby, the memory cells can be more efficiently connected in parallel.

Furthermore, according to a third mode of the first embodiment, in addition to the first embodiment, the magnetoresistive effect element 28 and a second magnetoresistive effect element 28, which neighbors the magnetoresistive effect element, are provided in opposite directions. Thus, two neighboring magnetoresistive effect elements 28 can share the reference layers 32, where necessary. Therefore, a magnetic storage device with a high integration level can be manufactured by a less number of fabrication steps.

Furthermore, according to a fourth mode of the first embodiment, in addition to the third mode of the first embodiment, the magnetoresistive effect element 28 and the second magnetoresistive effect element 28 share the reference layers 32 thereof, when the reference layers 32 of the magnetoresistive effect element 28 and the second magnetoresistive effect element 28 are provided to be opposed to each other. Therefore, a magnetic storage device with a high integration level can be manufactured by a less number of fabrication steps.

Furthermore, according to a fifth mode of the first embodiment, in addition to the first embodiment, the conductive film 35, which is in contact with the storage layer 31 and the semiconductor region, is further included. Thus, a current path between the storage layer 31 and semiconductor substrate 21 can be secured even in the case where the storage layer 31 and semiconductor substrate 21 are insulated by the tunnel barrier layer 33 in the manufacturing process. Therefore, a magnetic storage device with a high integration level can be manufactured by a less number of fabrication steps.

Furthermore, according to a sixth mode of the first embodiment, in addition to the fifth mode of the first embodiment, the diffused region 24 is further included as a first region which is provided in the semiconductor region, includes impurities and is in contact with the reference layer 32, and the diffused region 24 is further included as a second region which is provided in the semiconductor region, includes impurities and is in contact with the conductive layer 35. Thus, a current path, which is selected in each memory cell MC, can be connected with a shortest distance. Therefore, a magnetic storage device with a high integration level can be manufactured by a less number of fabrication steps.

Furthermore, according to a seventh mode of the first embodiment, in addition to the fifth mode of the first embodiment, a third magnetoresistive effect element 28, which is in contact with the conductive film 35 and neighbors the magnetoresistive effect element 28, is further included. Thus, the memory cells MC, by which the reference layers 32 are not shared, can be connected in series. Therefore, a magnetic storage device with a high integration level can be manufactured by a less number of fabrication steps.

Furthermore, according to an eighth mode of the first embodiment, in addition to the first embodiment, a direction of a write current for writing identical data is opposite between the magnetoresistive effect element 28 and the second magnetoresistive effect element 28 which neighbors the magnetoresistive effect element 28. If a supplementary description is given, the controller 17 executes such control that the current direction is reversed in accordance with the position of the memory cell MC. Thus, data write can be executed with no problem, even in the case where the reference layer 32 is shared by mutually neighboring magnetoresistive effect elements 28. Therefore, a magnetic storage device with a high integration level can be manufactured by a less number of fabrication steps.

Furthermore, according to a ninth mode of the first embodiment, in addition to the first embodiment, the magnetoresistive effect element 28 and the second magnetoresistive effect element 28, which neighbors the magnetoresistive effect element 28, further include shift cancelling layers 37 provided on top surfaces of the reference layers 32, storage layers 31 and tunnel barrier layers 33, and the magnetoresistive effect element 28 and the second magnetoresistive effect element 28 share the shift cancelling layers 37 thereof. Thus, a single shift cancelling layer 37 can be shared by all magnetoresistive effect elements 28. Therefore, a magnetic storage device with a high integration level can be manufactured by a less number of fabrication steps.

2. Second Embodiment

Next, a magnetic storage device according to a second embodiment and a manufacturing method thereof are described. In the second embodiment, the multi-layer structure of the memory cell array in the first embodiment is altered without changing the function of the memory cell array. Specifically, in the memory cell in the second embodiment, the magnetoresistive effect element is buried in the semiconductor substrate. In the description below, a description of the points common to the first embodiment is omitted, and only different points will be described.

2.1. Re: Configuration of Memory Cell Array

To begin with, a three-dimensional multilayer structure of a memory cell array of a magnetic storage device according to a second embodiment is described with reference to FIG. 27 and FIG. 28. FIG. 27 is a perspective view of the memory cell array according to the second embodiment. FIG. 28 is a cross-sectional view in an xz plane of a string STR of the memory cell array 11. The memory cell array 11 shown in FIG. 28 illustrates the configuration of one cell string STR. Incidentally, FIG. 27 depicts only two memory cells MC of the memory cells MC in FIG. 28, and omits depiction of the other memory cells MC. In addition, for the purpose of easier viewing, FIG. 27 omits the depiction of partial structures such as insulation films.

The memory cell array 11, as illustrated, is provided on a semiconductor substrate 21 which is a first semiconductor region that extends in the xy plane direction. The semiconductor substrate 21 is, for example, single-crystal silicon.

The semiconductor substrate 21 includes a plurality of hole portions along the x direction. A diffused region 24, which functions as a source region or a drain region, is formed on both end sides of the hole portions in the upper surface portion of the semiconductor substrate 21. In addition, magnetoresistive effect elements 28 are disposed on bottom surfaces of the hole portions. The magnetoresistive effect element 28 includes at least a storage layer 31, a tunnel barrier layer 33 and a reference layer 32. Both ends of the magnetoresistive effect element 28 are in contact with the diffused regions 24 which are side surfaces of the hole portion. In the meantime, in the magnetoresistive effect element 28 illustrated in FIG. 28, the reference layer 32 is disposed on the bit line BL side, and the memory layer 31 is disposed on the source line/BL side. However, the disposition of the reference layer 32 and the storage layer 31 is not limited to this, and the reference layer 32 and the storage layer 31 may be disposed in reverse directions, and the directions among the elements may not be uniform.

On the top surface of the magnetoresistive effect element 28, a semiconductor film 51 functioning as a second semiconductor region is provided in the hole portion, and is disposed, for example, in a manner to fill the hole portion. The semiconductor film 51 is, for example, polycrystalline silicon, and functions as a channel region of the select transistor 27 (SGTr).

An insulation film 52 is disposed on the top surface of the semiconductor film 51. In addition, a word line 23 (WL) is disposed on the top surface of the insulation film 52. The word line 23 functions as a gate electrode of the select transistor 27. In this manner, in the semiconductor substrate 21, the memory cells 29 (MC), each of which includes two current paths, one through the semiconductor film 51 of the select transistor 27 and the other through the magnetoresistive effect element 28, are connected in series in the x direction. In addition, the source-side select gate transistor 25 (SSTr) is disposed at one end of the string STR. The drain-side select gate transistor 26 (SDTr) is disposed at the other end of the string STR.

In the meantime, like the first embodiment, the source line/BL and bit line BL are disposed so as not to interfere with each other when extending in the x direction. FIG. 27 and FIG. 28 omit depiction of a state in which the source line/BL and bit line BL extend in the x-direction, and this omission similarly applies to the description and drawings hereinafter.

2.2. Re: Write Operation

Figure 30:
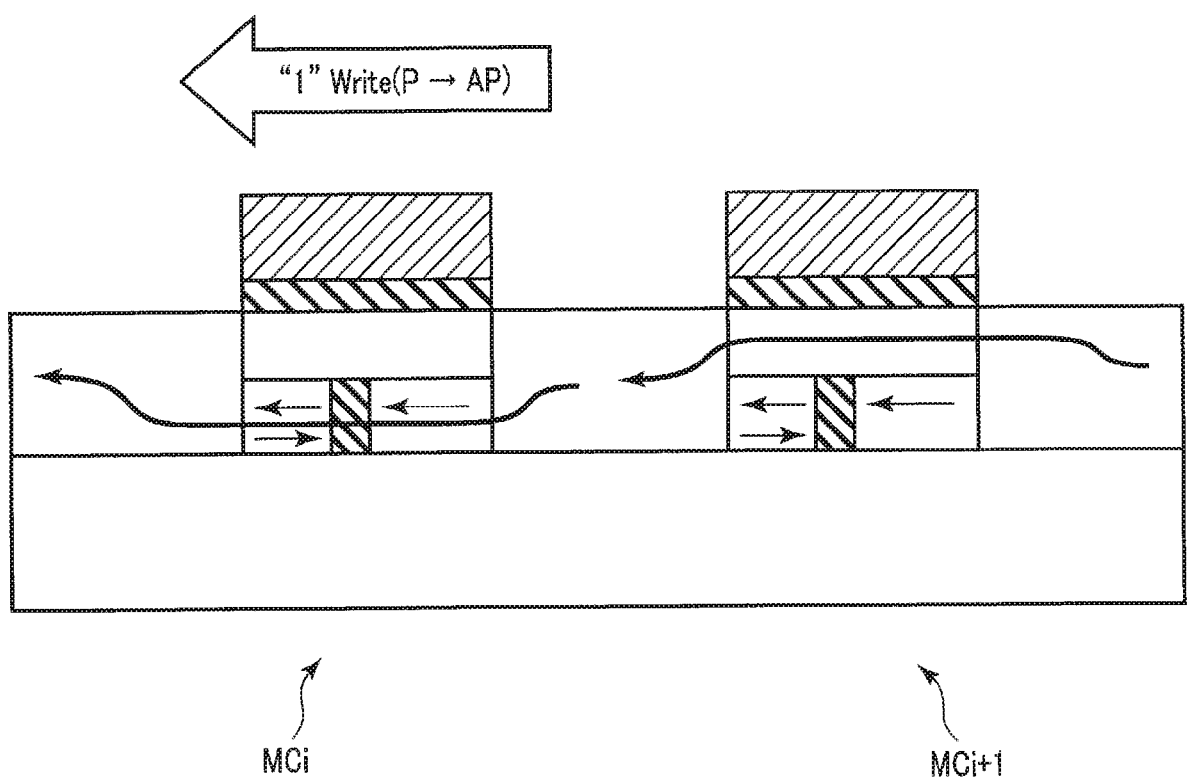
FIG. 30 is a schematic view illustrating a current path at a write time of the magnetic storage device according to the second embodiment.
Figure 31:
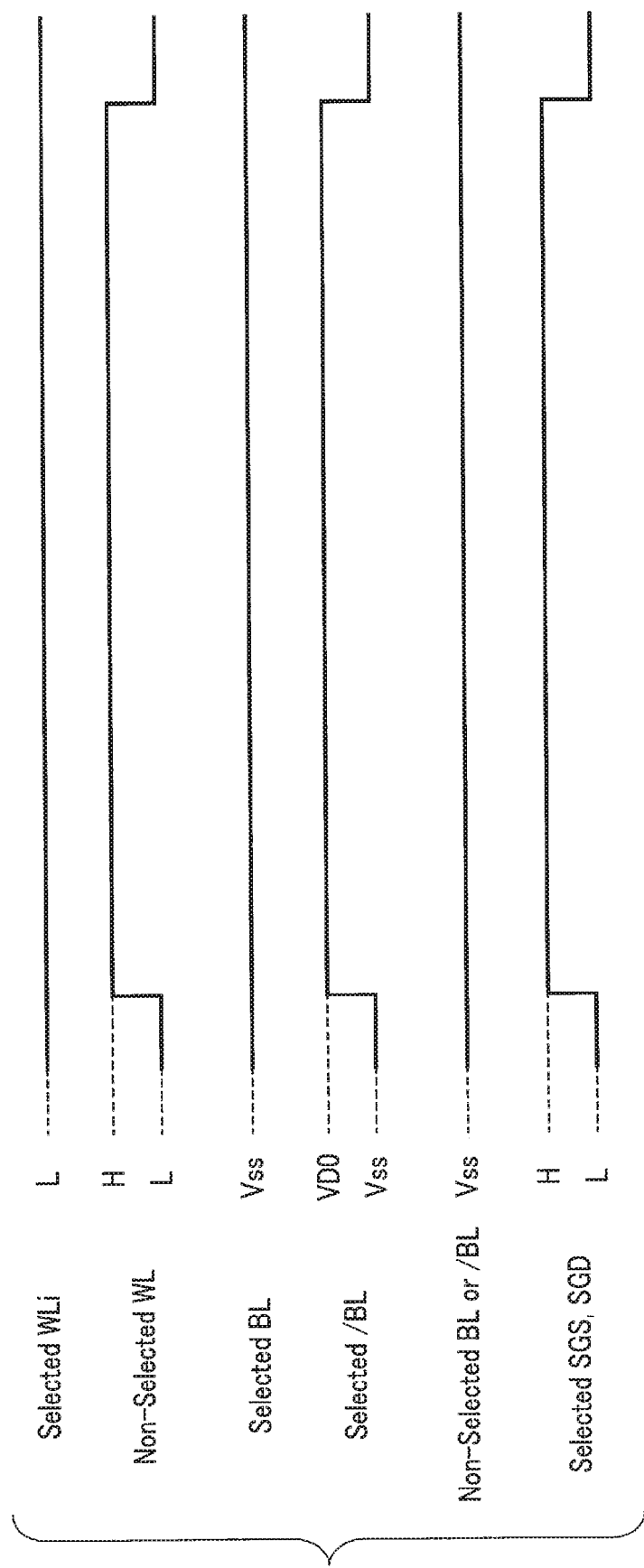
FIG. 31 is a waveform diagram at a write time of the magnetic storage device according to the second embodiment.
Figure 32:
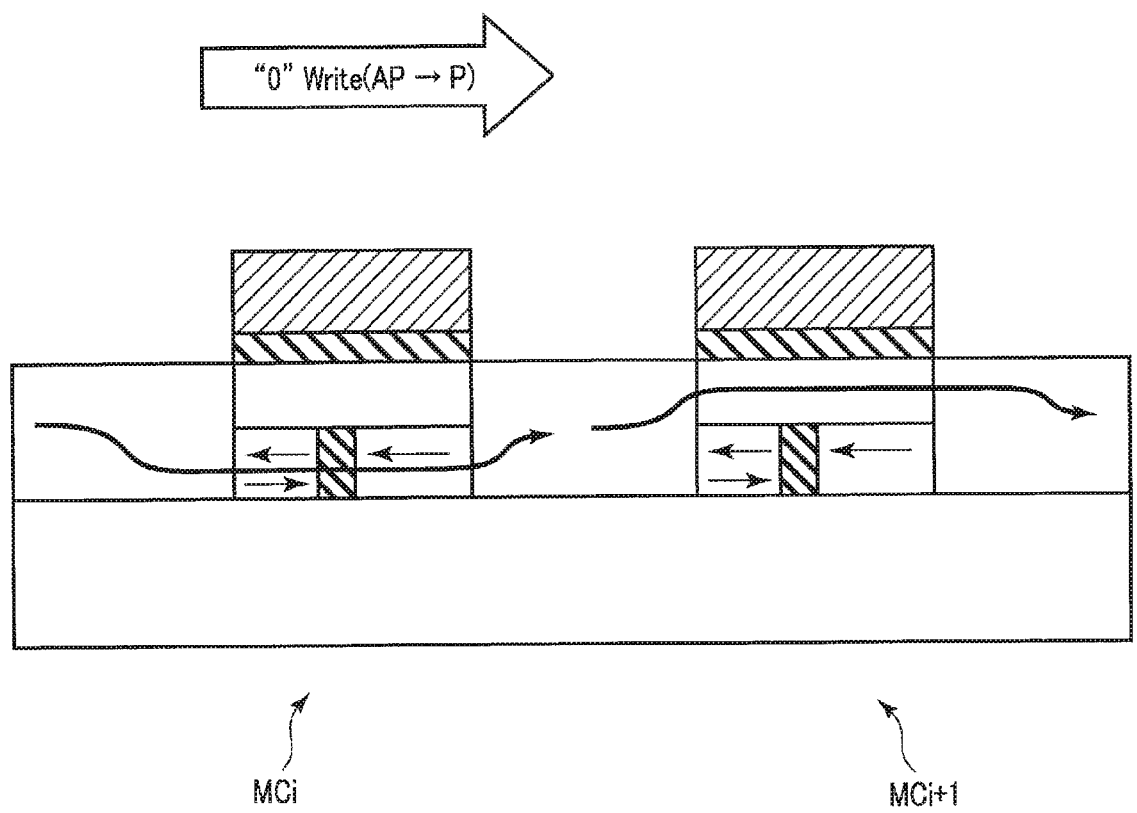
FIG. 32 is a schematic view illustrating a current path at a write time of the magnetic storage device according to the second embodiment.

Next, a write operation of the magnetic storage device according to the second embodiment is described with reference to FIG. 29 to FIG. 32. FIG. 29 and FIG. 31 are waveform diagrams for describing an operation at a write time of the magnetic storage device 1 according to the second embodiment. FIG. 30 and FIG. 32 are schematic views for describing current paths at the write time of the magnetic storage device 1 according to the second embodiment. To begin with, referring to FIG. 29 and FIG. 30, a description is given of a case of writing data "1" to a memory cell MCi in the string STR. Number "i" is an arbitrary integer of 0 or more, and n or less.

To start with, if the input/output circuit 16 receives a write command which instructs data write, the input/output circuit 16 transfers a write signal which instructs data write and write-destination addresses to the controller 17. In addition, the input/output circuit 16 transmits data "1", which is to be written, to the page buffer 15. The controller 17 transfers, of the write-destination addresses, a row address to the row decoder 14 and a column address to the SA/WD 13.

The row decoder 14 selects a block BLK of a write target in accordance with a decoded result of the row address, and applies a voltage that is necessary for the operation of data write. Specifically, the row decoder 14 selects a source-side select gate line SGSL which corresponds to the write-target block BLK, and sets the source-side select gate line SGSL at high potential H, thereby turning on a source-side select gate transistor SSTr. In addition, the row decoder 14 selects a drain-side select gate line SGDL which corresponds to the write-target block BLK, and sets the drain-side select gate line SGDL at high potential H, thereby turning on a drain-side select gate transistor SDTr. Subsequently, the row decoder 14 selects a word line WLi which is connected to a memory cell MCi of a write target in the selected block BLK. Specifically, the row decoder 14 sets the selected word line WLi at low potential L and turns off the connected select transistor SGTri, and the row decoder 14 sets a non-selected word line WL ($\neq$i) at high potential H and turns on the connected select transistor SGTr($\neq$i).

The SA/WD 13 selects a string STR of a column of the write target in accordance with a decoded result of the column address, and writes, based on the write signal, the data, which is stored in the page buffer 15, to the selected memory cell MC. Specifically, the SA/WD 13 selects a bit line BL and a source line/BL which are connected to the string STR of the write-target memory cell MCi, and applies voltages which are necessary for the data write operation. The SA/WD 13 sets the selected bit line BL at potential VD1, and the selected source line/BL at ground potential Vss. In the meantime, non-selected bit line BL and source line/BL are set at ground potential Vss.

Thereby, the selected string STR, an electric current flows from the bit line BL toward the source line/BL. The select transistor SGTr($\neq$i) in the non-selected memory cell MC($\neq$i), among the memory cells MC of the selected string STR, is turned on. Thus, the resistance value of the non-selected select transistor SGTr is smaller than the resistance value of the magnetoresistive effect element 28. Accordingly, in the memory cell MC($\neq$i), current flows in the select transistor SGTr($\neq$i). On the other hand, in the selected memory cell MCi, the select transistor SGTri is turned off. Thus, the resistance value of the selected select transistor SGTr is greater than the resistance value of the magnetoresistive effect element 28. Accordingly, in the memory cell MCi, a predetermined current flows from the reference layer 32 side toward the storage layer 31 side of the magnetoresistive effect element 28. Thereby, data "1" is written to the magnetoresistive effect element 28 in the selected memory cell MCi.

Next, the case of writing data "0" to the memory cell MCi is described.

Since the operations of the input/output circuit 16, controller 17 and row decoder 14 are the same as in the case of writing data "1" to the memory cell MCi, a description thereof is omitted.

The SA/WD 13 selects a string STR of a column of a write target in accordance with a decoded result of the column address, and writes, based on the write signal, the data, which is stored in the page buffer 15, to the selected memory cell MC. Specifically, the SA/WD 13 selects a bit line BL and a source line/BL which are connected to the string STR of the write-target memory cell MCi, and applies voltages which are necessary for the data write operation. The SA/WD 13 sets the selected bit line BL at ground potential Vss, and sets the selected source line/BL at potential VD0. In the meantime, the non-selected bit line BL and source line/BL are set at ground potential Vss.

Thereby, in the selected string STR, an electric current flows from the source line/BL toward the bit line BL. Specifically, in the memory cell MCi, a predetermined current flows from the storage layer 31 side toward the reference layer 32 side of the magnetoresistive effect element 28. Thereby, data "0" is written to the magnetoresistive effect element 28 in the selected memory cell MCi.

2.3. Re: Manufacturing Method

Next, the manufacturing method of the magnetic storage device according to the second embodiment is described with reference to FIG. 33 to FIG. 36. FIG. 33 to FIG. 36 are cross-sectional views which schematically illustrate the memory cells in stages of manufacture of the magnetic storage device according to the second embodiment.

To start with, a device isolation insulation film is buried in a semiconductor substrate 21 which functions as a first semiconductor region, and a plurality of device formation regions are formed along the x direction.

Figure 33:
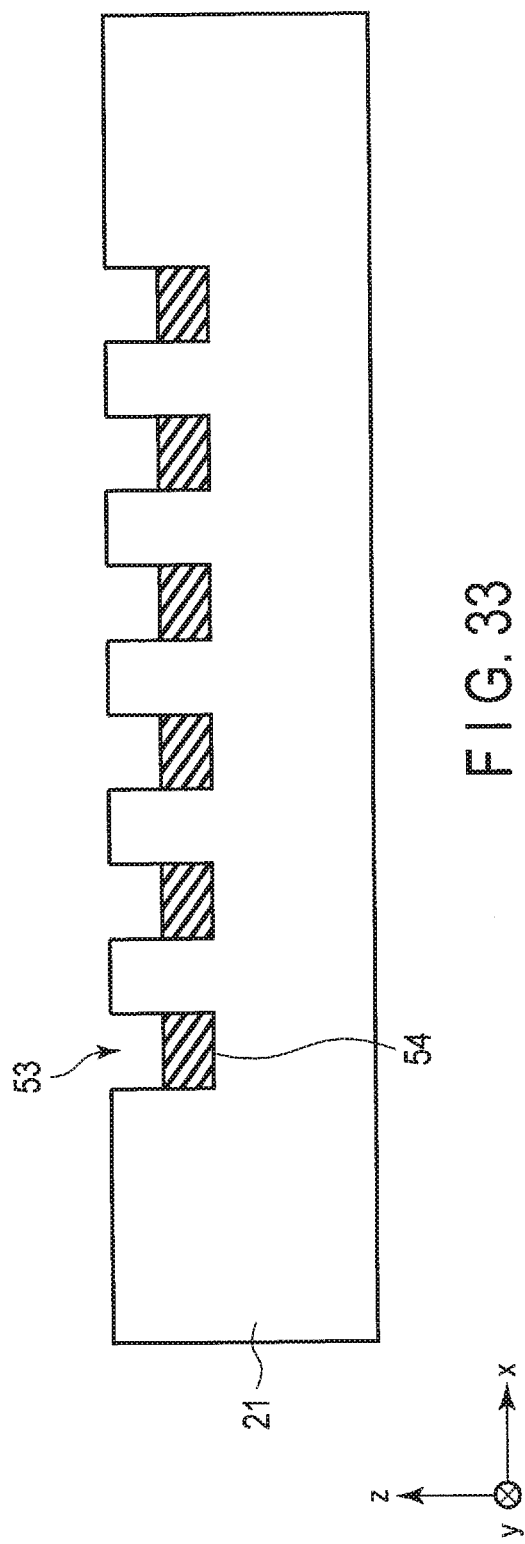
FIG. 33 is a cross-sectional view illustrating a part of a manufacturing method of the memory cell array of the magnetic storage device according to the second embodiment.

Subsequently, as illustrated in FIG. 33, hole portions 53 are formed by, for example, RIE, in regions on the surface of the semiconductor substrate 21, where magnetoresistive effect elements 28 are to be formed. A sacrificial oxide film 54 is deposited in the hole portion 53.

Figure 34:
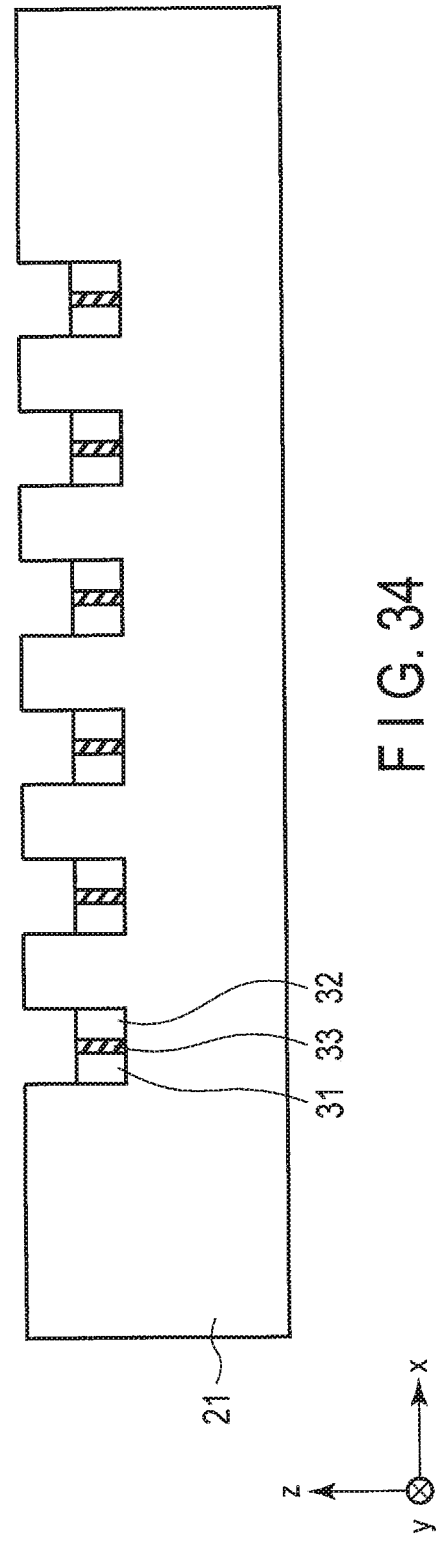
FIG. 34 is a cross-sectional view illustrating a part of the manufacturing method of the memory cell array of the magnetic storage device according to the second embodiment.

As illustrated in FIG. 34, that region of the sacrificial oxide film 54, where a storage layer FL is to be formed, is removed by, for example, RIE. A magnetic film 31 is deposited in the region where the sacrificial oxide film 54 was removed. One end of the magnetic film 31 is in contact with a side wall in the hole portion 53. Subsequently, that region of the sacrificial oxide film 54, where a tunnel barrier layer ML is to be formed, is removed by, for example, RIE. A nonmagnetic film 33 is deposited in the region where the sacrificial oxide film 54 was removed. One end of the nonmagnetic film 33 is in contact with the magnetic film 31. Then, that region of the sacrificial oxide film 54, where a reference layer RL is to be formed, is removed by, for example, RIE. A magnetic film 32 is deposited in the region where the sacrificial oxide film 54 was removed. One end of the magnetic film 32 is in contact with the nonmagnetic film 33, and the other end of the magnetic film 32 is in contact with a side wall in the hole portion 53. The magnetic film 31, nonmagnetic film 33 and magnetic film 32 function as the magnetoresistive effect element 28. To be more specific, the magnetic film 31, nonmagnetic film 33 and magnetic film 32 function as the storage layer FL, tunnel barrier layer ML and reference layer RL, respectively.

Figure 35:
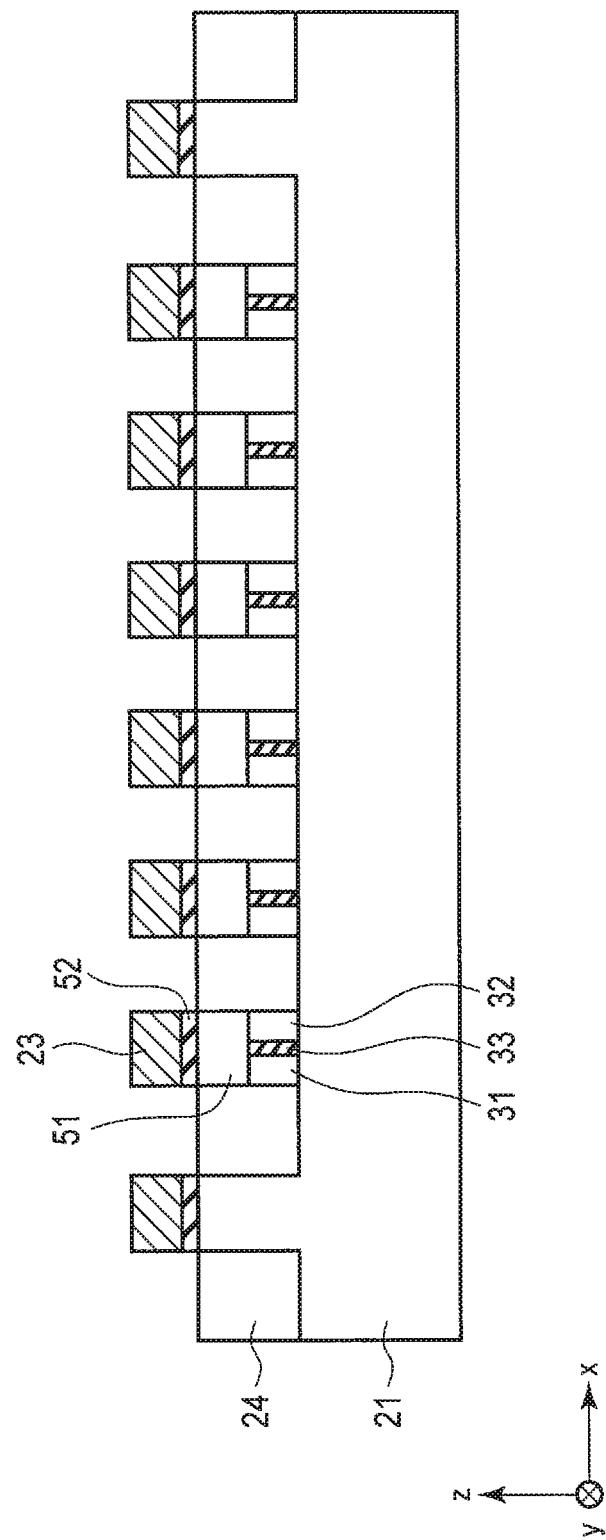
FIG. 35 is a cross-sectional view illustrating a part of the manufacturing method of the memory cell array of the magnetic storage device according to the second embodiment.

As illustrated in FIG. 35, a semiconductor film 51, which functions as a second semiconductor region, is deposited on the top surfaces of the magnetic film 31, nonmagnetic film 33 and magnetic film 32. The semiconductor film 51 is, for instance, polycrystalline silicon, and is deposited, for example, in a manner to fill the hole portion 53. The semiconductor film 51 functions as a channel region of the select transistor SGTr. Subsequently, ion implantation for forming a source or drain region of each select transistor SDTr, SSTr, SGTr is performed on the semiconductor substrate 21, and a diffused region 24 is formed. Then, an insulation film 52 and a conductive film 23 are deposited on the entire surface of the structure obtained through the above steps. The insulation film 52 and conductive film 23, excluding regions thereof where the gates of the select transistors SDTr, SSTr and SGTr are to be formed, are removed by RIE using a film (not shown) as a mask. The insulation film 52 functions as a gate insulation film. In addition, the conductive film 23 functions as a gate electrode.

Figure 36:
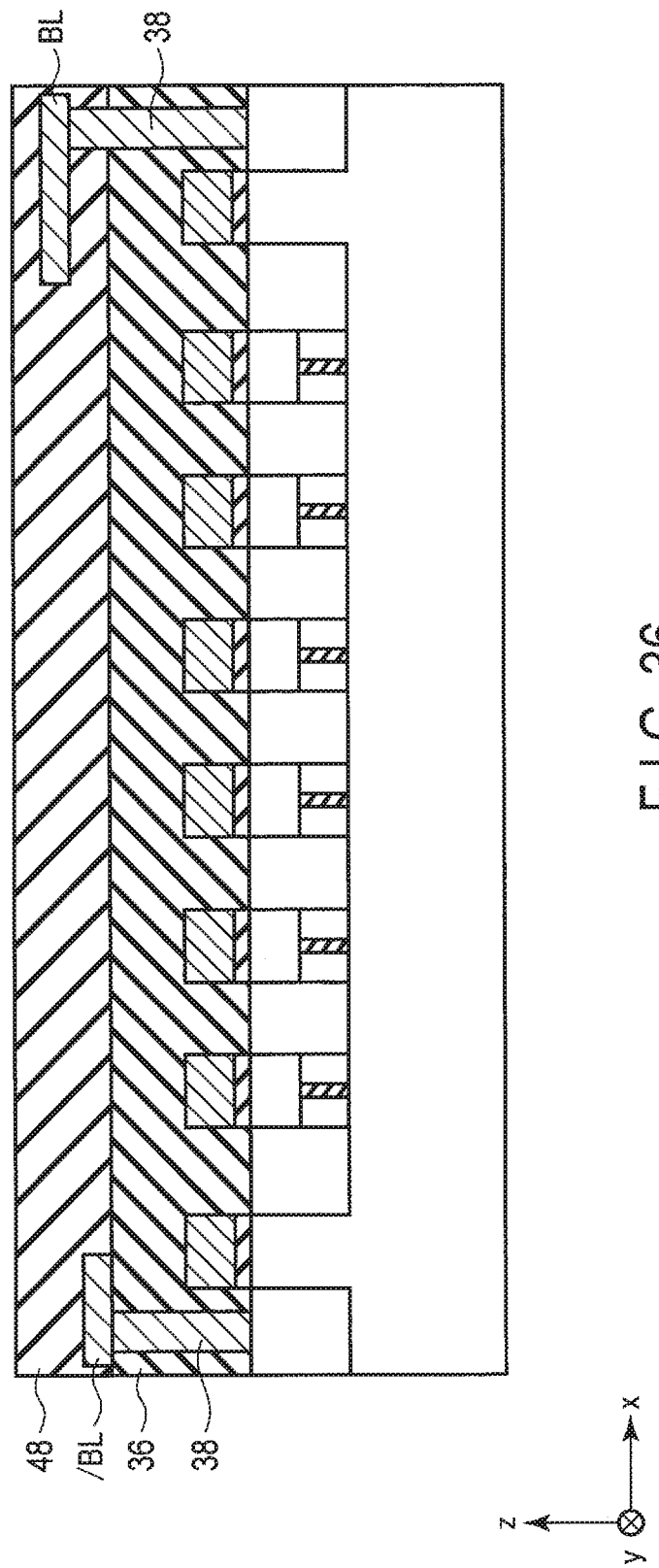
FIG. 36 is a cross-sectional view illustrating a part of the manufacturing method of the memory cell array of the magnetic storage device according to the second embodiment.

As illustrated in FIG. 36, an interlayer insulation film 36 is deposited on the entire surface of the structure obtained through the above steps. Those regions of the interlayer insulation film 36, where a source-line contact 38 and a drain-line contact 38 are to be formed, are removed by etching by, e.g. RIE, and trenches are formed. The diffused region 24 on the surface of the semiconductor substrate 21 is exposed by the etching at the bottom of the trench. Conductive films (source-line contact and bit-line contact) 38 are deposited in the trenches. Subsequently, conductive films, which function as a bit line BL and a source line/BL, and an insulation film 48 are formed, and the structure of the magnetic storage device 1 is obtained.

2.4. Advantageous Effects of the Present Embodiment

According to the second embodiment, a magnetic storage device includes the semiconductor substrate 21 as a first semiconductor region including a hole portion; the magnetoresistive effect element 28 including at least the reference layer 32, storage layer 31 and tunnel barrier layer 33 which couples the reference layer 32 and storage layer 31, a side surface including the tunnel barrier layer 33 being provided toward a bottom surface of the hole portion; the semiconductor film 51 as a second semiconductor region provided on a top surface of the magnetoresistive effect element 28; the insulation film 52 disposed on a top surface of the second semiconductor region; and the gate electrode 23 provided on a top surface of the insulation film 52. Thereby, like the first embodiment, data write and data read can be executed without connecting the bit line BL and source/BL to each of the memory cells MC. Therefore, a magnetic storage device with a higher integration level can be provided.

3. Third Embodiment

Next, a magnetic storage device according to a third embodiment and a manufacturing method thereof are described. In the third embodiment, the cell strings in the second embodiment are stacked in a direction perpendicular to the surface of the semiconductor substrate. In the description below, a description of the points common to the second embodiment is omitted, and only different points will be described.

3.1. Re: Configuration

3.1.1. Re: Configuration of Magnetic Storage Device

To begin with, the configuration of the magnetic storage device according to the third embodiment is described with reference to FIG. 37. FIG. 37 is a block diagram illustrating the configuration of the magnetic storage device according to the third embodiment. The magnetic storage device according to the third embodiment, as illustrated, includes the same configuration as the magnetic storage devices according to the first embodiment and second embodiment.

The memory cell array 11 includes a plurality of blocks BLK (BLK0, BLK1, BLK2, ... ). Each block BLK includes a plurality of string units SU (SU0, SU1, ... ). Each string unit SU includes a plurality of cell strings STR (STR0, STR1, ... ). Each cell string STR includes a plurality of memory cells MC (not shown). In addition, the memory cell array 11 includes elements such as a word line WL, a bit line BL, and a source line/BL.

3.1.2 Re: Configuration of Memory Cell Array

Figure 38:
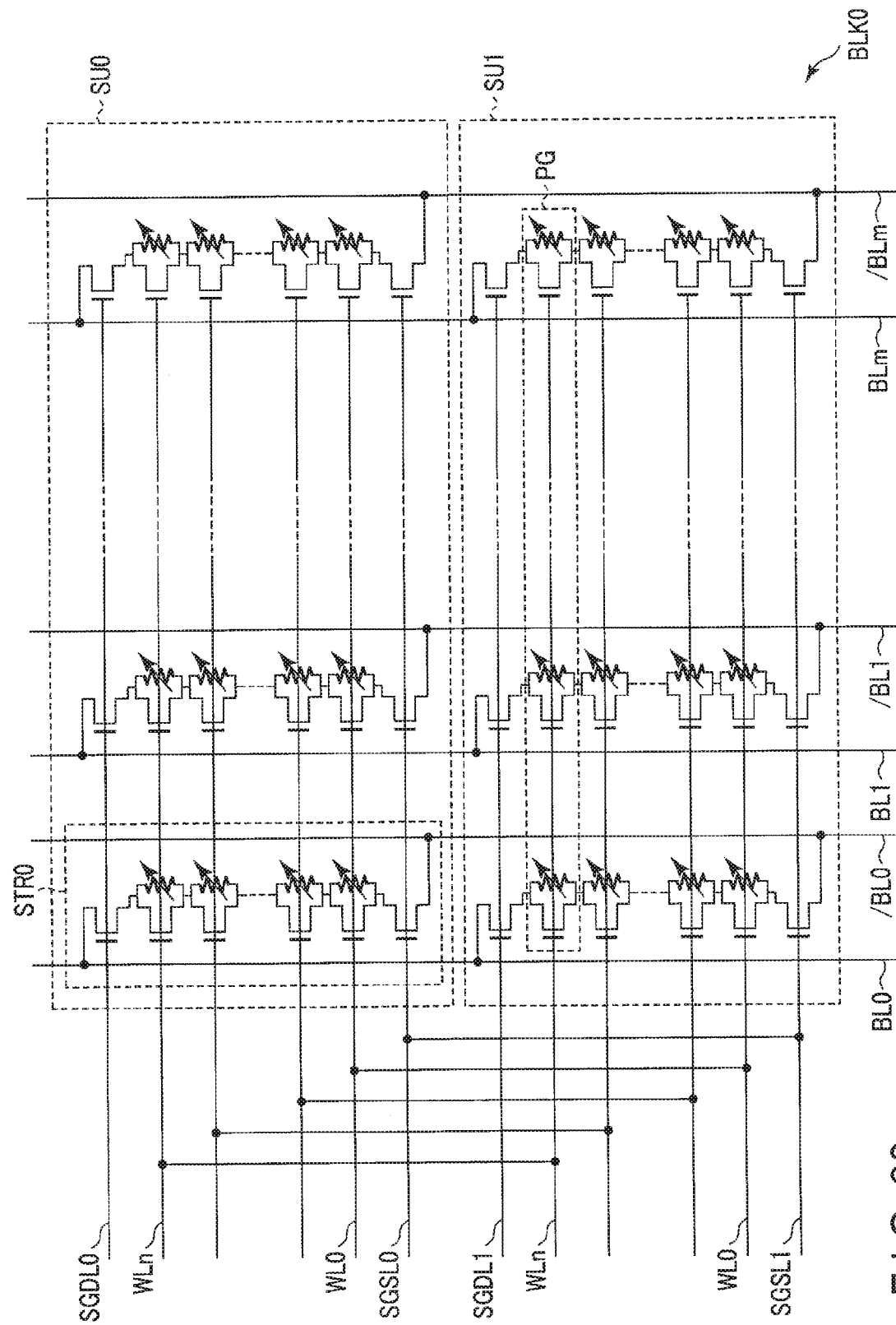
FIG. 38 is a circuit diagram illustrating a configuration of a memory cell array of the magnetic storage device according to the third embodiment.

Next, the configuration of the memory cell array according to the third embodiment is described. FIG. 38 is a circuit diagram of a part (one block BLK) of the memory cell array according to the third embodiment. As described above, the memory cell array 11 includes plural blocks BLK, and each block BLK includes plural string units SU. Incidentally, although FIG. 38 illustrates two string units SU0 and SU1 by way of example, the number of string units SU in each block BLK is not limited to two, and each block BLK may be composed of an arbitrary number of string units SU. Each string unit SU includes an (m+1) number of cell strings STR. Each cell string STR includes an (n+1) number of memory cells MC, and each memory cell MC includes a select transistor SGTr and a magnetoresistive effect element MTJ, which constitute a pair. In addition, the memory cell array 11 includes a plurality of word lines WL, a plurality of bit lines BL, and a plurality of source lines/BL. In each block BLK, one cell string STR in each string unit SU is commonly connected between a pair of a bit line BL and a source line/BL. Here, each of m and n is an integer of 0 or more.

In each string unit SU, the gates of source-side select gate transistors SSTr of the respective cell strings STR in the string unit SU are commonly connected to a source-side select gate line SGSL. The string units SU0 and SU1 are provided with source-side select gate lines SGSL0 and SGSL1, respectively. In addition, the source-side select gate lines SGSL0 and SGSL1 in the respective string units SU in the block BLK are commonly connected.

In each string unit SU, the gates of drain-side select gate transistors SDTr of the respective cell strings STR in the string unit SU are commonly connected to a drain-side select gate line SGDL. The string units SU0 and SU1 are provided with drain-side select gate lines SGDL0 and SGDL1, respectively.

An (m+1) number of memory cells MC, which are arranged in a direction of extension of the word line WL, are called a page PG. For example, one string unit SU includes an (n+1) number of pages PG. In each page PG, the gates of the respective memory cells MCi (i is an integer of 0 or more, and n or less) in the page PG are commonly connected to a word line WLi. In addition, word lines WLi in the respective string units SU in the block BLK are commonly connected.

Figure 39:
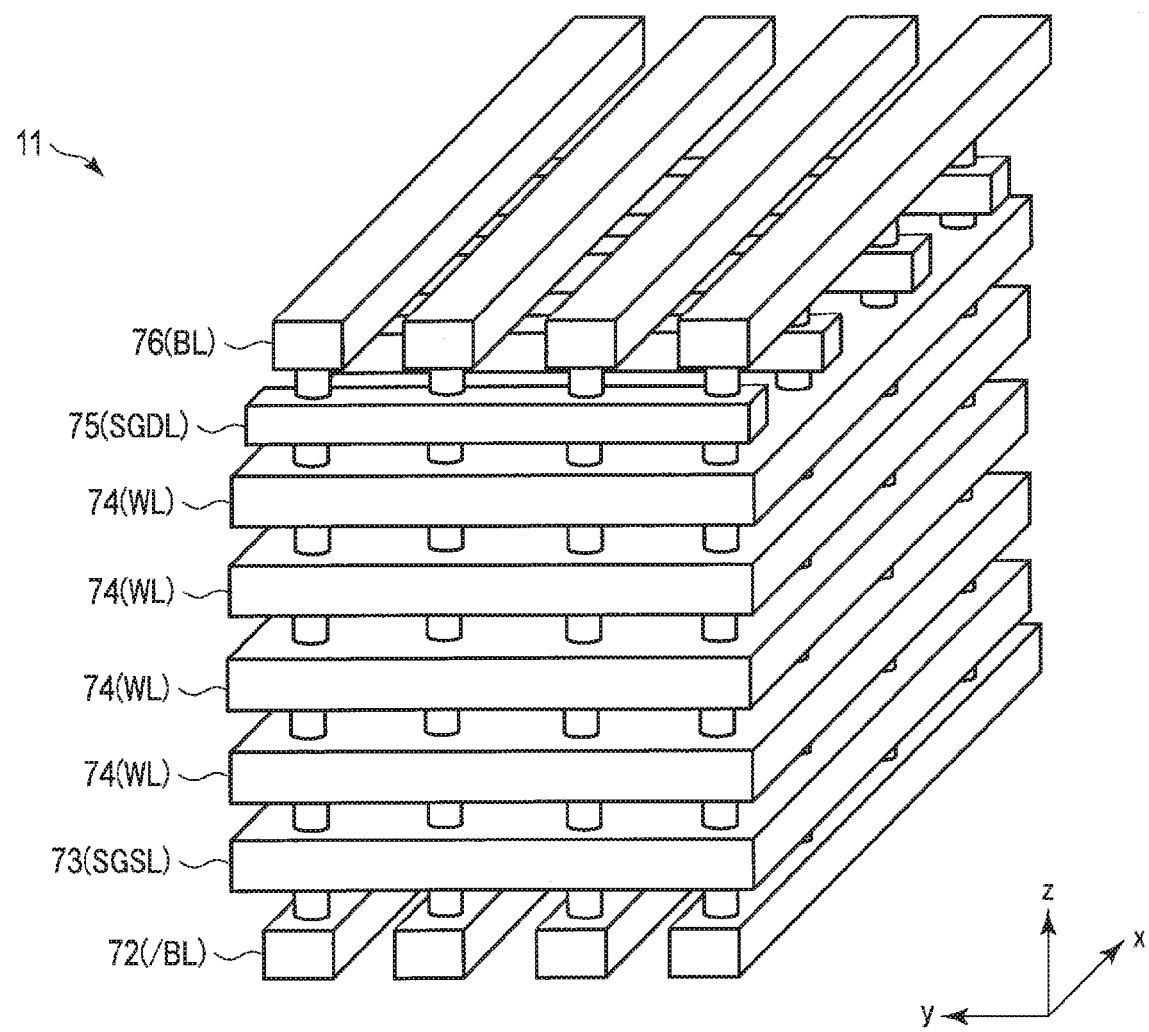
FIG. 39 is a perspective view illustrating the configuration of the memory cell array of the magnetic storage device according to the third embodiment.
Figure 40:
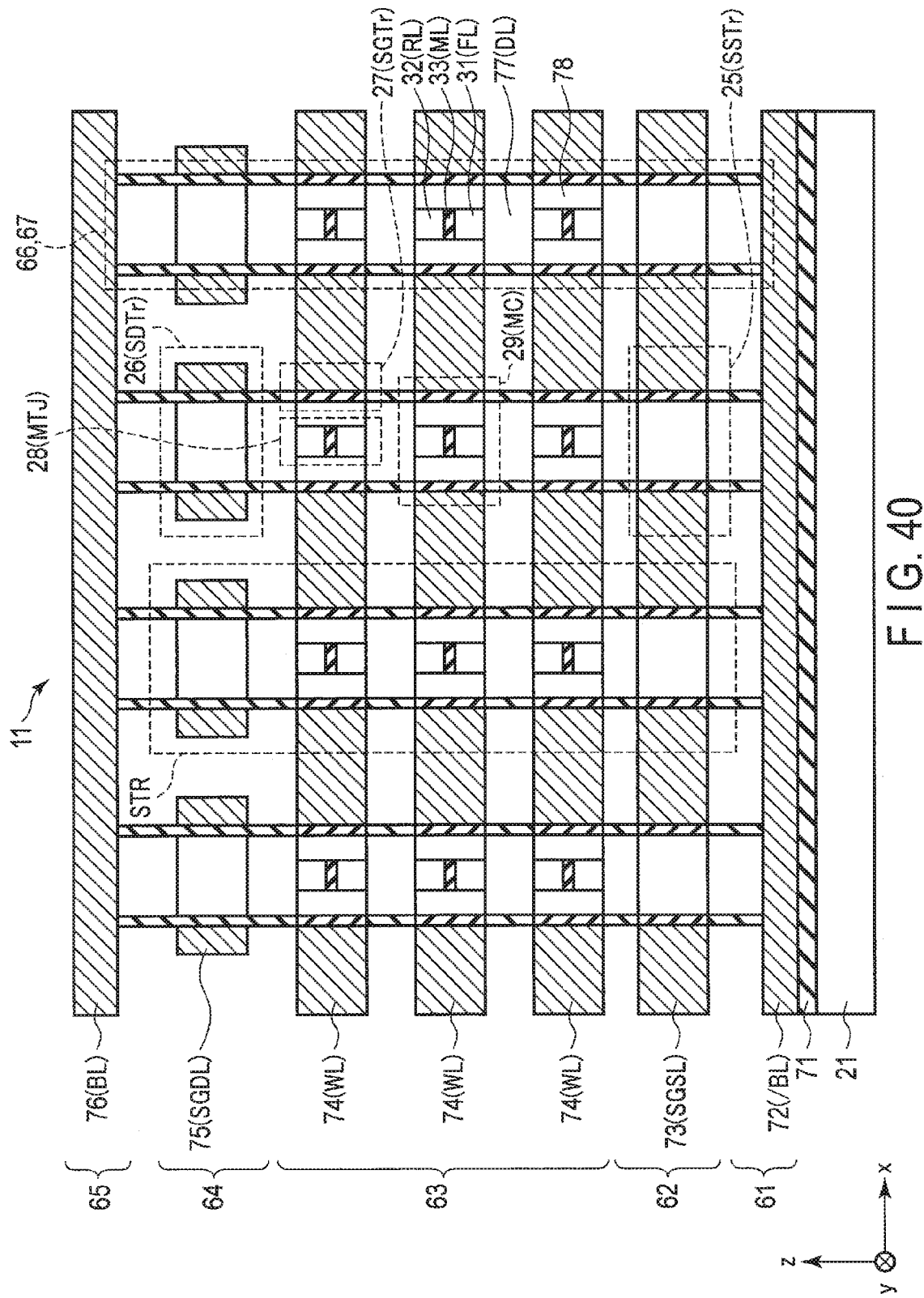
FIG. 40 is a cross-sectional view illustrating the configuration of the memory cell array of the magnetic storage device according to the third embodiment.

Next, a three-dimensional multi-layer structure of the memory cell array 11 is described with reference to FIG. 39 and FIG. 40. FIG. 39 is a perspective view of the memory cell array 11, and FIG. 40 is a cross-sectional view of the memory cell array 11 according to the third embodiment in the xz plane. Incidentally, for the purpose of easier viewing, FIG. 39 and FIG. 40 omit the depiction of partial structures such as insulation films.

As illustrated, a wiring layer 61 is disposed on the top surface of the semiconductor substrate 21 via an insulation film 71. The wiring layer 61 includes conductive film 72 which function as source lines/BL. The conductive film 72 extend in the x direction and are arranged in the y direction. In addition, a wiring layer 62, a wiring layer 63 and a wiring layer 64 are disposed in the named order above the wiring layer 61 along the z axis via insulation films (not shown). Further, a wiring layer 65 is disposed above the wiring layer 64.

The wiring layer 62 is stacked between insulation layers (not shown), and includes a conductive film 73 which functions as a source-side select gate line SGSL. The wiring layer 63 is stacked between insulation layers (not shown), and includes conductive films 74 as conductive regions which function as word WL. The wiring layer 64 is stacked between insulation layers (not shown), and includes a conductive film 75 which functions as a drain-side select gate line SGDL. The wiring layer 65 is stacked between insulation layers (not shown), and includes conductive films 76 which function as bit lines BL. The conductive films 76 extend in the x direction and are arranged in the y direction.

A first through-hole, which penetrates the insulation layers and wiring layers 62, 63 and 64, is provided in the z direction in the insulation layers and wiring layers 62, 63 and 64. In the first through-hole, there are provided an insulation region 66 which is formed on an inner wall of the first through-hole, and a semiconductor region 67 having an outer side surface covered with the insulation region 66. The insulation region 66 and semiconductor region 67 are in contact with the wiring layer 61 and wiring layer 65. The insulation region 66 has, for example, a cylindrical shape. The wiring layers 62, 63 and 64, insulation region 66 and semiconductor region 67 are provided in the cell string STR. The semiconductor region 67 functions as a current path of the cell string STR. The Conductive film 73 is located in that region of the wiring layer 62, which excludes the insulation region 66 and semiconductor region 67, and is in contact with, for example, a side surface of each insulation region 66 in one block BLK. Each conductive film 74 is located in that region of the layer where this conductive film 74 is located, which excludes the insulation region 66 and semiconductor region 67, and is in contact with, for example, a side surface of each insulation region 66 in one block BLK. The conductive films 75 extend in the y direction and are arranged in the x direction.

To be more specific, the semiconductor region 67 includes semiconductor films 77 as a first semiconductor region and a third semiconductor region, a semiconductor film 78 as a second semiconductor region, and a magnetoresistive effect element 28. The semiconductor region 67 includes the semiconductor films 77 in the same layers as the insulation layers (not shown) between the wiring layers 62, 63 and 64. The semiconductor region 67 includes the semiconductor film 78 and magnetoresistive effect element 28 in the same layer as the wiring layer 63. To be more specific, the magnetoresistive effect element 28 is formed in a second through-hole which penetrates the semiconductor region 67 in the z direction in the wiring layer 63, and the magnetoresistive effect element 28 fills the second through-hole. In the magnetoresistive effect element 28, at least a storage layer 31, a tunnel barrier layer 33 and a reference layer 32 are successively stacked, and the magnetoresistive effect element 28 has, for example, a cylindrical shape. The semiconductor film 78, reference layer 32 and storage layer 31 are in contact with the semiconductor films 77. The semiconductor film 78 covers the outer side surface of the magnetoresistive effect element 28.

The semiconductor film 77 is a diffused layer DL, includes carriers, and functions as a source or a drain of a transistor. To be more specific, the semiconductor film 77 as the first semiconductor region functions as a source, and the semiconductor film 77 as the third semiconductor region functions as a drain. The semiconductor film 78 functions as a channel region of a transistor. Accordingly, the conductive film 73, semiconductor films 77, semiconductor film 78 and insulation film 79 function as the source-side select gate transistor 25 (SSTr). The conductive film 75, semiconductor films 77, semiconductor film 78 and insulation 79 film function as the drain-side select gate transistor 26 (SDTr). The conductive film 74, semiconductor films 77, semiconductor film 78 and insulation film 79 function as the select transistor 27 (SGTr). In addition, the magnetoresistive effect element 28 functions as a memory element. The select transistor 27 and magnetoresistive effect element 28 are connected in parallel, and are provided in the memory cell 29.

3.2. Re: Write Operation

Figure 41:
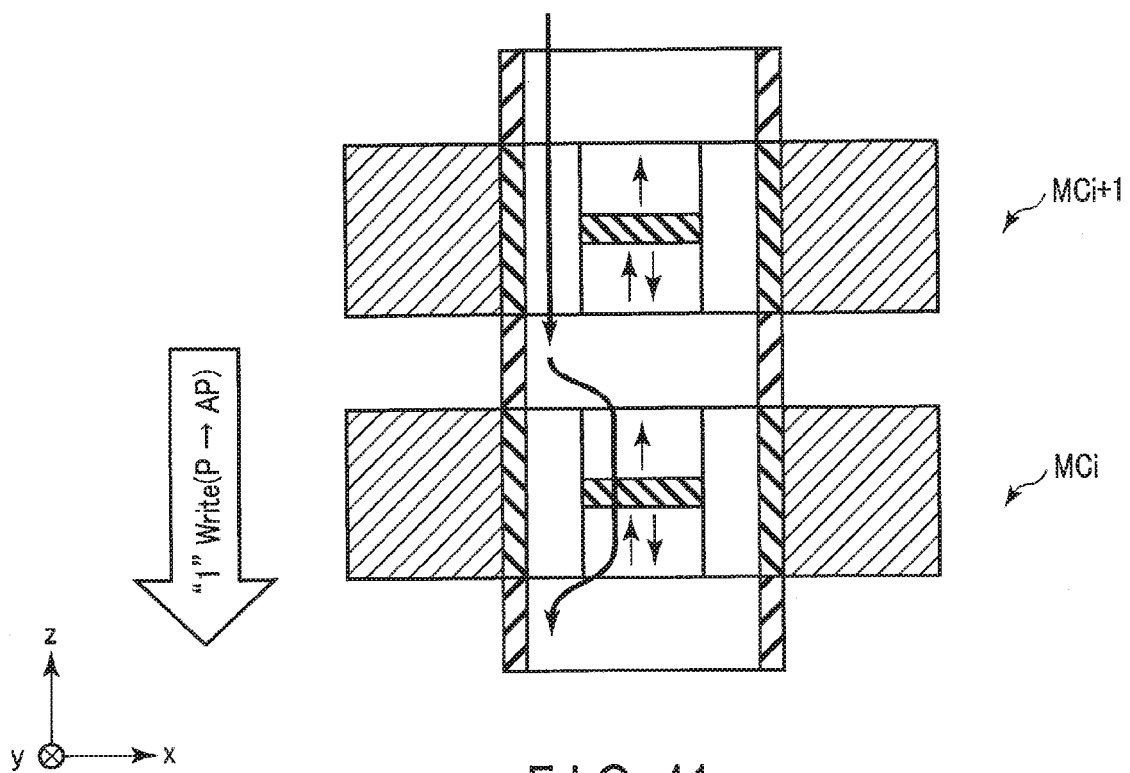
FIG. 41 is a schematic view illustrating a current path at a write time of the magnetic storage device according to the third embodiment.
Figure 42:
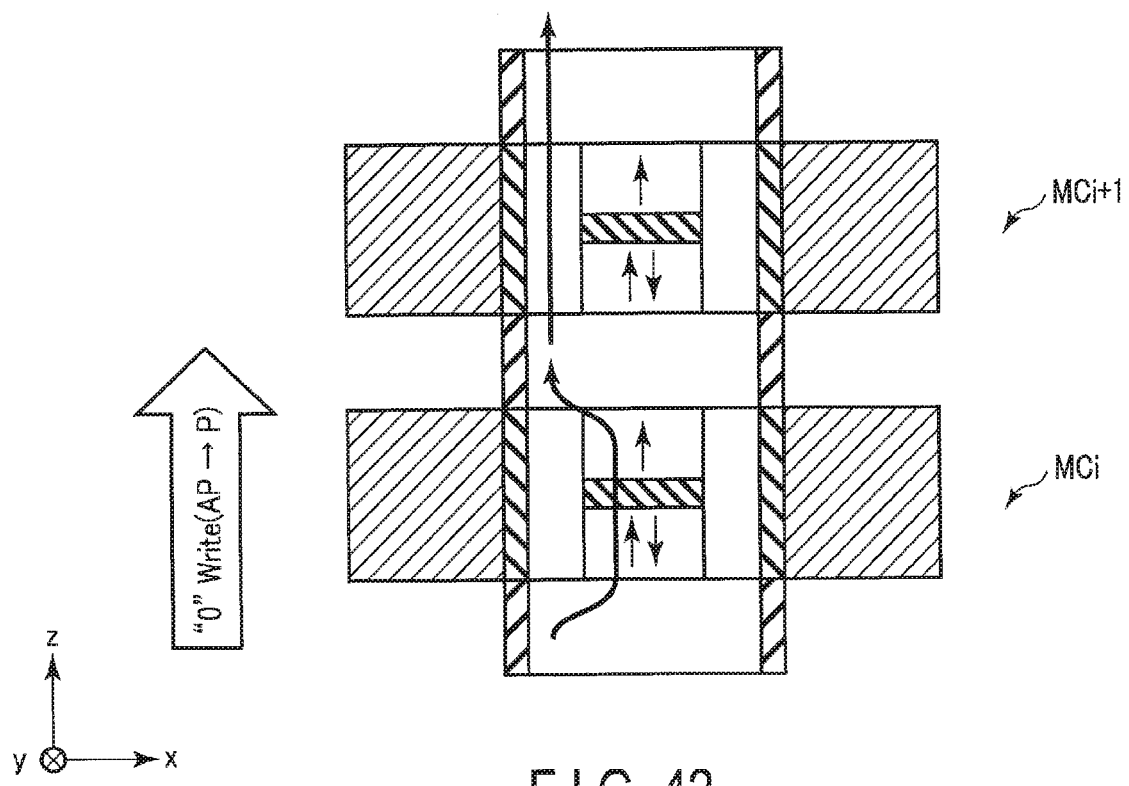
FIG. 42 is a schematic view illustrating a current path at a write time of the magnetic storage device according to the third embodiment.

Next, a write operation of the magnetic storage device according to the third embodiment is described. The write operation of the magnetic storage device according to the third embodiment is the same as the write operation of the magnetic storage device according to the second embodiment. Thus, referring to FIG. 41 and FIG. 42, a description is given here of the current paths in the write operation of the magnetic storage device according to the third embodiment. FIG. 41 and FIG. 42 are schematic views for describing current paths at the write time of the magnetic storage device 1 according to the third embodiment.

As illustrated in FIG. 41, when data "1" is written to the memory cell MCi, an electric current flows in the selected string STR from the bit line BL, which is located on the upper side in the z direction, toward the source line/BL, which is located on the lower side. The select transistor SGTr(≠i) in the non-selected memory cell MC(≠i), among the memory cells MC of the selected string STR, is turned on. Thus, the resistance value of the non-selected select transistor SGTr is smaller than the resistance value of the magnetoresistive effect element 28. Accordingly, in the memory cell MC(≠i), current flows in the select transistor SGTr. On the other hand, in the selected memory cell MCi, the select transistor SGTri is turned off. Thus, the resistance value of the non-selected select transistor SGTr is greater than the resistance value of the magnetoresistive effect element 28. Accordingly, in the memory cell MCi, current flows through the magnetoresistive effect element 28.

In the magnetoresistive effect element 28, the storage layer 31, tunnel barrier layer 33 and reference layer 32 are stacked from the lower side to the upper side in the z direction. Thus, data "1" is written to the magnetoresistive effect element 28 in the selected memory cell MCi.

In addition, as illustrated in FIG. 42, when data "0" is written in the memory cell MCi, an electric current flows in the selected string STR from the source line/BL, which is located on the lower side in the z direction, toward the bit line BL, which is located on the upper side. Like the case in which data "1" is written, current flows through only the magnetoresistive effect element 28 of the selected memory cell MCi. Accordingly, in the magnetoresistive effect element 28 of the selected memory cell MCi, current flows from the storage layer 31 toward the reference layer 32, and data "0" is written.

3.3. Re: Manufacturing Method

Next, the manufacturing method of the magnetic storage device according to the third embodiment is described with reference to FIG. 43 to FIG. 49. FIG. 43(a) to FIG. 49(a) are cross-sectional views which schematically illustrate xz cross sections of memory cells in stages of manufacture of the magnetic storage device according to the third embodiment, and FIG. 43(b) to FIG. 49(b) are top views which schematically illustrate xy plane of the memory cells in stages of manufacture of the magnetic storage device according to the third embodiment.

Figure 43:
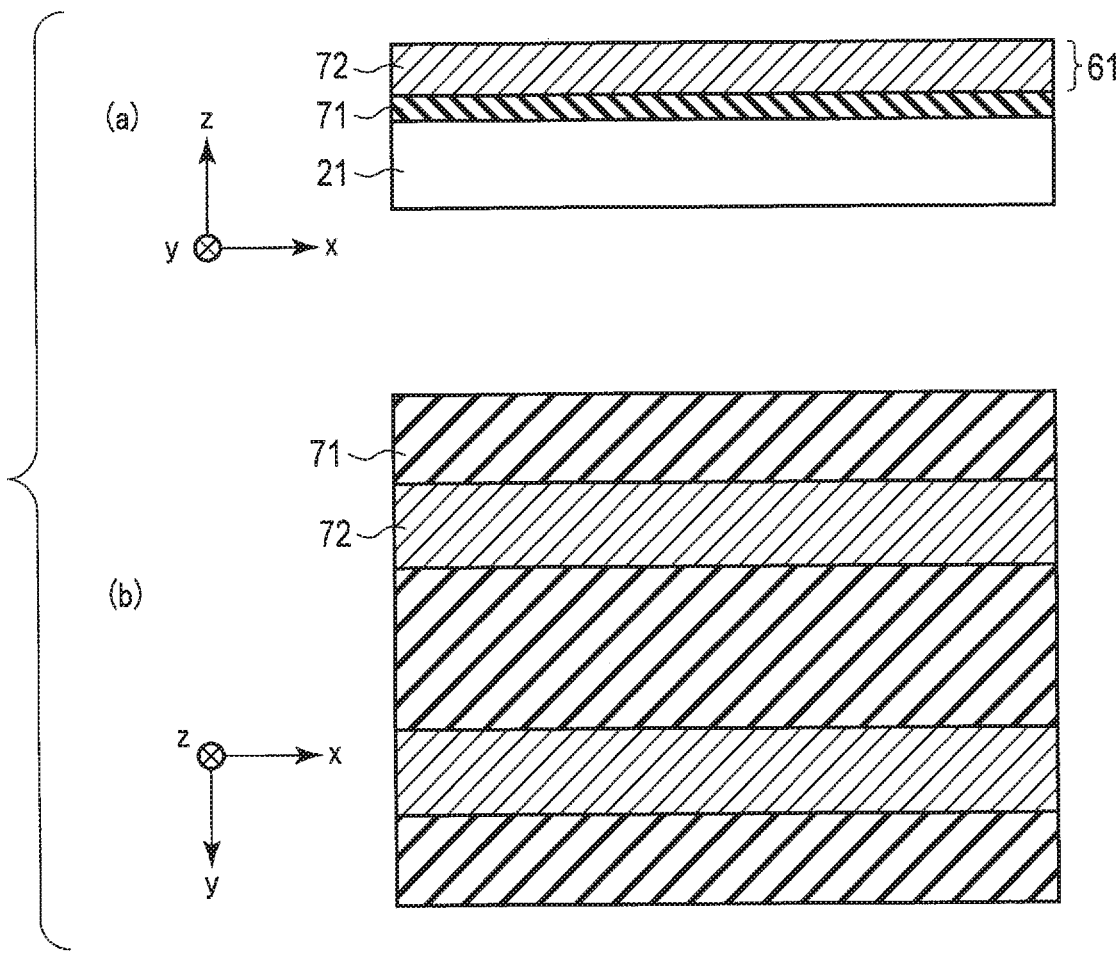
FIG. 43 is a cross-sectional view illustrating a part of a manufacturing method of the memory cell array of the magnetic storage device according to the third embodiment.

To start with, as illustrated in FIG. 43, an insulation film 71 is deposited on the entire surface of a semiconductor substrate 21, and a conductive film 72 is deposited on the top surface of the insulation film 71. A film (not shown) is deposited on the top surface of the conductive film 72 by deposition and lithography steps. By etching using this film as a mask, regions where source lines/BL are to be formed are removed in the x direction.

Figure 44:
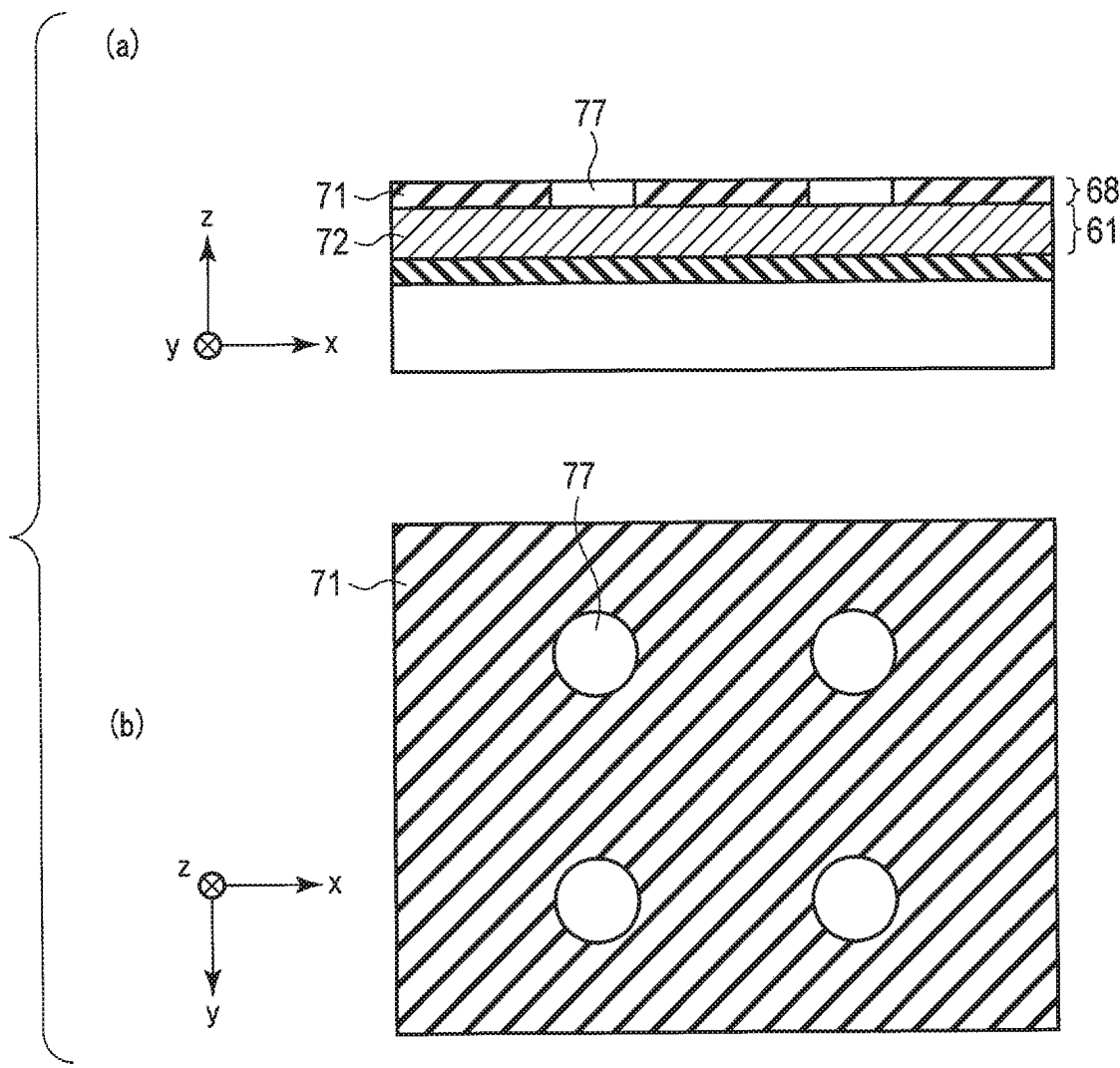
FIG. 44 is a cross-sectional view illustrating a part of the manufacturing method of the memory cell array of the magnetic storage device according to the third embodiment.

As illustrated in FIG. 44, an insulation film 71 is deposited on the top surface of the conductive film 72. Those regions of the insulation film 71, where semiconductor regions 67 are to be formed, are removed by etching. A semiconductor film 77 is deposited on the regions where the semiconductor regions 67 are to be formed. The semiconductor film 77 is, for instance, a film of polycrystalline silicon, and ion implantation for forming a source or drain region of a transistor is performed. In the description below, a layer including the insulation layer 71 and semiconductor film 77 is referred to as a wiring layer 68 as an insulation layer.

As illustrated in FIG. 45, a conductive layer 73 is deposited on the top surface of the wiring layer 68. The conductive film 73 functions as a source-side select gate line SGSL. Those regions of the conductive film 73, where an insulation region 66 and a semiconductor region 67 are to be formed, are removed by etching, and holes are formed. An insulation film 79 is deposited on an inner wall of the hole. Then, for example, the hole, in which the insulation film 79 was deposited, is filled with a semiconductor film 78. The semiconductor film 78 is, for example, a film of polycrystalline silicon. The conductive film 73, insulation film 79 and semiconductor film 78 are provided in a wiring layer 62. The wiring layer 62 functions as the gate, gate insulation film and channel region of the source-side select gate transistor 25.

As illustrated in FIG. 46, a wiring layer 68 is deposited on the top surface of the wiring layer 62 by the same step as the step in FIG. 44. Then, a wiring layer 62 is deposited on the top surface of the wiring layer 68 by the same step as the step in FIG. 45. Subsequently, that region of the semiconductor film 78 of the wiring layer 62, where a magnetoresistive effect element 28 is to be formed, is removed by etching. In the region where the magnetoresistive effect element 28 is to be formed, a magnetic film 31, a nonmagnetic film 33 and a magnetic film 32 are successively stacked. The magnetic film 31, nonmagnetic film 33 and magnetic film 32 function as the storage layer FL, tunnel barrier layer ML and reference layer RL of the magnetoresistive effect element 28, respectively. A layer including the conductive film 74, insulation film 79, semiconductor film 78 and magnetoresistive effect element 28 is provided in a wiring layer 63.

As illustrated in FIG. 47, the wiring layer 68 and wiring layer 63 are alternately stacked by the same step as the step of FIG. 46. Thereby, a structure is obtained in which a plurality of memory cells 29, each including a select transistor 27 and a magnetoresistive effect element 28 connected in parallel, are connected in series in the z direction.

As illustrated in FIG. 48, an insulation film 71 is further deposited on the top surface of the wiring layer 68. That region of the insulation film 71, where a drain-side select gate line SGDL is to be formed, is removed by etching. The region where the drain-side select gate line SGDL is to be formed is formed in the y direction, and a conductive film 75 is deposited. As described above, the conductive film 75 functions as the drain-side select gate line SGDL. A semiconductor film 78 and an insulation film 79 are buried in the conductive film 75 by the same step as the step relating to the above-described conductive film 73. The conductive film 75, semiconductor film 78 and insulation film 79 constitute a wiring layer 64, and function as the gate, channel region of the drain-side select gate transistor SDTr, and gate insulation film.

Figure 49:
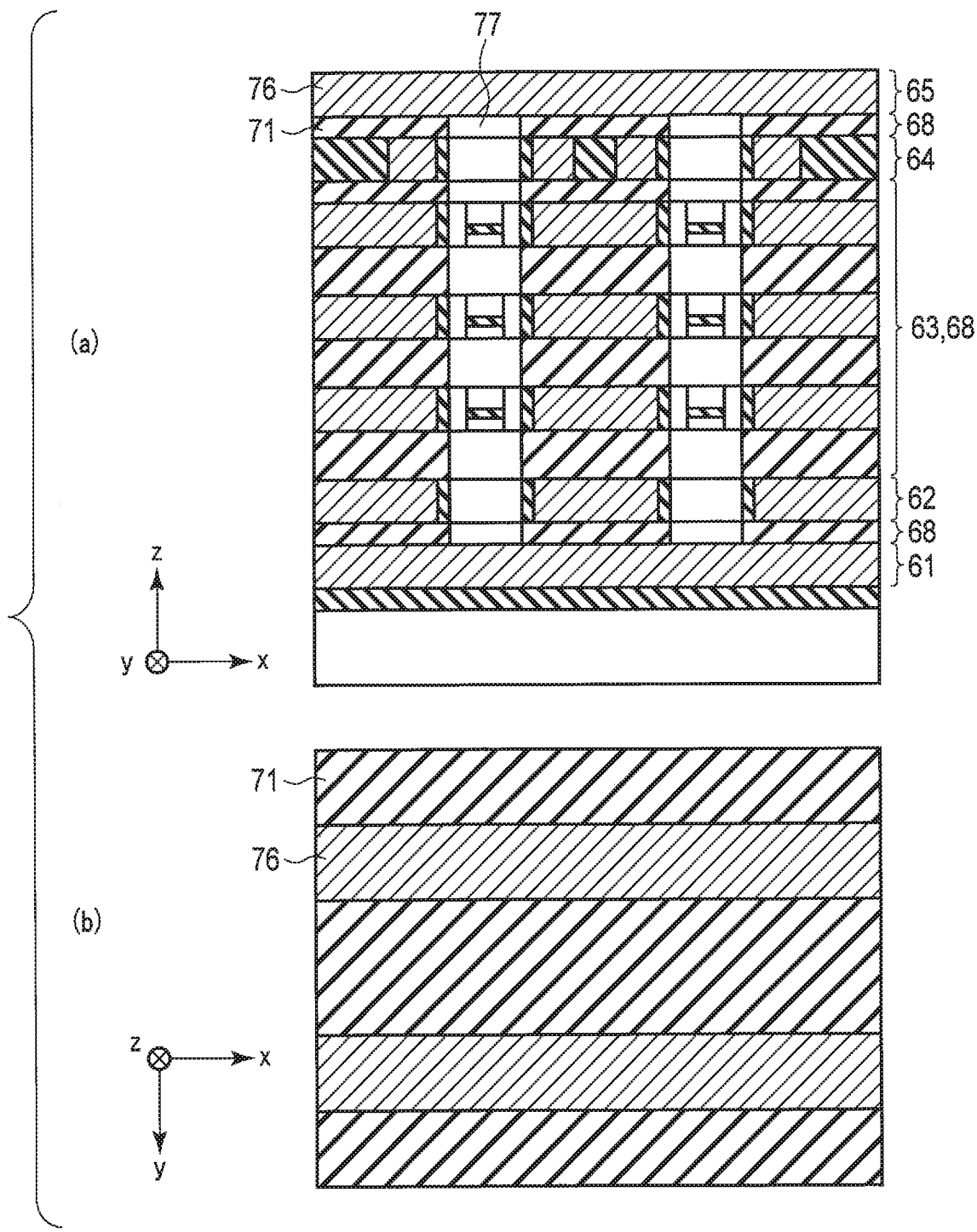
FIG. 49 is a cross-sectional view illustrating a part of the manufacturing method of the memory cell array of the magnetic storage device according to the third embodiment.

As illustrated in FIG. 49, a wiring layer 68 is deposited on the top surface of the wiring layer 64. Subsequently, an interlayer insulation film (not shown) is deposited on the top surface of the wiring layer 68, and a trench is formed in that region of the interlayer insulation film, where a bit line BL is to be formed. The trench is formed in the x direction. Then, a conductive film 76 is deposited in the trench. As described above, the conductive film 76 functions as the bit line BL.

By the above, the configuration of the magnetic storage device 1 is obtained.

3.4. Advantageous Effects of the Present Embodiment

According to the third embodiment, the magnetic storage device 1 includes the semiconductor film 77 as a first semiconductor region; the magnetoresistive effect element 28 which is provided on a top surface of the first semiconductor region and in which at least the storage layer 31, tunnel barrier layer 33 and reference layer 32 are stacked; the semiconductor film 78 as a second semiconductor region provided on a top surface of the first semiconductor region and provided on an outer side surface of the magnetoresistive effect element 28; the insulation region 66 provided on an outer side surface of the second semiconductor region; the conductive film 74 as a conductive region provided on an outer side surface of the insulation region 66; and the semiconductor film 77 as a third semiconductor region disposed on top surfaces of the magnetoresistive effect element 28 and the second semiconductor region. Thereby, the magnetic storage device is three-dimensionally stacked, in addition to the advantageous effects of the first embodiment and the second embodiment. Therefore, a magnetic storage device with a higher integration level can be provided.

Furthermore, according to a first mode of the third embodiment, in addition to the third embodiment, the third semiconductor region is shared with a first semiconductor region which is further provided on a top surface of the third semiconductor region. Thereby, in the memory cells MC in the same string STR, the source and drain can be shared. Therefore, a magnetic storage device with a higher integration level can be provided.

Furthermore, according to a second mode of the third embodiment, in addition to the third embodiment, the first semiconductor region is shared with a third semiconductor region which is further provided on a bottom surface of the first semiconductor region. Thereby, in the memory cells MC in the same string STR, the source and drain can be shared. Therefore, a magnetic storage device with a higher integration level can be provided.

Furthermore, according to a third mode of the third embodiment, in addition to the third embodiment, the conductive region is provided on an outer side surface of an insulation region which is further provided in the same layer as the second semiconductor region and the insulation region. Thereby, in the memory cells MC in the same layer, the gate can be shared. Therefore, a magnetic storage device with a higher integration level can be provided.

Furthermore, according to a fourth mode of the third embodiment, in addition to the third embodiment, the magnetic storage device 1 further includes a plurality of memory cells, each of the plurality of memory cells includes the first semiconductor region, the magnetoresistive effect element, the second semiconductor region, the insulation region, the conductive region, and the third semiconductor region, and the magnetic storage device 1 further includes: a second insulation region provided on an outer side surface of the first semiconductor region of a first memory cell of the plurality of memory cells MC; the source-side select gate line 73 as a second conductive region provided on an outer side surface of the second insulation region; the conductive film 72 (/BL) as a first conductive film which is in contact with the first semiconductor region of the first memory cell; a third insulation region provided on an outer side surface of the third semiconductor region of a second memory cell of the plurality of memory cells; the bit-line-side select gate line 75 as a third conductive region provided on an outer side surface of the third insulation region; and the conductive film 76 (BL) as a second conductive film which is in contact with the third semiconductor region of the second memory cell. Thereby, the strings STR according to the first embodiment can be stacked in the z direction. Therefore, a magnetic storage device with a higher integration level can be provided.

4. Other Embodiments

In each of the above-described embodiments, the case was described in which the magnetoresistive effect element is a vertical magnetization MTJ. However, the magnetoresistive effect element may be a horizontal magnetization MTJ element having a horizontal magnetic anisotropy. In addition, in the third embodiment, the case was described in which the magnetoresistive effect element is a bottom free type (top pin type) MTJ element in which the memory layer is disposed below the reference layer. However, the magnetoresistive effect element may be a top free type (bottom pin type) MTJ element in which the memory layer is disposed above the reference layer. To be more specific, the magnetoresistive effect elements 28, which are stacked in the z direction in the third embodiment, may be stacked in mutually opposite directions. In addition, the magnetoresistive effect elements 28, which are stacked in mutually opposite directions, may share the reference layer 32. In this case, the semiconductor film 77 may have a through-hole for sharing the reference layer 32, and the reference layer 32 may be buried in the through-hole.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:
1. A magnetic storage device comprising:
   a first semiconductor region;
   a magnetoresistive effect element which is disposed on a top surface of the first semiconductor region and in which at least a first ferromagnetic layer, a non-magnetic layer and a second ferromagnetic layer are stacked;
   a second semiconductor region disposed on the top surface of the first semiconductor region and disposed on an outer side surface of the magnetoresistive effect element;
   an insulation region disposed on an outer side surface of the second semiconductor region;
   a conductive region disposed on an outer side surface of the insulation region; and
   a third semiconductor region disposed on top surfaces of the magnetoresistive effect element and the second semiconductor region.
2. The magnetic storage device of claim 1, wherein:
   the magnetic storage device comprises a plurality of memory cells, each of the plurality of memory cells includes the first semiconductor region, the magnetoresistive effect element, the second semiconductor region, the insulation region, the conductive region, and the third semiconductor region, and the conductive region of one of two neighboring memory cells of the plurality of memory cells is the conductive region of the other of the two neighboring memory cells.

3. The magnetic storage device of claim 1, wherein:

the magnetic storage device comprises a plurality of memory cells, each of the plurality of memory cells includes the first semiconductor region, the magnetoresistive effect element, the second semiconductor region, the insulation region, the conductive region, and the third semiconductor region, and the first semiconductor region of one of two neighboring memory cells of the plurality of memory cells is the third semiconductor region of the other of the two neighboring memory cells.

4. The magnetic storage device of claim 3, further comprising:

a first conductive film, a second conductive film, and a transistor including:
   a fourth semiconductor region;
   a fifth semiconductor region disposed on a top surface of the fourth semiconductor region;
   a second insulation region disposed on an outer side surface of the fifth semiconductor region;
   a second conductive region disposed on an outer side surface of the second insulation region; and
   a sixth semiconductor region disposed on a top surface of the fifth semiconductor region, wherein the fourth semiconductor region of the transistor is the third semiconductor region of a first memory cell of the plurality of memory cells, wherein the first conductive film is in contact with a top surface of the sixth semiconductor region, and wherein the second conductive film is in contact with a bottom surface of the first semiconductor region of a second memory cell of the plurality of the memory cells.

* * * * *